(12) United States Patent
Kim et al.

(10) Patent No.: US 11,677,422 B2
(45) Date of Patent: *Jun. 13, 2023

(54) TRANSMITTER AND METHOD FOR GENERATING ADDITIONAL PARITY THEREOF

(71) Applicant: SAMSUNG ELECTRONICS CO., LTD., Suwon-si (KR)

(72) Inventors: Kyung-joong Kim, Seoul (KR); Se-ho Myung, Yongin-si (KR); Hong-sil Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/407,301

(22) Filed: Aug. 20, 2021

(65) Prior Publication Data

US 2022/0045697 A1 Feb. 10, 2022

Related U.S. Application Data

(63) Continuation of application No. 16/441,288, filed on Jun. 14, 2019, now Pat. No. 11,128,319, which is a
(Continued)

(30) Foreign Application Priority Data

Sep. 27, 2015 (KR) .......................... 10-2015-0137178

(51) Int. Cl.
*H03M 13/27* (2006.01)
*H04L 1/00* (2006.01)
(Continued)

(52) U.S. Cl.
CPC ... *H03M 13/2792* (2013.01); *H03M 13/1102* (2013.01); *H03M 13/1165* (2013.01);
(Continued)

(58) Field of Classification Search
None
See application file for complete search history.

(56) References Cited

U.S. PATENT DOCUMENTS

| 7,930,619 B2 | 4/2011 | Shin et al. |
| 2007/0113147 A1 | 5/2007 | Hong et al. |

(Continued)

FOREIGN PATENT DOCUMENTS

| CN | 1593012 A | 3/2005 |
| CN | 102904686 A | 1/2013 |

(Continued)

OTHER PUBLICATIONS

Communication dated Aug. 4, 2021 issued by the Korean Intellectual Property Office in counterpart Korean Application No. 10-2017-0112114.
(Continued)

*Primary Examiner* — Guerrier Merant
(74) *Attorney, Agent, or Firm* — Sughrue Mion, PLLC

(57) ABSTRACT

A transmitter is provided. The transmitter includes: a Low Density Parity Check (LDPC) encoder configured to encode input bits to generate an LDPC codeword including the input bits and parity bits to be transmitted in a current frame; a parity permutator configured to perform parity-permutation by interleaving the parity bits and group-wise interleaving a plurality of bit groups configuring the interleaved parity bits based on a group-wise interleaving pattern including a first pattern and a second pattern; a puncturer configured to puncture some of the parity-permutated parity bits; and an additional parity generator configured to select at least some of the punctured parity bits to generate additional parity bits to be transmitted in a previous frame of the current frame, based on the first pattern and the second pattern, wherein the
(Continued)

first pattern determines parity bits to remain after the puncturing and then to be transmitted in the current frame.

7 Claims, 30 Drawing Sheets

Related U.S. Application Data continuation of application No. 15/053,038, filed on Feb. 25, 2016, now Pat. No. 10,411,737.

(60) Provisional application No. 62/120,526, filed on Feb. 25, 2015.

(51) Int. Cl.
*H04L 27/36* (2006.01)
*H03M 13/11* (2006.01)
*H03M 13/15* (2006.01)
*H03M 13/00* (2006.01)
*H03M 13/25* (2006.01)
*H03M 13/29* (2006.01)
*H03M 13/37* (2006.01)

(52) U.S. Cl.
CPC ....... *H03M 13/152* (2013.01); *H03M 13/255* (2013.01); *H03M 13/2778* (2013.01); *H03M 13/2906* (2013.01); *H03M 13/3761* (2013.01); *H03M 13/3769* (2013.01); *H03M 13/616* (2013.01); *H03M 13/618* (2013.01); *H03M 13/6356* (2013.01); *H03M 13/6362* (2013.01); *H04L 1/0041* (2013.01); *H04L 1/0045* (2013.01); *H04L 1/0057* (2013.01); *H04L 1/0065* (2013.01); *H04L 1/0067* (2013.01); *H04L 1/0068* (2013.01); *H04L 1/0071* (2013.01); *H04L 27/36* (2013.01)

(56) References Cited

U.S. PATENT DOCUMENTS

| | | |
|---|---|---|
| 2008/0222486 A1 | 9/2008 | Richardson et al. |
| 2008/0270872 A1 | 10/2008 | Shin et al. |
| 2009/0063929 A1 | 3/2009 | Jeong et al. |
| 2010/0275089 A1 | 10/2010 | Mow et al. |
| 2012/0320994 A1 | 12/2012 | Loghin et al. |
| 2014/0122961 A1 | 5/2014 | Jeong et al. |
| 2015/0082113 A1 | 3/2015 | Myung et al. |
| 2020/0136647 A1 | 4/2020 | Jeong |
| 2022/0045697 A1* | 2/2022 | Kim ..................... H04L 1/0068 |

FOREIGN PATENT DOCUMENTS

| | | |
|---|---|---|
| CN | 103731235 A | 4/2014 |
| CN | 103765781 A | 4/2014 |
| KR | 10-2008-0094322 A | 10/2008 |
| KR | 10-2008-0106828 A | 12/2008 |
| WO | 2004006443 A1 | 1/2004 |
| WO | 2013032156 A1 | 3/2013 |
| WO | 2013115563 A1 | 8/2013 |
| WO | 2014168405 A1 | 10/2014 |
| WO | 2015/016676 A1 | 2/2015 |

OTHER PUBLICATIONS

Communication dated Jul. 31, 2020, from the Brazilian Patent Office in counterpart application No. BR112017018164-9.
Communication dated Jun. 12, 2020 by the Indian Patent Office in counterpart Application No. 201717031706.
Communication dated Jun. 6, 2018, from the Canadian Patent Office in counterpart application No. 2,975,989.
Written Opinion dated Jun. 10, 2016, issued by the International Searching Authority in counterpart International Patent Application No. PCT/KR2016/001880 (PCT/ISA/237).
José Mª Llorca Beltrán "Physical Layer Signaling for the Next Generation Mobile TV Standard DVB-NGH", Mobile Communications Group of iTEAM, Dec. 9, 2011 (pp. 1-40).
Digital Video Broadcasting "Frame structure channel coding and modulation fora second generation digital terrestrial television broadcasting system (DVB-T2)" Final Draft ETSI EN 302 755, V1.2.1, Oct. 2010 (177 pages total).
Search Report dated Jun. 10, 2016, issued by the International Searching Authority in counterpart International Patent Application No. PCT/KR2016/001880 (PCT/ISA/210).
Communication dated Jan. 16, 2020, from the State Intellectual Property Office of People's Republic of China in counterpart Application No. 201680012368.7.

* cited by examiner

L1-Detail → SEGMENTER (311) → SCRAMBLER (312) → BCH ENCODER (313) → ZERO PADDER (314) → LDPC ENCODER (315) → PARITY PERMUTATOR (316)

REPEATER (317) → PUNCTURER (318) → ZERO REMOVER (321) → BIT DEMULTIPLEXER (322) → CONSTELLATION MAPPER (324)

ADDITIONAL PARITY GENERATOR (319) → BIT DEMULTIPLEXER (323) → CONSTELLATION MAPPER (325)

TRANSMITTER AND METHOD FOR GENERATING ADDITIONAL PARITY THEREOF

CROSS-REFERENCE TO THE RELATED APPLICATIONS

This application is a Continuation of U.S. application Ser. No. 16/441,288 filed Jun. 14, 2019 which is a continuation of U.S. application Ser. No. 15/053,038 filed Feb. 25, 2016, now U.S. Pat. No. 10,411,737 issued Sep. 10, 2019, which claims priority from Korean Patent Application No. 10-2015-0137178 filed on Sep. 27, 2015 and U.S. Provisional Application No. 62/120,526 filed on Feb. 25, 2015, the disclosures of which are incorporated herein in their entirety by reference.

BACKGROUND

1. Field

Apparatuses and methods consistent with the exemplary embodiments of the inventive concept relate to a transmitter and a method for generating an additional parity for signal transmission.

2. Description of the Related Art

Broadcast communication services in information oriented society of the $21^{st}$ century are entering an era of digitalization, multi-channelization, bandwidth broadening, and high quality. In particular, as a high definition digital television (TV) and portable broadcasting signal reception devices are widespread, digital broadcasting services have an increased demand for a support of various receiving schemes.

According to such demand, standard groups set up broadcasting communication standards to provide various signal transmission and reception services satisfying the needs of a user. Still, however, a method for providing better services to a user with more improved performance is required.

SUMMARY

The exemplary embodiments of the inventive concept may overcome disadvantages of the related art signal transmitter and receiver and methods thereof. However, these embodiments are not required to or may not overcome such disadvantages.

The exemplary embodiments provide a transmitter and a method for generating an additional parity using interleaving patterns.

According to an aspect of an exemplary embodiment, there is provided a transmitter which may include: a Low Density Parity Check (LDPC) encoder configured to encode input bits to generate an LDPC codeword including the input bits and parity bits to be transmitted in a current frame; a parity permutator configured to perform parity-permutation by interleaving the parity bits and group-wise interleaving a plurality of bit groups configuring the interleaved parity bits based on a group-wise interleaving pattern including a first pattern and a second pattern; a puncturer configured to puncture some of the parity-permutated parity bits; and an additional parity generator configured to select at least some of the punctured parity bits to generate additional parity bits to be transmitted in a previous frame of the current frame, based on the first pattern and the second pattern, wherein the first pattern determines parity bits to remain after the puncturing and then to be transmitted in the current frame.

The second pattern may determine bit groups to be always punctured in the plurality of bit groups regardless of a number of parity bits to be punctured by the puncturer, and the additional parity bits may be generated by selecting at least some of bits included in the bit groups to be always punctured according to an order of the bit groups to be always punctured as indicated in the second pattern.

The first pattern may determine some of the parity bits to be punctured, in addition to the bit groups to be always punctured, based on a total number of parity bits in the LDPC codeword to be transmitted in the current frame.

The first pattern may determine an order of selecting bits, from among the some of the parity bits to be punctured determined by the first pattern, to generate the additional parity bits.

The first pattern may determine an order of puncturing bits within the some of the parity bits to be punctured determined by the first pattern, and the second pattern may determine the bit groups to be always punctured without any order of puncturing bits within the bit groups to be always punctured.

According to an aspect of another exemplary embodiment, there is provided a method for generating an additional parity. The method may includes: encoding input bits to generate parity bits to be transmitted in a current frame along with the input bits; performing parity-permutation by interleaving the parity bits and group-wise interleaving a plurality of bit groups configuring the interleaved parity bits based on a group-wise interleaving pattern including a first pattern and a second pattern; puncturing some of the parity-permutated parity bits; and selecting at least some of the punctured parity bits to generate additional parity bits to be transmitted in a previous frame of the current frame, based on the first pattern and the second pattern, wherein the first pattern determines parity bits to remain after the puncturing and then to be transmitted in the current frame.

The second pattern may determine bit groups to be always punctured among the plurality of bit groups regardless of a number of parity bits to be punctured by the puncturing, and the additional parity bits may be generated by selecting at least some of bits included in the bit groups to be always punctured according to an order of the bit groups to be always punctured as indicated in the second pattern.

The group-wise interleaving may be performed based on Equation 11 and an order for the parity permutation with respect to the second pattern based on Table 4.

In the encoding, 9720 parity bits may be generated by encoding 6480 input bits at a code rate of 6/15.

The LDPC codeword after the puncturing may be mapped to constellation symbols by 64-QAM to be transmitted to a receiver.

Various aspects and advantages of the exemplary embodiments will be set forth in part in the description which follows and, in part, will be obvious from the description, or may be learned by practice of the exemplary embodiments.

As described above, according to the exemplary embodiments, specific LDPC parity bits may be selected as the additional parity bits to improve decoding performance of a receiver.

BRIEF DESCRIPTION OF THE DRAWINGS

The above and/or other aspects of the exemplary embodiments will be described herein with reference to the accompanying drawings, in which:

FIGS. 9 and 10 are block diagrams for describing detailed configurations of a transmitter, according to exemplary embodiments;

DETAILED DESCRIPTION OF THE EXEMPLARY EMBODIMENTS

Hereinafter, exemplary embodiments of the inventive concept will be described in more detail with reference to the accompanying drawings.

Figure 1:
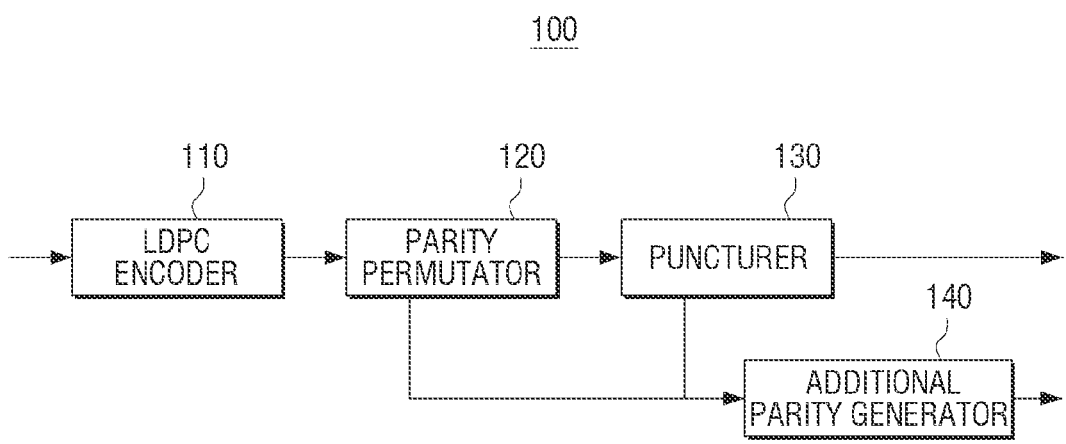
FIG. 1 is a block diagram for describing a configuration of a transmitter, according to an exemplary embodiment.

FIG. 1 is a block diagram for describing a configuration of a transmitter according to an exemplary embodiment.

Referring to FIG. 1, a transmitter 100 includes a Low Density Parity Check (LDPC) encoder 110, a parity permutator 120, a puncturer 130 and an additional parity generator 140.

The LDPC encoder 110 may encode input bits. In other words, the LDPC encoder 110 may perform LDPC encoding on the input bits to generate parity bits, that is, LDPC parity bits.

Here, the input bits are LDPC information bits for the LDPC encoding, and may include outer-encoded bits and zero bits. The outer-encoded bits include information bits and parity bits (or parity-check bits) generated by outer-encoding the information bits.

Figure 25:
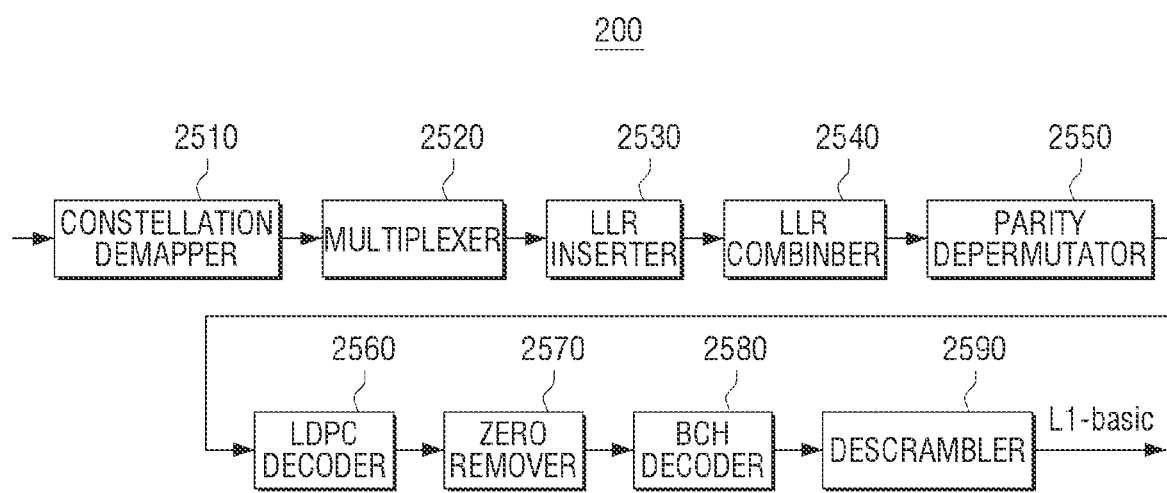
FIGS. 25 and 26 are block diagrams for describing configurations of a receiver according to exemplary embodiments.
Figure 26:
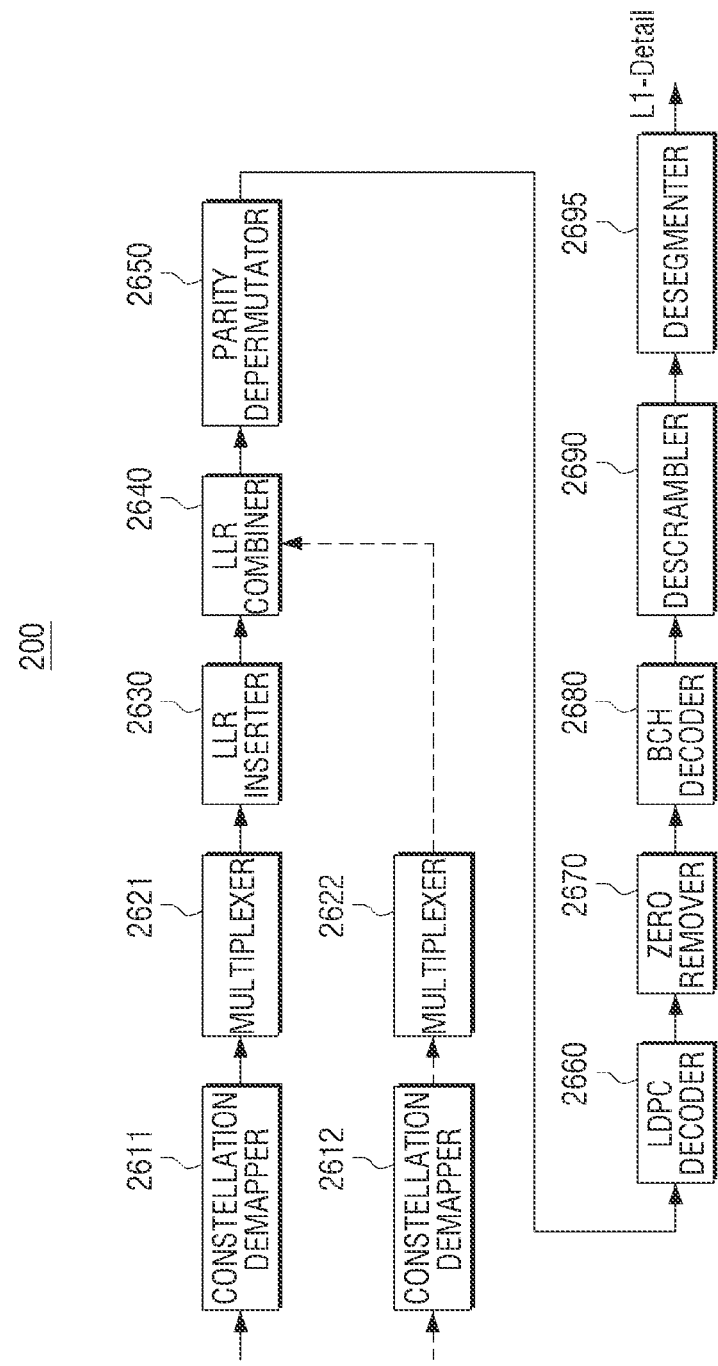

The information bits may be signaling (alternatively referred to as signaling bits or signaling information). The information bits may include information required for a receiver 200 (as illustrated in FIG. 25 or 26) to receive and process data or service data (for example, broadcasting data) transmitted from the transmitter 100.

The outer encoding is a coding operation which is performed before inner encoding in a concatenated coding operation, and may use various encoding schemes such as Bose, Chaudhuri, Hocquenghem (BCH) encoding and/or cyclic redundancy check (CRC) encoding. In this case, an inner code for inner encoding may be an LDPC code.

For LDPC encoding, a predetermined number of LDPC information bits depending on a code rate and a code length are required. Therefore, when the number of outer-encoded bits generated by outer-encoding the information bits is less than the required number of LDPC information bits, an appropriate number of zero bits are padded to obtain the required number of LDPC information bits for the LDPC encoding. Therefore, the outer-encoded bits and the padded zero bits may configure the LDPC information bits as many as the number of bits required for the LDPC encoding.

Since the padded zero bits are bits required to obtain the predetermined number of bits for the LDPC encoding, the padded zero bits are LDPC-encoded, and then, are not transmitted to the receiver 200. As such, a procedure of padding zero bits, or a procedure of padding the zero bits and then, not transmitting the padded zero bits to the receiver 200 may be referred to as shortening. In this case, the padded zero bits may be referred to as shortening bits (or shortened bits).

For example, it is assumed that the number of information bits is $K_{sig}$ and the number of bits when $H_{outer}$ parity bits are added to the information bits by the outer encoding, that is, the number of outer-encoded bits including the information bits and the parity bits is $N_{outer}(=K_{sig}+M_{outer})$.

In this case, when the number $N_{outer}$ of outer-encoded bits is less than the number $K_{ldpc}$ of LDPC information bits, $K_{ldpc}-N_{outer}$ zero bits are padded so that the outer-encoded bits and the padded zero bits may configure the LDPC information bits together.

The foregoing example describes that zero bits are padded, which is only one example.

When the information bits are signaling for data or service data, a length of the information bits may vary depending on the amount of the data. Therefore, when the number of information bits is greater than the number of LDPC information bits required for the LDPC encoding, the information bits may be segmented below a specific value.

Therefore, when the number of information bits or the number of segmented information bits is less than a number obtained by subtracting the number of parity bits (that is, $M_{outer}$) generated by the outer encoding from the number of LDPC information bits, zero bits are padded as many as the number obtained by subtracting the number of outer-encoded bits from the number of LDPC information bits so that the LDPC information bits may be formed of the outer-encoded bits and the padded zero bits.

However, when the number of information bits or the number of segmented information bits are equal to the number obtained by subtracting the number of parity bits generated by outer encoding from the number of LDPC information bits, the LDPC information bits may be formed of the outer-encoded bits without padded zero bits.

The foregoing example describes that the information bits are outer-encoded, which is only one example. However, the information bits may not be outer-encoded and configure the LDPC information bits along with the zero bits padded depending on the number of information bits or only the information bits may configure the LDPC information bits without separately padding zero bits.

For convenience of explanation, the outer encoding will be described below under an assumption that it is performed by BCH encoding.

In detail, the input bits will be described under an assumption that they include BCH encoded bits and the zero bits, the BCH encoded bits including the information bits and BCH parity-check bits (or BCH parity bits) generated by BCH-encoding the information bits.

That is, it is assumed that the number of the information bits is $K_{sig}$ and the number of bits when $M_{outer}$ BCH parity-check bits by the BCH encoding are added to the information bits, that is, the number of BCH encoded bits including the information bits and the BCH parity-check bits is $N_{outer}(=K_{sig}+M_{outer})$. Here, $M_{outer}=168$.

The foregoing example describes that zero bits, which will be shortened, are padded, which is only one example. That is, since zero bits are bits having a value preset by the transmitter 100 and the receiver 200 and padded only to form LDPC information bits along with information bits including information to be substantially transmitted to the receiver 200, bits having another value (for example, 1) preset by the transmitter 100 and the receiver 200 instead of zero bits may be padded for shortening.

The LDPC encoder 110 may systematically encode LDPC information bits to generate LDPC parity bits, and output an LDPC codeword (or LDPC-encoded bits) formed of the LDPC information bits and the LDPC parity bits. That is, an LDPC code for the LDPC encoding is a systematic code, and therefore, the LDPC codeword may be formed of the LDPC information bits before being LDPC-encoded and the LDPC parity bits generated by the LDPC encoding.

For example, the LDPC encoder 110 may LDPC-encode $K_{ldpc}$ LDPC information bits $i=(i_0, i_1, \ldots, i_{K_{ldpc}-1})$ to generate $N_{ldpc\_parity}$ LDPC parity bits $(p_0, p_1, \ldots, p_{N_{ldpc}-K_{ldpc}-1})$ and output an LDPC codeword $\Lambda=(c_0, c_1, \ldots, c_{N_{inner}-1})=(i_0, i_1, \ldots, i_{K_{ldpc}-1}, p_0, p_1, \ldots, p_{N_{inner}-K_{ldpc}-1})$ formed of $N_{inner}(=K_{ldpc}+N_{ldpc\_parity})$ bits.

In this case, the LDPC encoder 110 may perform the LDPC encoding on the input bits (i.e., LDPC information bits) at various code rates to generate an LDPC codeword having a predetermined length.

For example, the LDPC encoder 110 may perform LDPC encoding on 3240 input bits at a code rate of 3/15 to generate an LDPC codeword formed of 16200 bits. As another example, the LDPC encoder 110 may perform LDPC encoding on 6480 input bits at a code rate of 6/15 to generate an LDPC codeword formed of 16200 bits.

A process of performing LDPC encoding is a process of generating an LDPC codeword to satisfy $H \cdot C^T = 0$, and thus, the LDPC encoder 110 may use a parity check matrix to perform the LDPC encoding. Here, H represents the parity check matrix and C represents the LDPC codeword.

Hereinafter, a structure of the parity check matrix according to various exemplary embodiments will be described with reference to the accompanying drawings. In the parity check matrix, elements of a portion other than 1 are 0.

Figure 2:
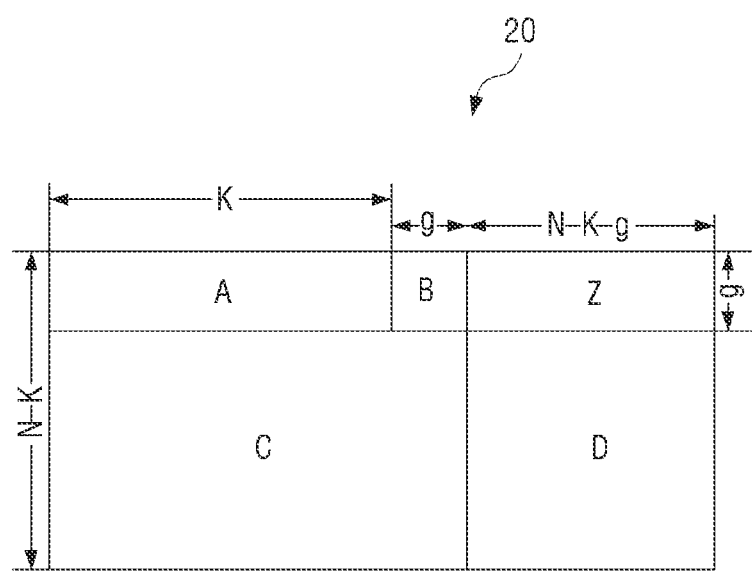
FIGS. 2 and 3 are diagrams for describing parity check matrices, according to exemplary embodiments.

For example, the parity check matrix according to an exemplary embodiment may have a structure as illustrated in FIG. 2.

Referring to FIG. 2, a parity check matrix 20 may be formed of five sub-matrices A, B, C, Z and D. Hereinafter, for describing the structure of the parity check matrix 20, each matrix structure will be described.

The sub-matrix A is formed of K columns and g rows, and the sub-matrix C is formed of K+g columns and N−K−g rows. Here, K (or $K_{ldpc}$) represents a length of LDPC information bits and N (or $N_{inner}$) represents a length of an LDPC codeword.

Further, in the sub-matrices A and C, indexes of a row in which 1 is positioned in a 0-th column of an i-th column group may be defined based on Table 1 when the length of the LDPC codeword is 16200 and the code rate is 3/15. The number of columns belonging to a same column group may be 360.

TABLE 1

8 372 841 4522 5253 7430 8542 9822 10550 11896 11988
80 255 557 1511 3549 5239 5422 5497 7157 7854 11267
257 406 792 2916 3072 3214 3638 4090 8175 8892 9003
80 150 346 1883 6838 7818 9482 10366 10514 11468 12341
32 100 978 3493 6751 7787 8406 10170 10318 10451 12561
504 803 856 2048 6775 7631 8110 8221 8371 9443 10990
152 283 696 1164 4514 4649 7260 7370 11925 11986 12092
127 1034 1044 1842 3184 3397 5931 7577 11899 12339 12689
107 513 879 3934 4374 4658 7286 7809 8830 10804 10893
2045 2489 7197 8887 9420 9922 10132 10540 10816 11876
2932 6241 7136 7835 8543 9403 9817 11679 12377 12810
2211 2288 3937 4310 9952 6597 9692 10445 11064 11272

Hereinafter, positions (alternatively referred to as "indexes" or "index values") of a row in which 1 is positioned in the sub-matrices A and C will be described in detail with reference to, for example, Table 1.

When the length of an LDPC codeword is 16200 and the code rate is 3/15, coding parameters $M_1$, $M_2$, $Q_1$ and $Q_2$ based on the parity check matrix 200 each are 1080, 11880, 3 and 33.

Here, $Q_1$ represents a size at which columns belonging to a same column group in the sub-matrix A are cyclic-shifted, and $Q_2$ represents a size at which columns belonging to a same column group in the sub-matrix C are cyclic-shifted.

Further, $Q_1=M_1/L$, $Q_2=M_2/L$, $M_1=g$, $M_2=N-K-g$ and L represents an interval at which patterns of a column are repeated in the sub-matrices A and C, respectively, that is, the number (for example, 360) of columns belonging to a same column group.

The indexes of the row in which 1 is positioned in the sub-matrices A and C, respectively, may be determined based on an $M_1$ value.

For example, in above Table 1, since $M_1=1080$, the position of a row in which 1 is positioned in a 0-th column of an i-th column group in the sub-matrix A may be determined based on values less than 1080 among index values of above Table 1, and the position of a row in which 1 is positioned in a 0-th column of an i-th column group in the sub-matrix C may be determined based on values equal to or greater than 1080 among the index values of above Table 1.

In detail, a sequence corresponding to a 0-th column group in above Table 1 is "8 372 841 4522 5253 7430 8542 9822 10550 11896 11988". Therefore, in a 0-th column of a 0-th column group in the sub-matrix A, 1 may be positioned in an eighth row, a 372-th row, and an 841-th row, respectively, and in a 0-th column of a 0-th column group in the sub-matrix C, 1 may be positioned in a 4522-th row, a 5253-th row, a 7430-th row, an 8542-th row, a 9822-th row, a 10550-th row, a 11896-th row, and a 11988-row, respectively.

In the sub-matrix A, when the position of 1 is defined in a 0-th columns of each column group, it may be cyclic-shifted by $Q_1$ to define a position of a row in which 1 is positioned in other columns of each column group, and in the sub-matrix C, when the position of 1 is defined in a 0-th columns of each column group, it may be cyclic-shifted by $Q_2$ to define a position of a row in which 1 is positioned in other columns of each column group.

In the foregoing example, in the 0-th column of the 0-th column group in the sub-matrix A, 1 is positioned in an eighth row, a 372-th row, and an 841-th row. In this case, since $Q_1=3$, indexes of a row in which 1 is positioned in a first column of the 0-th column group may be 11(=8+3), 375(=372+3), and 844=841+3) and indexes of a row in which 1 is positioned in a second column of the 0-th column group may be 14(=11+3), 378(=375+3), and 847(=844+3).

In a 0-th column of a 0-th column group in the sub-matrix C, 1 is positioned in a 4522-th row, a 5253-th row, a 7430-th row, an 8542-th row, a 9822-th row, a 10550-th row, a 11896-th row, and a 11988-th row. In this case, since $Q_2=33$, the indexes of the row in which 1 is positioned in a first column of the 0-th column group may be 4555(=4522+33), 5286(=5253+33), 7463(=7430+33), 8575(=8542+33), 9855(=9822+33) 10583(=10550+33), 11929(=11896+33), and 12021(=11988+33) and the indexes of the row in which 1 is positioned in a second column of the 0-th column group may be 4588(=4555+33), 5319(=5286+33), 7496(=7463+33), 8608(=8575+33), 9888(=9855+33), 10616(=10583+33), 11962(=11929+33), and 12054(=12021+33).

According to the scheme, the positions of the row in which 1 is positioned in all the column groups in the sub-matrices A and C may be defined.

The sub-matrix B is a dual diagonal matrix, the sub-matrix D is an identity matrix, and the sub-matrix Z is a zero matrix.

As a result, the structure of the parity check matrix 20 as illustrated in FIG. 2 may be defined by the sub-matrices A, B, C, D and Z having the above structure.

Hereinafter, a method for performing, by the LDPC encoder 110, LDPC encoding based on the parity check matrix 20 as illustrated in FIG. 2 will be described.

An LDPC code may be used to encode an information block $S=(s_0, s_1, \ldots, s_{K-1})$. In this case, to generate an LDPC codeword $\Lambda=(\lambda_0, \lambda_1, \ldots, \lambda_{N-1})$ having a length of $N=K+M_1+M_2$, parity blocks $P=(p_0, p_1, \ldots, p_{M_1+M_2-1})$ from the information block S may be systematically encoded.

As a result, the LDPC codeword may be $\Lambda=(s_0, s_1, \ldots, s_{K-1}, p_0, p_1, \ldots, p_{M_1+M_2-1})$.

Here, $M_1$ and $M_2$ each represent a size of parity sub-matrices corresponding to the dual diagonal sub-matrix B and the identity matrix sub-D, respectively, in which $M_1=g$ and $M_2=N-K-g$.

A process of calculating parity bits may be represented as follows. Hereinafter, for convenience of explanation, a case in which the parity check matrix 20 is defined as above Table 1 will be described as one example.

Step 1) $\lambda_i$ is initialized to be s, (i=0, 1, . . . , K−1) and $p_j$ is initialized to be 0 (j=0, 1, . . . , $M_1+M_2-1$).

Step 2) A first information bit $\lambda_0$ is accumulated in a parity bit address defined in the first row of above Table 1.

Step 3) For the next L−1 information bits $\lambda_m$(m=1, 2, . . . , L−1), $\lambda_m$ is accumulated in the parity bit address calculated based on following Equation 1.

$$(x+mXQ_1) \bmod M_1 (\text{if } x<M_1)$$

$$M_1+\{(x-M_1+mXQ_2) \bmod M_2\}(\text{if } x \geq M_1) \quad (1)$$

In above Equation 1, x represents an address of a parity bit accumulator corresponding to a first information bit $\lambda_0$.

Further, $Q_1=M_1/L$ and $Q_2=M_2/L$. In this case, since the length of the LDPC codeword is 16200 and the code rate is 3/15, $M_1=1080$, $M_2=11880$, $Q_1=3$, $Q_2=33$, L=360.

Step 4) Since the parity bit address like the second row of above Table 1 is given to an L-th information bit $\lambda_L$, similar to the foregoing scheme, the parity bit address for next L−1 information bits $\lambda_m$ (m=L+1, L+2, . . . , 2L−1) is calculated by the scheme described in the above step 3. In this case, x represents the address of the parity bit accumulator corresponding to the information bit $\lambda_L$ and may be obtained based on the second row of above Table 1.

Step 5) For L new information bits of each group, the new rows of above Table 1 are set as the address of the parity bit accumulator, and thus, the foregoing process is repeated.

Step 6) After the foregoing process is repeated from the codeword bit $\lambda_0$ to $\lambda_{K-1}$, a value for following Equation 2 is sequentially calculated from i=1.

$$p_i=p_i \oplus p_{i-1}(i=1,2,\ldots,M_1-1) \quad (2)$$

Step 7) The parity bits $\lambda_K$ to $\lambda_{K+M_1-1}$ corresponding to the dual diagonal sub-matrix B are calculated based on following Equation 3.

$$\lambda_{K+L \times t+s}=p_{Q_1 \times s+t}(0 \leq s<L, 0 \leq t<Q_1) \quad (3)$$

Step 8) The address of the parity bit accumulator for the L new codeword bits $\lambda_K$ to $\lambda_{K+M_1-1}$ of each group is calculated based on the new row of above Table 1 and above Equation 1.

Step 9) After the codeword bits $\lambda_K$ to $\lambda_{K+M_1-1}$ are applied, the parity bits $\lambda_{K+M_1}$ to $\lambda_{K+M_1+M_2-1}$ corresponding to the sub-matrix D are calculated based on following Equation 4.

$$\lambda_{K+M_1+L \times t+s}=p_{M_1+Q_1 \times s+t}(0 \leq s<L, 0 \leq t<Q_2) \quad (4)$$

As a result, the parity bits may be calculated by the above scheme. However, this is only one example and therefore the scheme for calculating the parity bits based on the parity check matrix as illustrated in FIG. 2 may be variously defined.

As such, the LDPC encoder 110 may perform the LDPC encoding based on above Table 1 to generate the LDPC codeword.

In detail, the LDPC encoder 110 may perform the LDPC encoding on 3240 input bits, that is, the LDPC information bits at the code rate of 3/15 based on above Table 1 to generate 12960 LDPC parity bits and output the LDPC parity bits and the LDPC codeword formed of the LDPC parity bits. In this case, the LDPC codeword may be formed of 16200 bits.

Figure 3:
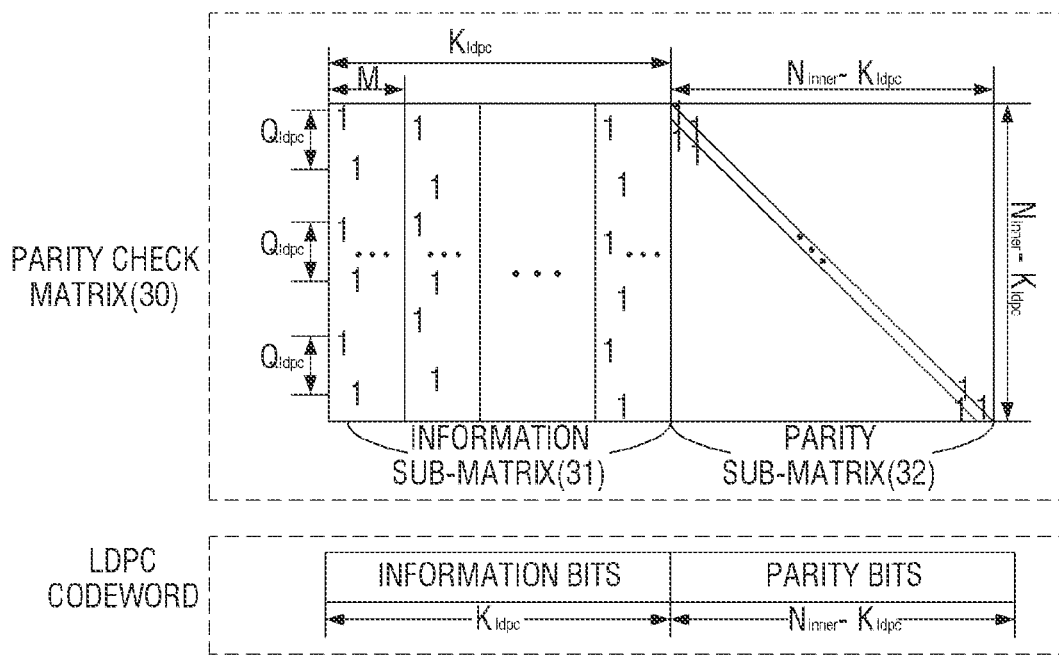

As another example, the parity check matrix according to an exemplary embodiment may have a structure as illustrated in FIG. 3.

Referring to FIG. 3, a parity check matrix 30 is formed of an information sub-matrix 31 which is a sub-matrix corresponding to the information bits (that is, LDPC information bits) and a parity sub-matrix 32 which is a sub-matrix corresponding to the parity bits (that is, LDPC parity bits).

The information sub-matrix 31 includes $K_{ldpc}$ columns and the parity sub-matrix 32 includes $N_{ldpc\_parity}=N_{inner}-K_{ldpc}$ columns. The number of rows of the parity check matrix 30 is equal to the number $N_{ldpc\_parity}=N_{inner}-K_{ldpc}$ of columns of the parity sub-matrix 32.

Further, in the parity check matrix 30, $N_{inner}$ represents the length of the LDPC codeword, $K_{ldpc}$ represents the length of the information bits, and $N_{ldpc\_parity}=N_{inner}-K_{ldpc}$ represents the length of the parity bits.

Hereinafter, the structures of the information sub-matrix 31 and the parity sub-matrix 32 will be described.

The information sub-matrix 31 is a matrix including the $K_{ldpc}$ columns (that is, 0-th column to ($K_{ldpc}-1$)-th column) and depends on the following rule.

First, the $K_{ldpc}$ columns configuring the information sub-matrix 31 belong to the same group by M numbers and are divided into a total of $K_{ldpc}/M$ column groups. The columns belonging to the same column group have a relationship that they are cyclic-shifted by $Q_{ldpc}$ from one another. That is, $Q_{ldpc}$ may be considered as a cyclic shift parameter value for columns of the column group in the information sub-matrix configuring the parity check matrix 30.

Here, M represents an interval (for example, M=360) at which the pattern of columns in the information sub-matrix 31 is repeated and $Q_{ldpc}$ is a size at which each column in the information sub-matrix 31 is cyclic-shifted. M is a common divisor of $N_{inner}$ and $K_{ldpc}$, and is determined so that $Q_{ldpc}=(N_{inner}-K_{ldpc})/M$ is established. Here, M and $Q_{ldpc}$ are integers and $K_{ldpc}/M$ also becomes an integer. M and $Q_{ldpc}$ may have various values depending on the length of the LDPC codeword and the code rate.

For example, when M=360, the length $N_{inner}$ of the LDPC codeword is 16200, and the code rate is 6/15, $Q_{ldpc}$ may be 27.

Second, if a degree (herein, the degree is the number of values is positioned in a column and the degrees of all columns belonging to a same column group are the same) of a 0-th column of an i-th (i=0, 1, . . . , $K_{ldpc}/M-1$) column group is set to be $D_i$ and positions (or index) of each row in which 1 is positioned in the 0-th column of the i-th column group is set to be $R_{i,0}^{(0)}, R_{i,0}^{(1)}, \ldots, R_{i,0}^{(D_i-1)}$, an index $R_{i,j}^{(k)}$ of a row in which a k-th 1 is positioned in a j-th column in the i-th column group is determined based on following Equation 5.

$$R_{i,j}^{(k)} = R_{i,(j-1)}^{(k)} + Q_{ldpc} \bmod(N_{inner}-K_{ldpc}) \quad (5)$$

In above Equation 5, k=0, 1, 2, . . . , $D_i$−1; i=0, 1, . . . , $K_{ldpc}/M-1$; j=1, 2, . . . , M−1.

Above Equation 5 may be represented like following Equation 6.

$$R_{i,j}^{(k)} = (R_{i,0}^{(k)} + (j \bmod M) \times Q_{ldpc}) \bmod(N_{inner}-K_{ldpc}) \quad (6)$$

In above Equation 6, k=0, 1, 2, . . . , $D_i$−1; i=0, 1, . . . , $K_{ldpc}/M-1$; j=1, 2, . . . , M−1. In above Equation 6, since j=1, 2, . . . , M−1, (j mod M) may be considered as j.

In these Equations, represents the index of a row in which a k-th 1 is positioned in a j-th column in an i-th column group, $N_{inner}$ represents the length of an LDPC codeword, $K_{ldpc}$ represents the length of information bits, $D_i$ represents the degree of columns belonging to the i-th column group, M represents the number of columns belonging to one column group, and $Q_{ldpc}$ represents the size at which each column is cyclic-shifted.

As a result, referring to the above equations, if a $R_{i,0}^{(k)}$ value is known, the index $R_{i,j}^{(k)}$ of the row in which the k-th 1 is positioned in the j-th column in the i-th column group may be known. Therefore, when the index value of the row in which the k-th 1 is positioned in a 0-columns of each column group is stored, the positions of the column and the row in which 1 is positioned in the parity check matrix 30 (that is, information sub-matrix 31 of the parity check matrix 30) having the structure of FIG. 3 may be checked.

According to the foregoing rules, all degrees of columns belonging to the i-th column group are $D_i$. Therefore, according to the foregoing rules, an LDPC code in which the information on the parity check matrix is stored may be briefly represented as follows.

For example, when $N_{inner}$ is 30, $K_{ldpc}$ is 15, and $Q_{ldpc}$ is 3, positional information of the row in which 1 is positioned in 0-th columns of three column groups may be represented by sequences as following Equation 7, which may be named 'weight-1 position sequence'.

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13,$$

$$R_{3,0}^{(1)}=0, R_{3,0}^{(2)}=14. \quad (7)$$

In above Equation 7, $R_{1,j}^{(k)}$ represents the indexes of the row in which the k-th 1 is positioned in the j-th column of the i-th column group.

The weight-1 position sequences as above Equation 7 representing the index of the row in which 1 is positioned in the 0-th columns of each column group may be more briefly represented as following Table 2.

TABLE 2

| |
|---|
| 1 2 8 10 |
| 0 9 13 |
| 0 14 |

Above Table 2 represents positions of elements having a value 1 in the parity check matrix and the i-th weight-1 position sequence is represented by the indexes of the row in which 1 is positioned in the 0-th column belonging to the i-th column group.

The information sub-matrix 31 of the parity check matrix according to the exemplary embodiment described above may be defined based on following Table 3.

Here, following Table 3 represents the indexes of the row in which 1 is positioned in a 0-th column of an i-th column group in the information sub-matrix 31. That is, the information sub-matrix 31 is formed of a plurality of column groups each including M columns and the positions of is in the 0-th columns of each of the plurality of column groups may be defined as following Table 3.

For example, when the length $N_{inner}$ of the LDPC codeword is 16200, the code rate is 6/15, and the M is 360, the indexes of the row in which 1 is positioned in the 0-th column of the i-th column group in the information sub-matrix 31 are as following Table 3.

TABLE 3

| |
|---|
| 27 430 519 828 1897 1943 2513 2600 2640 3310 3415 |
| 4266 5044 5100 5328 5483 5928 6204 6392 6416 6602 |
| 7019 7415 7623 8112 8485 8724 8994 9445 9667 |
| 27 174 188 631 1122 1477 1779 2017 2270 2601 2813 |
| 3196 3382 3895 3908 3948 4465 4955 5120 5809 5988 |
| 6478 6804 7096 7673 7735 7795 9925 9313 9670 |
| 37 370 617 852 910 3010 1126 1523 1606 2138 2248 |
| 2909 3234 3413 3623 3743 3752 4517 4694 5300 5687 |
| 6031 6100 6232 6491 6621 6860 7304 8542 8634 |
| 990 1753 7635 8540 |
| 933 1415 5666 8745 |
| 27 6567 8702 9216 |
| 9231 8689 9580 9615 |
| 260 1192 5839 6080 |
| 352 3750 4847 7726 |
| 4610 6580 9506 9597 |
| 2512 2974 4814 9348 |
| 1418 4021 5060 7009 |
| 1796 2883 5553 8306 |
| 1249 5422 7057 |
| 3965 6968 9422 |
| 1498 2931 5092 |
| 27 1090 6215 |
| 26 4232 6354 |

According to another exemplary embodiment, a parity check matrix in which an order of indexes in each sequence corresponding to each column group in above Table 3 is changed is considered as a same parity check matrix for an LDPC code as the above described parity check matrix is another example of the inventive concept.

According to still another exemplary embodiment, a parity check matrix in which an array order of the sequences of the column groups in above Table 3 is changed is also considered as a same parity check matrix as the above described parity check matrix in that they have a same algebraic characteristics such as cyclic characteristics and degree distributions on a graph of a code.

According to yet another exemplary embodiment, a parity check matrix in which a multiple of $Q_{ldpc}$ is added to all indexes of a sequence corresponding to column group in above Table 3 is also considered as a same parity check matrix as the above described parity check matrix in that they have same cyclic characteristics and degree distributions on the graph of the code. Here, it is to be noted that when a value obtained by adding the multiple of $Q_{ldpc}$ to a given sequence is equal to or more than $N_{inner}-K_{ldpc}$, the value needs to be changed into a value obtained by performing a modulo operation on the $N_{inner}-K_{ldpc}$, and then applied.

If the position of the row in which 1 is positioned in the 0-th column of the i-th column group in the information sub-matrix 31 as shown in above Table 3 is defined, it may be cyclic-shifted by $Q_{ldpc}$, and thus, the position of the row in which 1 is positioned in other columns of each column group may be defined.

For example, as shown in above Table 3, since the sequence corresponding to the 0-th column of the 0-th column group of the information sub-matrix 31 is "27 430 519 828 1897 1943 2513 2600 2640 3310 3415 4266 5044 5100 5328 5483 5928 6204 6392 6416 6602 7019 7415 7623 8112 8485 8724 8994 9445 9667", in the 0-th column of the 0-th column group in the information sub-matrix 31, 1 is positioned in a 27-th row, a 430-th row, a 519-th-row, . . . .

In this case, since $Q_{ldpc}=(N_{inner}-K_{ldpc})/M=(16200-6480)/360=27$, the indexes of the row in which 1 is positioned in the first column of the 0-th column group may be 54(=27+27), 457(=430+27), 546(=519+27), 81(=54+27), 484(=457+27), 573(=546+27), . . . .

By the above scheme, the indexes of the row in which 1 is positioned in all the rows of each column group may be defined.

Hereinafter, the method for performing LDPC encoding based on the parity check matrix 30 as illustrated in FIG. 3 will be described.

First, information bits to be encoded are set to be $i_0, i_1, \ldots, i_{K_{ldpc}-1}$, and code bits output from the LDPC encoding are set to be $c_0, c_1, \ldots, c_{N_{ldpc}-1}$.

Further, since an LDPC code is systematic, for k $(0 \leq k < K_{ldpc}-1)$, $c_k$ is set to be $i_k$. The remaining code bits are set to be $p_k := C_{k+k_{ldpc}}$.

Hereinafter, a method for calculating parity bits $p_k$ will be described.

Hereinafter, q(i,j,0) represents a j-th entry of an i-th row in an index list as above Table 3, and q(i,j,1) is set to be q(i,j,1)=q(i, j, 0)+$Q_{ldpc}$×1 (mod $N_{inner}-K_{ldpc}$) for 0<i<360. All the accumulations may be realized by additions in a Galois field (GF) (2). Further, in above Table 3, since the length of the LDPC codeword is 16200 and the code rate is 6/15, the $Q_{ldpc}$ is 27.

When the q(i,j,0) and the q(i,j,1) are defined as above, a process of calculating the parity bit is as follows.

Step 1) The parity bits are initialized to '0'. That is, $p_k=0$ for $0 \leq k \leq N_{inner}-K_{ldpc}$.

Step 2) For all k values of $0 \leq k < K_{ldpc}$, i and l are set to be i:=$\lfloor k/360 \rfloor$ and I:=k (mod 360). Here, is a maximum integer which is not greater than x.

Next, for all i, $i_k$ is accumulated in $p_{q(i,j,1)}$. That is, $p_{q(i,0,1)}=p_{q(i,0,1)}+i_k, p_{q(i,1,1)}=p_{q(i,1,1)}+i_k, p_{q(i,2,1)}=p_{q(i,2,1)}+i_k, \ldots, p_{q(i,w(i)-1,1)}=p_{q(i,w(i)-1,1)}+i_k$ are calculated.

Here, w(i) represents the number of the values (elements) of an i-th row in the index list as above Table 3 and represents the number of 1 s in a column corresponding to $i_k$ in the parity check matrix. Further, in above Table 3, q(i, j, 0) which is a j-th entry of an i-th row is an index of a parity bit and represents the position of the row in which 1 is positioned in a column corresponding to $i_k$ in the parity check matrix.

In detail, in above Table 3, q(i,j,0) which is the j-th entry of the i-th row represents the position of the row in which 1 is positioned in the first (that is, 0-th) column of the i-th column group in the parity check matrix of the LDPC code.

The q(i, j, 0) may also be considered as the index of the parity bit to be generated by LDPC encoding according to a method for allowing a real apparatus to implement a scheme for accumulating $i_k$ in $p_{q(i, j, 1)}$ for all i, and may also be considered as an index in another form when another encoding method is implemented. However, this is only one example, and therefore, it is apparent to obtain an equivalent result to an LDPC encoding result which may be obtained from the parity check matrix of the LDPC code which may basically be generated based on the q(i,j,0) values of above Table 3 whatever the encoding scheme is applied.

Step 3) A parity bit $p_k$ is calculated by calculating $p_k=p_k+p_{k-1}$ for all k satisfying $0<k<N_{inner}-K_{ldpc}$.

Accordingly, all code bits $c_0, c_1, c_{N_{ldpc}-1}$ may be obtained.

As a result, parity bits may be calculated by the above scheme. However, this is only one example, and therefore, the scheme for calculating the parity bits based on the parity check matrix as illustrated in FIG. 3 may be variously defined.

As such, the LDPC encoder 110 may perform LDPC encoding based on above Table 3 to generate an LDPC codeword.

In detail, the LDPC encoder 110 may perform the LDPC encoding on 6480 input bits, that is, the LDPC information bits at the code rate of 6/15 based on above Table 3 to generate 9720 LDPC parity bits and output the LDDC parity bits and the LDPC codeword formed of the LDPC parity bits. In this case, the LDPC codeword may be formed of 16200 bits.

As described above, the LDPC encoder 110 may encode the input bits at various code rates to generate the LDPC codeword, and output the generated LDPC codeword to the parity permutator 120.

The parity permutator 120 interleaves the LDPC parity bits, and performs group-wise interleaving on a plurality of bit groups configuring the interleaved LDPC parity bits to perform parity permutation. However, the parity permutator 120 may not interleave the LDPC parity bits but may perform the group-wise interleaving on the LDPC parity bits to perform parity permutation.

The parity permutator 120 may output the parity permutated LDPC codeword to the puncturer 130.

The parity permutator 120 may also output the parity permutated LDPC codeword to an additional parity generator 140. In this case, the additional parity generator 140 may use the parity permutated LDPC codeword to generate additional parity bits.

To this end, the parity permutator 120 may include a parity interleaver (not illustrated) for interleaving the LDPC parity bits and a group-wise parity interleaver (not illustrated) for group-wise interleaving the LDPC parity bits or the interleaved LDPC parity bits.

First, the parity interleaver may interleave the LDPC parity bits. That is, the parity interleaver may interleave only the LDPC parity bits among the LDPC information bits and the LDPC parity bits configuring the LDPC codeword.

In detail, the parity interleaver may interleave the LDPC parity bits based on following Equation 8.

$u_i = c_i$ for $0 \le i < K_{ldpc}$ (information bits are not interleaved.)

$$u_{K_{ldpc}+360t+s} = c_{K_{ldpc}+27s+t} \text{ for } 0 \le s < 360, 0 \le t < 27 \quad (8)$$

In detail, depending on above Equation 8, the LDPC codeword $(c_0, c_1, \ldots, c_{N_{inner}-1})$ is parity-interleaved by the parity interleaver and an output of the parity interleaver may be represented by $U=(u_0, u_1, \ldots, u_{N_{inner}-1})$.

By the parity interleaving, the LDPC codeword is configured such that a specific number of continued bits in the LDPC codeword have similar decoding characteristics (for example, cyclic distribution, degree of column, etc.). For example, the LDPC codeword may have similar decoding characteristics by each continued M bits. Here, M may be 360.

The product of the LDPC codeword bits by the parity check matrix need to be '0'. This means that a sum of the products of the i-th LDPC codeword bits $c_i$ (i=0, 1, ..., $N_{inner}-1$) by the i-th columns of the parity check matrix needs to be a '0' vector. Therefore, the i-th LDPC codeword bits may be considered as corresponding to the i-th column of the parity check matrix.

As to the parity check matrix 30 as illustrated in FIG. 3, elements included in every M columns of the information sub-matrix 31 belongs to a same group and have the same characteristics in a column group unit (for example, columns of a same column group have the same degree distributions and the same cyclic characteristics).

Continued M bits in the LDPC information bits correspond to a same column group in the information sub-matrix 31, and, as a result, the LDPC information bits may be formed of the continued M bits having same codeword characteristics. Meanwhile, if the parity bits of the LDPC codeword are interleaved based on above Equation 8, continued M bits of the interleaved parity bits may have the same codeword characteristics.

As a result, by the parity interleaving, the LDPC codeword is configured such that a specific number of continued bits have similar decoding characteristics.

However, when LDPC encoding is performed based on the parity check matrix 20 as illustrated in FIG. 2, parity interleaving is performed as a part of the LDPC encoding. Therefore, an LDPC codeword generated based on the parity check matrix 20 as illustrated in FIG. 2 is not separately parity-interleaved. That is, the parity interleaver for the parity interleaving is not used.

For example, in an L1 detail mode 2 in Table 5 to be described later, LDPC information bits are encoded based on the parity check matrix 20 as illustrated in FIG. 2, and thus, separate parity interleaving is not performed. Here, even when the parity interleaving is not performed, the LDPC codeword bits may be formed of continued M bits having the same characteristics.

In this case, an output $U=(u_0, u_1, \ldots, u_{N_{inner}-1})$ of the parity interleaver may be represented based on following Equation 9.

$$u_i = c_i \text{ for } 0 \le i < N_{inner} \quad (9)$$

As such, the LDPC codeword may simply pass through the parity interleaver without parity interleaving. However, this is only one example, and in some cases, the LDPC codeword does not pass through the parity interleaver, and instead, may be directly provided to the group-wise interleaver to be described below.

The group-wise interleaver may perform group-wise interleaving on the output of the parity interleaver.

Here, as described above, the output of the parity interleaver may be the LDPC codeword parity-interleaved by the parity interleaver or may be the LDPC codeword which is not parity-interleaved by the parity interleaver.

Therefore, when the parity interleaving is performed, the group-wise interleaver may perform the group-wise interleaving on the parity interleaved LDPC codeword, and when the parity interleaving is not performed, the group-wise interleaver may perform the group-wise interleaving on the LDPC codeword.

In detail, the group-wise interleaver may interleave the output of the parity interleaver in a bit group unit (or in a unit of a bit group).

For this purpose, the group-wise interleaver may divide the LDPC codeword output from the parity interleaver into a plurality of bit groups. As a result, the LDPC parity bits configuring the LDPC codeword may be divided into a plurality of bit groups.

In detail, the group-wise interleaver may divide the LDPC codeword $(u_0, u_1, \ldots, u_{N_{inner}-1})$ output from the parity interleaver based on following Equation 10 into $N_{group}(=N_{inner}/360)$ bit groups.

$$X_j = \{u_k | 360 \times j \le k < 360 \times (j+1), 0 \le k < N_{inner}\} \text{ for } 0 \le N_{group} \quad (10)$$

In above Equation 10, N represents a j-th bit group.

Figure 4:
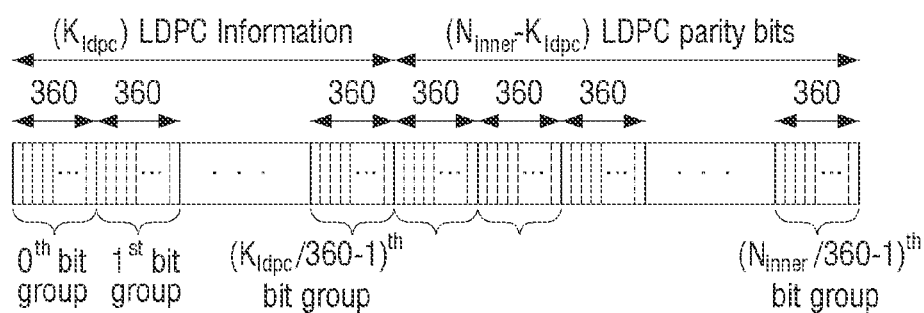
FIG. 4 is a diagram illustrating an example of dividing an LDPC codeword into a plurality of bit groups, according to an exemplary embodiment.

FIG. 4 illustrates an example in which the LDPC codeword output from the parity interleaver is divided into a plurality of bit groups, according to an exemplary embodiment.

Referring to FIG. 4, the LDPC codeword is divided into $N_{group}(=N_{inner}/360)$ bit groups and each bit group $X_j$ for $0 \le j < N_{group}$ is formed of 360 bits.

As a result, the LDPC information bits formed of $K_{ldpc}$ bits may be divided into $K_{ldpc}/360$ bit groups and the LDPC parity bits formed of $N_{inner}-K_{ldpc}$ bits may be divided into $N_{inner}-K_{ldpc}/360$ bit groups.

Further, the group-wise interleaver performs the group-wise interleaving on the LDPC codeword output from the parity interleaver.

In this case, the group-wise interleaver does not perform the interleaving on the LDPC information bits, and may perform the interleaving only on the LDPC parity bits among the LDPC information bits and the LDPC parity bits to change the order of the plurality of bit groups configuring the LDPC parity bits.

In detail, the group-wise interleaver may perform the group-wise interleaving on the LDPC codeword based on following Equation 11. In detail, the group-wise interleaver may perform the group-wise interleaving on the plurality of bit groups configuring the LDPC parity bits based on following Equation 11.

$$Y_j = X_j, 0 \le j < K_{ldpc}/360$$

$$Y_j = X_{\pi_p(j)}, K_{ldpc}/360 \le j < N_{group} \quad (11)$$

In above Equation 11, $Y_j$ represents a group-wise interleaved j-th bit group, and $X_j$ represents a j-th bit group before the group-wise interleaving (that is, $X_j$ represents the j-th bit group among the plurality of bit groups configuring the LDPC codeword, and $Y_j$ represents the group-wise-interleaved j-th bit group). Further, $\pi_p(j)$ represents a permutation order for the group-wise interleaving.

Further, $K_{ldpc}$ is the number of input bits, that is, the number of LDPC information bits, and $N_{group}$ is the number of groups configuring the LDPC codeword formed of the input bits and the LDPC parity bits.

The permutation order may be defined based on a group-wise interleaving pattern as shown in following Table 4. That is, the group-wise interleaver determines $\pi_p(j)$ based on the group-wise interleaving pattern as shown in following Table 4, and as a result an order of the plurality of bit groups configuring the LDPC parity bits may be changed.

For example, the group-wise interleaving pattern may be as shown in following Table 4.

groups are positioned. That is, the group-wise interleaver may position the specific bit groups at 34-th to 44-th positions and may randomly position the remaining bit groups at 18-th to 33-th positions.

In detail, the group-wise interleaver positions a 25-th bit group at a 34-th position, a 42-th bit group at a 35-th position, a 34-th bit group at a 36-th position, . . . , a 28-th

TABLE 4

| | Order of group-wise interleaving $\pi(j)$ (18 ≤ j < 45) | | | | | | | | | | | | | |
|---|---|---|---|---|---|---|---|---|---|---|---|---|---|---|
| $N_{group}$ | $\pi_p(18)$ | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ |
| | $\pi_p(32)$ | $\pi_p(33)$ | $\pi_p(34)$ | $\pi_p(35)$ | $\pi_p(36)$ | $\pi_p(37)$ | $\pi_p(38)$ | $\pi_p(39)$ | $\pi_p(40)$ | $\pi_p(41)$ | $\pi_p(42)$ | $\pi_p(43)$ | $\pi_p(44)$ | |
| 45 | — | — | — | — | — | — | — | — | — | — | — | — | — | — |
| | — | — | 25 | 42 | 34 | 18 | 32 | 38 | 23 | 30 | 28 | 36 | 41 | |

Above Table 4 represents a group-wise interleaving pattern for a case in which the LDPC encoder 110 performs the LDPC encoding on 6480 input bits at a code rate of 6/15 to generate 9720 LDPC parity bits and an LDPC codeword generated by the LDPC encoding is modulated by 64-quadrature amplitude modulation (64-QAM) and then is transmitted to the receiver 200.

In this case, since some of the LDPC parity bits in the LDPC codeword are to be punctured by puncturing to be described below, the LDPC codeword in which some of the LDPC parity bits are punctured may be mapped to constellation symbols by 64-QAM to be transmitted to the receiver 200.

That is, when 6480 LDPC information bits are encoded at the code rate of 6/15, 9720 LDPC parity bits are generated, and as a result the LDPC codeword may be formed of 16200 bits.

Each bit group is formed of 360 bits, and the LDPC codeword formed of 16200 bits is divided into 45 bit groups.

Here, since the LDPC information bits are 6480 and the LDPC parity bits are 9720, a 0-th bit group to a 17-th bit group correspond to the LDPC information bits and an 18-th bit group to a 44-th bit group correspond to the LDPC parity bits.

In this case, the parity interleaver performs parity interleaving, and the group-wise interleaver does not perform interleaving on bit groups configuring the LDPC information bits, that is, the 0-th bit group to the 17-th bit group but may interleave bit groups configuring the interleaved LDPC parity bits, that is, the 18-th bit group to the 44-th bit group in a group unit to change an order of the 18-th bit group to the 44-th bit group based on above Equation 11 and Table 4.

In detail, in above Table 4, above Equation 11 may be represented like $Y_0=X_0, Y_1=X_1, \ldots, Y_{16}=X_{16}, Y_{17}=X_{17}, Y_{34}=X_{\pi p(34)}=X_{25}, Y_{35}=X_{\pi p(35)}=X_{42}, Y_{36}=X_{\pi p(36)}=X_{34}, \ldots, Y_{42}=X_{\pi p(42)}=X_{28}, Y_{43}=X_{\pi p(43)}=X_{36}, Y_{44}=X_{\pi p(44)}=X_{41}$.

Therefore, the group-wise interleaver does not change an order of the 0-th bit group to the 17-th bit group including the LDPC information bits, but changes an order of the 18-th bit group to the 44-th bit group including the LDPC parity bits.

In this case, the group-wise interleaver may change an order of 27 bit groups such that specific bit groups among 27 bit groups configuring the LDPC parity bits are positioned at specific positions and the remaining bit groups are randomly positioned at positions remaining after the specific bit bit group at a 42-th position, a 36-th bit group at a 43-th position, and a 41-th bit group at a 44-th position.

Further, the group-wise interleaver randomly positions the remaining bit groups, that is, the bit groups, which are positioned at 19-th, 20-th, 21-th, . . . , 40-th, 43-th, and 44-th positions before the group-wise interleaving, at the remaining positions. That is, the remaining bit groups are randomly positioned at positions remaining after the bit groups each positioned at 25-th, 42-th, . . . , 36-th and 41-th positions before the group-wise interleaving are positioned by the group-wise interleaving. Here, the remaining positions may be 18-th to 33-th positions.

As such, the parity permutator 120 may interleave the parity bits and perform the group-wise interleaving on the plurality bit groups configuring the interleaved parity bits to perform the parity permutation.

That is, the parity permutator 120 may perform the group-wise interleaving on the plurality of bit groups configuring the interleaved LDPC parity bits based on above Equation 11 and Table 4.

In detail, when the LDPC encoder 110 performs the LDPC encoding on 6480 LDPC information bits at the code rate of 6/15 to generate 9720 LDPC parity bits, the parity permutator 120 divides the interleaved LDPC parity bits into a plurality of bit groups and may perform the group-wise interleaving based on above Equation 11 and Table 4 to change the order of the plurality of bit groups.

The parity permutated LDPC codeword bits may be punctured as described below and modulated by the 64-QAM for transmission to the receiver 200.

Referring to above Table 4, it may be appreciated that the specific bit groups among the bit groups positioned at 18-th to 44-th positions before the group-wise interleaving are positioned at 34-th to 44-th positions after the group-wise interleaving and the remaining bit groups are randomly positioned at 18-th to 33-th positions.

In this case, a pattern defining the bit group positioned at 34-th to 44-th positions after the group-wise interleaving may be referred to as a second pattern of the group-wise interleaving, and the other pattern may be referred to as a first pattern.

Here, the first pattern is a pattern used to determine parity bits to be transmitted in a current frame after puncturing, and the second pattern is a pattern used to determine additional parity bits transmitted in a previous frame.

As such, the group-wise interleaving pattern may include the first pattern and the second pattern, and the parity permutator 120 interleaves the parity bits, and may perform the group-wise interleaving on the plurality of bit groups configuring the interleaved parity bits based on the group-wise interleaving pattern including the first pattern and the second pattern to perform the parity permutation.

The additional parity bits to be described below are determined according to the first pattern and the second pattern, and the detailed descriptions thereof will be provided below.

The puncturer 130 punctures some of the parity permutated LDPC parity bits. Further, the puncturer 130 may provide information (for example, the number and positions of punctured bits, etc.) on the punctured LDPC parity bits to the additional parity generator 140. In this case, the additional parity generator 140 may generate the additional parity bits based thereon.

Here, the puncturing means that some of the LDPC parity bits are not transmitted to the receiver 200. In this case, the puncturer 130 may remove the punctured LDPC parity bits or output only the remaining bits other than the punctured LDPC parity bits in the LDPC codeword.

For this purpose, the puncturer 130 may calculate the number of LDPC parity bits to be punctured.

In detail, the puncturer 130 may calculate the number of LDPC parity bits to be punctured based on $N_{punc\_temp}$ which is calculated based on following Equation 12.

$$N_{punc\_temp} = \lfloor A \times (K_{ldpc} - N_{outer}) \rfloor + B \quad (12)$$

In above Equation 12, $N_{punc\_temp}$ represents a temporary number of LDPC parity bits to be punctured, and $K_{ldpc}$ represents the number of LDPC information bits. $N_{outer}$ represents the number of outer-encoded bits. Here, when the outer encoding is performed by BCH encoding, $N_{outer}$ represents the number of BCH encoded bits.

A represents a preset constant. According to an exemplary embodiment, a constant A value is set at a ratio of the number of bits to be punctured to the number of bits to be shortened but may be variously set depending on requirements of a system. B is a value which represents a length of bits to be punctured even when the shortening length is 0 and represents a minimum length that the punctured LDPC parity bits can have. Here, A=¾ and B=4284.

The A and B values serve to adjust the code rate at which information bits are actually transmitted. That is, to prepare for a case in which the length of the information bits is short or a case in which the length of the information bits is long, the A and B values serve to adjust the actually transmitted code rate to be reduced.

Further, the puncturer 130 calculates $N_{FEC}$ based on following Equation 13.

$$N_{FEC} = \left\lceil \frac{N_{FEC\_temp}}{\eta MOD} \right\rceil \times \eta MOD \quad (13)$$

In above Equation 13, $\lceil x \rceil$ represents a minimum integer which is equal to or greater than x.

Further, $N_{FEC\_temp} = N_{outer} + N_{ldpc\_parity} - N_{punc\_temp}$, and $\eta_{MOD}$ is a modulation order. For example, when an LDPC codeword is modulated by quadrature phase shift keying (QPSK), 16-QAM, 64-QAM or 256-QAM, $\eta_{MOD}$ may be 2, 4, 6 or 8, respectively.

Further, $N_{FEC}$ is the number of bits configuring a punctured and shortened LDPC codeword (that is, LDPC codeword bits to remain after puncturing and shortening).

Next, the puncturer 130 calculates $N_{punc}$ based on following Equation 14.

$$N_{punc} = N_{punc\_temp} - (N_{FEC} - N_{FEC\_temp}) \quad (14)$$

In above Equation 14, $N_{punc}$ represents the number of LDPC parity bits to be punctured.

Referring to the above process, the puncturer 130 calculates the temporary number $N_{punc\_temp}$ of LDPC parity bits to be punctured, by adding the constant integer B to an integer obtained from a product result of the number of padded zero bits, that is, the shortening length ($=K_{ldpc} - N_{outer}$) by the preset constant A value. The constant A value is set at a ratio of the number of punctured bits to the number of shortened bits according to an exemplary embodiment, but may be variously set depending on requirements of a system.

Further, the puncturer 130 calculates a temporary number $N_{FEC\_temp}$ of LDPC codeword bits to constitute the LDPC codeword after puncturing and shortening based on $N_{punc\_temp}$.

In detail, the LDPC information bits are LDPC-encoded and the LDPC parity bits generated by the LDPC encoding are added to the LDPC information bits to configure the LDPC codeword. Here, the LDPC information bits include the BCH encoded bits in which the information bits are BCH-encoded and, in some cases, may further include zero bits padded to the information bits.

In this case, since the padded zero bits are LDPC-encoded but are not transmitted to the receiver 200, the shortened LDPC codeword, that is, the LDPC codeword (that is, shortened LDPC codeword) without the padded zero bits may be formed of the BCH encoded bits and the LDPC parity bits. When the zero bits are not padded, the LDPC codeword may also be formed of the BCH encoded bits and the LDPC parity bits.

Therefore, the puncturer 130 subtracts the temporary number of punctured LDPC parity bits from the summed value of the number of BCH encoded bits and the number of LDPC parity bits to calculate $N_{FEC\_temp}$.

The punctured and shortened LDPC codeword bits are modulated by 64-QAM to be mapped to constellation symbols and the constellation symbols may be transmitted to the receiver 200 through a frame.

Therefore, the puncturer 130 determines the number $N_{FEC}$ of LDPC codeword bits to constitute the LDPC codeword after puncturing and shortening based on $N_{FEC\_temp}$, $N_{FEC}$ being an integer multiple of the modulation order, and determines the number $N_{punc}$ of bits which need to be punctured in the shortened LDPC codeword bits to form $N_{FEC}$. Meanwhile, when zero bits are not padded, the LDPC codeword may be formed of BCH encoded bits and LDPC parity bits and the shortening may be omitted.

The puncturer 130 may puncture bits as many as the number calculated in the LDPC parity bits.

In detail, the puncturer 130 may puncture a specific number of bits at a back portion of the parity permutated LDPC parity bits. That is, the puncturer 130 may puncture $N_{punc}$ bits from a last LDPC parity bit among the parity permutated LDPC parity bits.

As such, since the puncturer 130 performs puncturing from the last LDPC parity bit, a bit group of which the position is changed to the back portion in the LDPC parity bits by the parity permutation may start to be punctured. That is, the first punctured bit group may be a bit group interleaved to a last position by the parity permutation.

The additional parity generator 140 may generate additional parity bits to be transmitted in a previous frame. The additional parity bits may be selected from LDPC parity bits generated based on the information bits to be transmitted in a current frame to the receiver 200.

The additional parity generator 140 selects at least some of the punctured LDPC parity bits to generate the additional parity bits to be transmitted in the previous frame. The additional parity generator 140 may select all of the punctured LDPC parity bits and select at least some of the parity permutated LDPC parity bits to generate the additional parity bits to be transmitted in the previous frame.

In detail, input bits including information bits are LDPC encoded, and LDPC parity bits generated by the LDPC encoding are added to the input bits to configure an LDPC codeword.

Further, puncturing and shortening are performed on the LDPC codeword, and the punctured and shortened LDPC codeword may be mapped to a frame to be transmitted to the receiver 200.

In this case, the information bits corresponding to each frame may be transmitted to the receiver 200 through each frame, along with the LDPC parity bits. For example, a punctured and shortened LDPC codeword including information bits corresponding to an (i−1)-th frame may be mapped to the (i−1)-th frame to be transmitted to the receiver 200, and a punctured and shortened LDPC codeword including information bits corresponding to an i-th frame may be mapped to the i-th frame to be transmitted to the receiver 200.

The additional parity generator 140 may select at least some of the LDPC parity bits generated based on the information bits transmitted in the i-th frame to generate additional parity bits.

In detail, some of the LDPC parity bits generated by performing the LDPC encoding on the information bits are punctured and then are not transmitted to the receiver 200. In this case, the additional parity generator 140 may select at least some of the punctured LDPC parity bits among the LDPC parity bits generated by performing the LDPC encoding on the information bits transmitted in the i-th frame, thereby generating the additional parity bits.

Further, the additional parity generator 140 may select at least some of the LDPC parity bits transmitted to the receiver 200 through the i-th frame to generate the additional parity bits.

In detail, the additional parity generator 140 may select at least some of the LDPC parity bits included in the punctured and shortened LDPC codeword mapped to the i-th frame to generate the additional parity bits.

The additional parity bits may be transmitted to the receiver 200 through a frame before the i-th frame, that is, the (i−1)-th frame.

That is, the transmitter 100 may not only transmit the punctured and shortened LDPC codeword including the information bits corresponding to the (i−1)-th frame but also transmits the generated additional parity bits selected from the LDPC parity bits generated based on the information bits transmitted in the i-th frame to the receiver 200 through the (i−1)-th frame.

Hereinafter, a method for generating additional parity bits will be described in detail.

First, the additional parity generator 140 calculates a temporary number $N_{AP\_temp}$ of additional parity bits to be generated based on following Equation 15.

$$N_{AP\_temp} = \min\left\{\begin{array}{l} 0.5 \times K \times (N_{outer} + N_{dpc\_parity} - N_{punc}) \\ (N_{ldpc\_parity} + N_{punc}) \end{array}\right\}, K = 0, 1, 2 \quad (15)$$

In above Equation 15, $$\min(a, b) = \begin{cases} a, & \text{if } a \leq b \\ b, & \text{if } b < a \end{cases}.$$

In above Equation 15, K represents a ratio of the number of additional parity bits to a half of the length of transmitted LDPC codeword, that is, the total number of punctured and shortened LDPC codeword bits. However, in above Equation 15, K=0, 1, 2, which is only one example. Therefore, K may have various values.

Further, $N_{ldpc\_parity}$ is the number of LDPC parity bits, and $N_{punc}$ is the number of punctured LDPC parity bits. Further, $N_{outer}$ represents the number of outer-encoded bits. In this case, when the outer encoding is performed by BCH encoding, $N_{outer}$ represents the number of BCH encoded bits.

Further, $N_{outer}+N_{ldpc\_parity}-N_{punc}$ is the total number of bits transmitted in the current frame (that is, the total number of LDPC codeword bits after puncturing and shortening), and $N_{ldpc\_parity}+N_{punc}$ is a summed value of the number of LDPC parity bits and the number of punctured LDPC parity bits.

As such, the number of additional parity bits to be generated may be determined based on the total number of bits transmitted in the current frame.

Further, the additional parity generator 140 may calculate the number $N_{AP}$ of additional parity bits to be generated based on following Equation 16.

$$N_{AP} = \left\lfloor \frac{N_{AP\_temp}}{\eta_{MOD}} \right\rfloor \times \eta_{MOD} \quad (16)$$

In above Equation 16, $\lfloor x \rfloor$ is a maximum integer which is not greater than x. Further, in above Equation 16, $\eta_{MOD}$ is a modulation order. For example, for QPSK, 16-QAM, 64-QAM and 256-QAM, $\eta_{MOD}$ may be 2, 4, 6 and 8, respectively.

Therefore, the number of additional parity bits may be an integer multiple of the modulation order. That is, since the additional parity bits are separately modulated from the information bits to be mapped to constellation symbols, the number of additional parity bits to be generated may be determined to be the integer multiple of the modulation order like above Equation 16.

Hereinafter, the method for generating additional parity bits will be described in more detail with reference to FIGS. 5 and 6.

Figure 5:
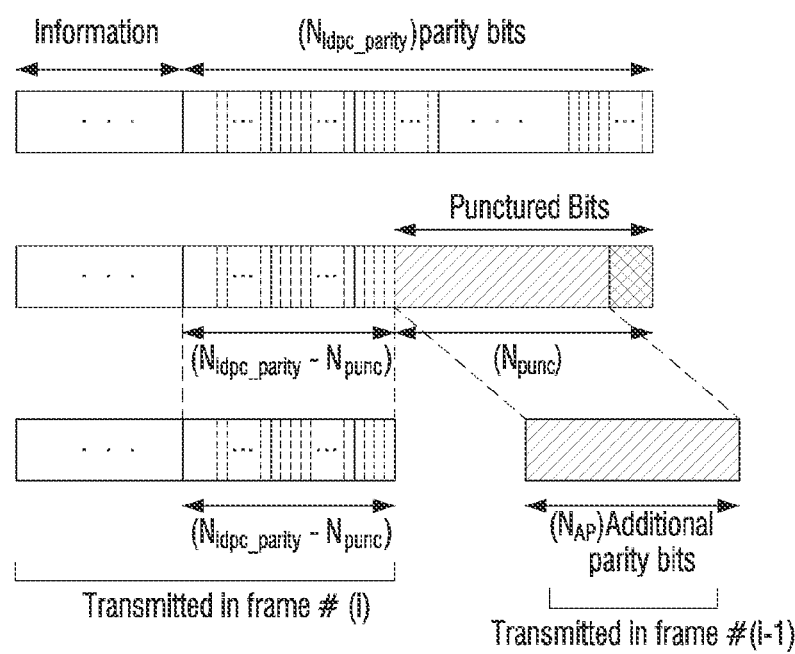
FIGS. 5 and 6 are diagrams for describing methods for generating additional parity bits, according to an exemplary embodiment.
Figure 6:
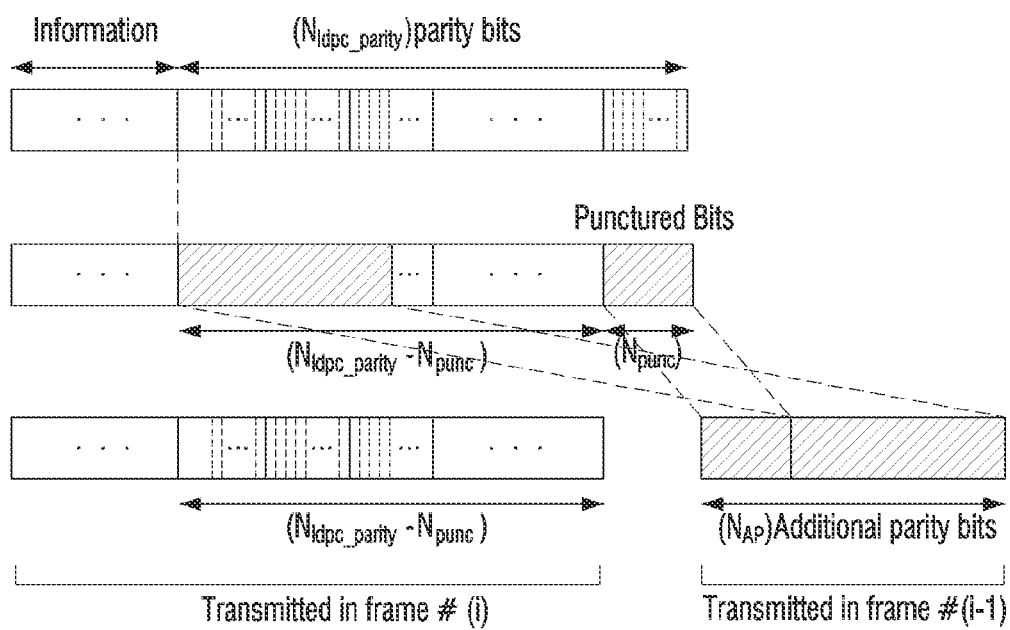

FIGS. 5 and 6 are diagrams for describing the method for generating additional parity bits according to exemplary embodiments. In this case, the parity permutated LDPC codeword may be represented like $V=(v_0, v_1, \ldots, v_{N_{inner}-1})$.

The additional parity generator 140 may select bits as many as the number of calculated additional parity bits in the LDPC parity bits to generate the additional parity bits.

In detail, when the number of calculated additional parity bits is equal to or less than the number of punctured LDPC parity bits, the additional parity generator 140 may select bits as many as the calculated number from the first bit among the punctured LDPC parity bits to generate the additional parity bits.

That is, when $N_{AP}$ is equal to or less than $N_{punc}$, that is, $N_{AP} \leq N_{punc}$, the additional parity generator 140 may select $N_{AP}$ bits from the first bit among the punctured LDPC parity bits as illustrated in FIG. 5 to generate the additional parity bits.

Therefore, for the additional parity bits, the punctured LDPC parity bits ($v_{N_{inner}-N_{punc}}$, $v_{N_{inner}-N_{punc}+1}$, ..., $v_{N_{inner}-N_{punc}+N_{AP}-1}$) may be selected.

When the number of calculated additional parity bits is greater than the number of punctured LDPC parity bits, the additional parity generator 140 selects all of the punctured LDPC parity bits and selects bits corresponding to the number obtained by subtracting the number of the punctured LDPC parity bits from the number of the calculated additional parity bits from the first bit among the parity permutated LDPC parity bits to generate the additional parity bits.

That is, when the $N_{AP}$ is greater the $N_{punc}$, that is, $N_{AP} > N_{punc}$, the additional parity generator 140 may select all of the punctured LDPC parity bits as illustrated in FIG. 6.

Therefore, for the additional parity bits, all of the punctured LDPC parity bits ($v_{N_{inner}-N_{punc}}$, $v_{N_{inner}-N_{punc}+1}$, ..., $v_{N_{inner}-N_{punc}+N_{AP}-1}$) may be selected.

Further, the additional parity generator 140 may additionally select $N_{AP}-N_{punc}$ bits from the first bit among the parity permutated LDPC parity bits. In detail, the additional parity generator 140 may additionally select bits as many as the number obtained by subtracting the number of the punctured LDPC parity bits from the calculated number, that is, $N_{AP}-N_{punc}$ bits from the first bit among the parity permutated LDPC parity bits.

Therefore, for the additional parity bits, the LDPC parity bits ($v_{K_{ldpc}}$, $v_{K_{ldpc}+1}$, ..., $v_{K_{ldpc}+N_{AP}-N_{punc}-1}$) may be additionally selected.

As a result, for the additional parity bits, ($v_{N_{inner}-N_{punc}}$, $v_{N_{inner}-N_{punc}+1}$, ..., $v_{N_{inner}-N_{punc}+N_{AP}-1}$, $v_{K_{ldpc}}$, $v_{K_{ldpc}+1}$, ..., $v_{K_{ldpc}+N_{AP}-N_{punc}-1}$) may be selected.

As such, the additional parity generator 140 may select some of the punctured LDPC parity bits or all of the punctured LDPC parity bits to generate the additional parity bits.

The foregoing example describes that some of the LDPC parity bits are selected to generate the additional parity bits, which is only one example. The additional parity generator 140 may also select some of the LDPC codeword bits to generate the additional parity bits.

For example, when the number of calculated additional parity bits is equal to or less than the number of the punctured LDPC parity bits, the additional parity generator 140 may select bits as many as the calculated number from the first bit among the punctured LDPC parity bits to generate the additional parity bits.

When the number of calculated additional parity bits is greater than the number of the punctured LDPC parity bits, the additional parity generator 140 may select all of the punctured LDPC parity bits and select bits as many as the number obtained by subtracting the number of the punctured LDPC parity bits from the number of the calculated additional parity bits, from the LDPC codeword, to generate the additional parity bits. In this case, the additional parity generator 140 may select bits from the LDPC parity bits after puncturing and/or shortening, and/or the parity bits (or parity-check bits) generated by outer-encoding the information bits.

The transmitter 100 may transmit the additional parity bits and the punctured LDPC codeword to the receiver 200.

In detail, the transmitter 100 modulates the LDPC codeword bits except the padded zero bits in the LDPC codeword in which the LDPC parity bits are punctured (that is, the punctured LDPC codeword), that is, the punctured and shortened LDPC codeword bits by 64-QAM, maps the modulated bits to constellation symbols, map the symbols to a frame and transmit the mapped symbols to the receiver 200.

Further, the transmitter 100 may also modulate the additional parity bits by 64-QAM, map the modulated bits to constellation symbols, map the symbols to a frame and transmit the mapped symbols to the receiver 200.

In this case, the transmitter 100 may map the additional parity bits generated based on the information bits transmitted in a current frame to a frame before the current frame.

That is, the transmitter 100 may map the punctured and shortened LDPC codeword including information bits corresponding to an (i−1)-th frame to the (i−1)-th frame, and additionally map additional parity bits generated based on information bits corresponding to the i-th frame to the (i−1)-th frame and transmit the mapped bits to the receiver 200.

Therefore, the information bits corresponding to the (i−1)-th frame and the parity bits generated based on the information bits as well as the additional parity bits generated based on the information bits corresponding to the i-th frame may be mapped to the (i−1)-th frame.

As described above, since the information bits are signaling including signaling information for data, the transmitter 100 may map the data to a frame along with the signaling for processing the data and transmit the mapped data to the receiver 200.

In detail, the transmitter 100 may process the data in a specific scheme to generate the constellation symbols and map the generated constellation symbols to data symbols of each frame. Further, the transmitter 100 may map the signaling for the data mapped to each frame to a preamble of the frame. For example, the transmitter 100 may map the signaling including the signaling information for the data mapped to the i-th frame to the i-th frame.

As a result, the receiver 200 may use the signaling acquired from the frame to receive and process the data from a corresponding frame.

As described above, the group-wise interleaving pattern may include the first pattern and the second pattern.

In detail, since the B value of above Equation 12 represents the minimum value of the LDPC parity bits, the specific number of bits may be always punctured depending on the B value.

For example, in above Equation 12, since the B value is 4284 and a bit group is formed of 360 bits, even when the shortening length is 0, at least $$\left\lfloor \frac{4284}{360} \right\rfloor = 11$$

bit groups are always punctured.

In this case, since puncturing is performed from the last LDPC parity bit, a specific number of bit groups may be always punctured from the last bit group among a plurality of bit groups configuring group-wise interleaved LDPC parity bits.

In the foregoing example, the last 11 bit groups among 27 bit groups configuring the group-wise interleaved LDPC parity bits may be always punctured.

As a result, some of the group-wise interleaving patterns represent bit groups to be always punctured, and therefore, the group-wise interleaving pattern may be divided into two patterns. In detail, a pattern representing the remaining bit groups other than the bit groups to be always punctured in the group-wise interleaving pattern may be referred to as a first pattern and a pattern representing the bit groups to be always punctured may be referred to as a second pattern.

In the foregoing example, 11 bit groups from the last bit group among the group-wise interleaved bit groups are to be always punctured.

As a result, in the group-wise interleaving pattern defined as above Table 4, a pattern which randomly position the bit groups, which are positioned at 19-th, 20-th, 21-th, ..., 40-th, 43-th and 44-th positions before the group-wise interleaving, in a 18-th bit group to a 33-th bit group after the group-wise interleaving may be the first pattern, and a pattern representing indexes of the bit groups before the group-wise interleaving, which are positioned in the 34-th bit group to the 44-bit group, after the group-wise interleaving, that is, $Y_{34}=X_{\pi p(34)}=X_{25}$, $Y_{35}=X_{\pi p(35)}=X_{42}$, $Y_{36}=X_{\pi p(36)}=X_{34}$, ..., $Y_{42}=X_{\pi p(42)}=X_{28}$, $Y_{43}=X_{\pi p(43)}=X_{36}$, $Y_{44}=X_{\pi p(44)}=X_{41}$ may be the second pattern.

As described above, the second pattern defines bit groups to be always punctured in a current frame and the first pattern defines bit groups additionally to be punctured, and thus, the first pattern may be used to determine LDPC parity bits to be transmitted in the current frame after puncturing. Alternatively, when the number of additional parity bits to be transmitted in a previous frame is greater than the number of punctured bits, the first pattern may be used to determine the additional parity bits.

In detail, depending on the number of punctured LDPC parity bits, in addition to the LDPC parity bits to be always punctured, more LDPC parity bits may additionally be punctured.

For example, when the number of LDPC parity bits to be punctured is 7200, 20 bit groups need to be punctured, and thus, 9 bit groups need to be additionally punctured, in addition to 11 bit groups to be always punctured.

In this case, the 9 bit groups additionally to be punctured correspond to the bit groups positioned at 25-th to 33-th positions after the group-wise interleaving, and since these bit groups are determined depending on the first pattern, that is, belong to the first pattern, the first pattern may be used to determine the punctured bit groups. Alternatively, when the number of additional parity bits to be transmitted in a previous frame is greater than the number of punctured bits, the first pattern may be used to determine the additional parity.

That is, when the LDPC parity bits are punctured more than a minimum value of the LDPC parity bits to be punctured, which bit groups are additionally to be punctured is determined depending on which bit groups are positioned after the bit groups to be always punctured. As a result, based on the puncturing direction, the first pattern defining the bit groups positioned after the bit groups to be always punctured may be considered as determining the bit groups to be punctured.

In the foregoing example, when the number of LDPC parity bits to be punctured is 7200, in addition to the 11 bit groups to be always punctured, 9 bit groups, that is, the bit groups positioned at 33-th, 32-th, ..., 26-th and 25-th positions after the group-wise interleaving are additionally punctured. Here, the bit groups positioned at 25-th to 33-th positions after the group-wise interleaving are determined depending on the first pattern.

As a result, the first pattern may be considered as being used to determine the punctured bit groups. Further, the remaining LDPC parity bits other than the punctured LDPC parity bits are transmitted through the current frame, and therefore, the first pattern may be considered as being used to determine the bit groups transmitted in the current frame.

The second pattern may be used to determine the additional parity bits to be transmitted in the previous frame.

In detail, since the bit groups determined to be always punctured are always punctured, and then, are not transmitted in the current frame, these bit groups need to be positioned only where bits are always punctured after group-wise interleaving. Therefore, it is not important at which position of these bit groups are positioned after the group-wise interleaving.

In the foregoing example in reference to above Table 4, the bit groups positioned at 25-th, 42-th, 34-th, ..., 28-th, 36-th and 41-th positions before the group-wise interleaving need to be positioned in the positions of the 34-th bit group to the 44-th bit group after the group-wise interleaving. Therefore, it is not important at which positions these bit groups are positioned between the positions of the 34-th bit group to the 44-th bit group.

As such, the second pattern defining bit groups to be always punctured is used to identify bit groups to be punctured. Therefore, defining an order between the bit groups in the second pattern is meaningless in the puncturing, and thus, the second pattern defining bit groups to be always punctured may be considered as not being used for the puncturing.

However, for determining additional parity bits, positions of the bit groups to be always punctured within these bit groups are meaningful.

In detail, as described above, the additional parity bits are generated by being selected from the punctured LDPC parity bits.

In particular, when the number of additional parity bits to be generated is equal to or less than the number of punctured LDPC parity bits, LDPC parity bits as many as the number of additional parity bits to be generated are selected from the first LDPC parity bit among the punctured LDPC parity bits.

As a result, LDPC parity bits included in at least some of the bit groups to be always punctured may be selected as at least a part of the additional parity bits. That is, the LDPC parity bits included in at least some of the bit groups to be always punctured depending on the number of punctured LDPC parity bits and the number of additional parity bits to be generated may be selected as the additional parity bits.

In detail, if additional parity bits are selected from punctured LDPC parity bits over the number of bit groups defined by the first pattern, since bits are sequentially selected from a start portion of the second pattern, and therefore, an order of the bit groups belonging to the second pattern is meaningful in terms of the selection of the additional parity.

As a result, the second pattern defining the bit groups to be always punctured may be considered as being used to determine the additional parity bits, and the additional parity bits may be generated by selecting at least some of the bits included in the bit groups to be always punctured, depending on the order of the bit groups determined according to the second pattern.

In the foregoing example, the LDPC encoder 110 encodes LDPC information bits at a code rate of 6/15 to generate an LDPC codeword having a length of 16200 including 9720 LDPC parity bits.

In this case, the second pattern may be used to generate additional parity bits depending on whether a value obtained by subtracting the number of LDPC parity bits to be punctured from the number of all LDPC parity bits and adding the number of additional parity bits to be generated thereto exceeds 5760. Here, 5760 is the number of LDPC parity bits except the bit groups always to be punctured among a plurality of bit groups configuring the LDPC parity bits. That is, 5760=(27−11)×360.

In detail, when the value obtained by subtracting the number of LDPC parity bits to be punctured from all of the LDPC parity bits and adding the number of additional parity bits to be generated thereto is equal to or less than 5760, that is, $9720-N_{punc}+N_{AP} \leq 5760$, additional parity bits may be generated based on the first pattern.

However, when the value obtained by subtracting the number of LDPC parity bits to be punctured from all of the LDPC parity bits and adding the number of additional parity bits to be generated thereto exceeds 5760, that is, $9720-N_{punc}+N_{AP} > 5760$, additional parity bits may be generated based on the first pattern and the second pattern.

In detail, when $9720-N_{punc}+N_{AP} > 5760$, for additional parity bits, LDPC parity bits included in a bit group positioned at a 33-th position from the first LDPC parity bit among the punctured LDPC parity bits may be selected and the LDPC parity bits included in a bit group positioned at a specific position from a 34-th position may be selected.

Here, the bit group to which the first LDPC parity bit among the punctured LDPC parity bits belongs and the bit group (that is, when being sequentially selected from the first LDPC parity bit among the punctured LDPC parity bits, a bit group to which the finally selected LDPC parity bits belong) at the specific position may be determined depending on the number of punctured LDPC parity bits and the number of additional parity bits to be generated.

In this case, the bit group positioned at the 33-th position from the first LDPC parity bit among the punctured LDPC parity bits is determined depending on the first pattern, and the bit group positioned at the specific position from the 34-th position is determined depending on the second pattern.

As a result, the additional parity bits to be generated are determined depending on the first pattern and the second pattern.

As such, the first pattern may be used to determine additional parity bits to be generated as well as LDPC parity bits to be punctured, but the second pattern may be used to determine the additional parity bits to be generated.

Therefore, according to various exemplary embodiments, the group-wise interleaving pattern is defined as shown in above Table 4, and thus, bit groups positioned at specific positions before the group-wise interleaving may be selected as the additional parity bits.

The reason why the permutation order for the group-wise interleaving according to the exemplary embodiment is defined like Table 4 will be described below.

Figure 7:
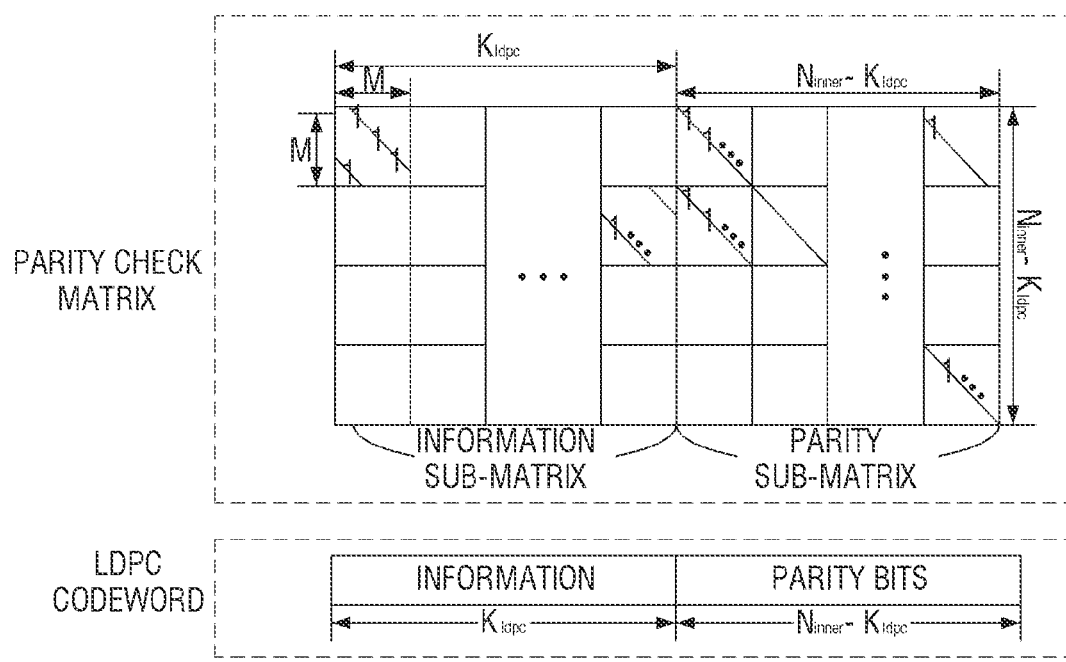
FIG. 7 is a diagram illustrating a parity check matrix having a quasi cyclic structure, according to an exemplary embodiment.

A parity check matrix (for example, FIG. 3) of an LDPC code having a code rate of 6/15 may be converted into a parity check matrix having a quasi cyclic structure formed of blocks having a size of 360×360 (that is, a size of M×M) as illustrated in FIG. 7 by performing a column permutation process and an appropriate row permutation process corresponding to the parity interleaving process. Here, the column permutation process and the row permutation process do not change algebraic characteristics of the LDPC code, and therefore, have been widely used to theoretically analyze the LDPC code.

The parity portion of an LDPC code having the code rate of 6/15 is formed of parity bits the degree of which is 2. In this case, it may be understood that puncturing the parity bits having the degree of 2 merges two rows connected to element 1 which is present in columns corresponding to these bits. This is because the parity node having the degree of 2 transfers only a simple message if the parity node receives no information from the channel. Meanwhile, upon the merging, for each column in a row newly made by merging two rows, when 1 is present in existing two rows, the element is replaced by 0, and when 1 is present only in one of the two rows, the element is replaced by 1.

When some of the parity bits of an LDPC codeword are punctured, the number of parity bits to which the puncturing is applied may be changed depending on the shortening length and a preset A value (that is, a ratio of the number of shortened bits and the number of punctured bits) and B value (that is, the number of punctured bits even if the number of shortened bits is 0). Here, when the B value is greater than 0, the parity bits to be always punctured are present independent of the shortening length. In particular, since continuous 360 bits form one bit group, when the B value is equal to or greater than 360, a bit group to be always punctured is present independent of the shortening length.

When an LDPC code having a code rate of 6/15 and the 64-QAM modulation scheme are used, the B value may be 4284. In this case, at least 11 bit groups to be always punctured are present independent of the shortening length (for example, 18, 23, 25, 28, 30, 32, 34, 36, 38, 41 and 42-th bit groups).

In this case, since 11 bit groups are always punctured independent of the shortening length, the order of these bit groups does not affect the overall system performance at all when the additional parity transmitted in the previous frame is not used. However, in the case of using the additional parity, which of the 11 bit groups is relatively earlier transmitted affects the overall system performance. When the additional parity is transmitted using the second pattern in the group-wise interleaving pattern, which of the 11 bit groups is relatively earlier transmitted may be determined. Therefore, the second pattern needs to be designed well in consideration of transmission efficiency maximization of the control information (that is, information bits).

Hereinafter, a process of designing the second pattern in the group-wise interleaving pattern for generation of the additional parity will be described by an example.

A process of encoding, by the LDPC encoder 110, 6480 input bits, that is, LDPC information bits at the code rate of 6/15 to generate 9720 LDPC parity bits and inducing the group-wise interleaving pattern for the generation of the additional parity in the case in which an LDPC codeword generated by LDPC encoding is modulated by 64-QAM and then is transmitted to the receiver 200 is as follows.

According to an exemplary embodiment, the second pattern in the group-wise interleaving pattern for determining the order of the additional parity transmission is determined under an assumption that a K value used to calculate the length of the additional parity is 1. If it is assumed that K=1, when the length of the information input as the input of an LDPC code (here, the length of the information input as the input of the LDPC code is a sum value of the number of information bits and the number of BCH parity-check bits generated by performing BCH encoding on information bits) is equal to or less than 2880 bits (=8 bit groups), since the length of all parities of an LDPC codeword transmitted including the additional parities does not exceed 5760 (=16 bit groups), the parity bits of the LDPC codeword transmitted using the first pattern in the group-wise interleaving pattern may be determined.

However, when the length of the information input as the input of the LDPC code is 3240 (=9 bit groups), the length of all parities of the LDPC codeword transmitted including the additional parities is calculated as 6126 bits, which corresponds to about 17 bit groups. Therefore, 9 column groups are removed depending on the shortening order predefined in all the parity check matrices of the LDPC code having the code rate of 6/15 and one non-punctured bit group is selected so that the row degree of the matrix output at the time of merging row blocks connected to the remaining bit groups other than one of the 11 bit groups (for example, 18, 23, 25, 28, 30, 32, 34, 36, 38, 41 and 42-th bit groups) always punctured independent of the shortening length is uniform as maximum as possible. If the number of cases selecting one parity bit group to make the row degree of the matrix maximally uniform is plural, the cyclic characteristics and the algebraic characteristics of the parity check matrix in which column deletion, row merging, and row deletion are performed in these cases need to be additionally considered. For example, since a short cycle connected to a column having a relatively low column degree adversely affects the performance of the LDPC code, a case in which the number of cycles in which a length connected to a column having a degree of 4 or less is equal to or less than 6 is smallest may be selected. If the number of cases in which the number of cycles is smallest is plural, a case in which the real frame error rate (FER) performance is most excellent among the cases is selected. For example, a 25-th bit group may be selected.

In some cases, when too many number of selections are generated depending on the cyclic characteristics, a theoretical prediction value for a minimum signal-to-noise (SNR) at which ensembles of an LDPC code having a distribution of the same 1 after the column deletion, the row merging, and the row deletion for each case may perform error free communication is derived by a density evolution analysis, and the FER performance is verified by a computation experiment by appropriately adjusting the number of selection based on the minimum SNR values theoretically predicted.

In the next step, one of 9 column groups removed in the first step among the information portions of the parity check matrix is recovered depending on a preset order. In this case, the length of all parities of the LDPC code transmitted including the additional parity is calculated as 6714 bits, which corresponds to about 18.7 bit groups. Therefore, two of 10 bit groups of which the order is not yet determined need to be selected as the bit groups some or all of which are not to be punctured. In this case, likewise the first step, two bit groups are selected in consideration of the row degree distribution of the parity check matrix after the deletion of the column group and the merging of the row group and the cyclic distribution connected to the column having a low degree. For example, a 42-th bit group and a 34-th bit group may be selected.

In a similar scheme thereto, the order of the parity bit groups which are not punctured until all column groups corresponding to the information portions are recovered or all column groups corresponding to the parity portion are selected is determined. For example, the permutation order corresponding to the second pattern determined by the foregoing method may be $\pi_p(34)=25$, $\pi_p(35)=42$, $\pi_p(36)=34$, $\pi_p(37)=18$, $\pi_p(38)=32$, $\pi_p(39)=38$, $\pi_p(40)=23$, $\pi_p(41)=30$, $\pi_p(42)=28$, $\pi_p(43)=36$, and $\pi_p(44)=41$.

As a result, when the group-wise interleaving is performed using the group-wise interleaving pattern as shown in above Table 4, the additional parity may be transmitted to the receiver 200 in a specific order and thus the control information transmission efficiency may be maximized.

The bit groups positioned at 19-th, 20-th, 21-th, . . . , 40-th, 43-th and 44-th positions before the group-wise interleaving in above Table 4 are randomly group-wise interleaved at a 18-th position to a 33-th position. However, these bit groups may also be group-wise interleaved at the specific position in consideration of the puncturing order. The detailed content thereof will be described below.

Meanwhile, according to an exemplary embodiment, the foregoing information bits may be implemented by L1-detail signaling. Therefore, the transmitter 100 may generate additional parity bits for the L1-detail signaling by using the foregoing method and transmit the generated bits to the receiver 200.

Here, the L1-detail signaling may be signaling defined in an Advanced Television System Committee (ATSC) 3.0 standard.

In detail, The L1-detail signaling may be processed according to seven (7) different modes. The transmitter 100 according to the exemplary embodiment may generate additional parity bits according to the foregoing method when an L1-detail mode 5 among the seven modes processes the L1-detail signaling.

The ATSC 3.0 standard defines L1-basic signaling besides the L1-detail signaling. The transmitter 100 may process the L1-basic signaling and the L1-detail signaling by using a specific scheme, and transmit the processed L1-basic signaling and the L1-detail signaling to the receiver 200. In this case, the L1-basic signaling may also be processed according to seven different modes.

A method for processing the L1-basic signaling and the L1-detail signaling will be described below.

The transmitter 100 may map the L1-basic signaling and the L1-detail signaling to a preamble of a frame and map data to data symbols of the frame for transmission to the receiver 200.

Figure 8:
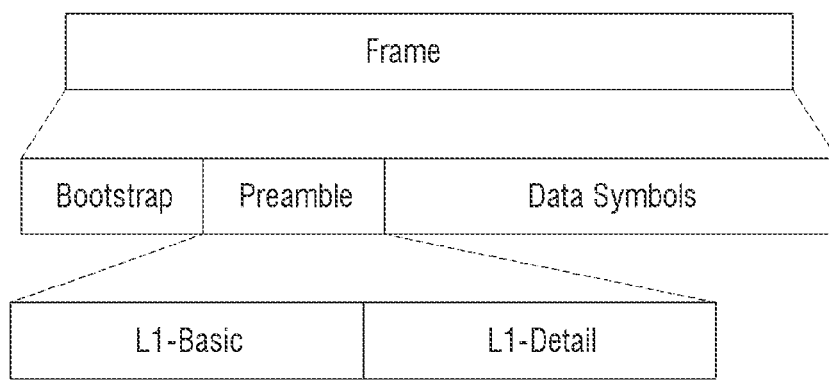
FIG. 8 is a diagram for describing a frame structure, according to an exemplary embodiment.

Referring to FIG. 8, the frame may be configured of three parts, that is, a bootstrap part, a preamble part, and a data part.

The bootstrap part is used for initial synchronization and provides a basic parameter required for the receiver 200 to decode the L1 signaling. Further, the bootstrap part may include information about a mode of processing the L1-basic signaling at the transmitter 100, that is, information about a mode the transmitter 100 uses to process the L1-basic signaling.

The preamble part includes the L1 signaling, and may be configured of two parts, that is, the L1-basic signaling and the L1-detail signaling.

Here, the L1-basic signaling may include information about the L1-detail signaling, and the L1-detail signaling may include information about data. Here, the data is broadcasting data for providing broadcasting services and may be transmitted through at least one physical layer pipes (PLPs).

In detail, the L1-basic signaling includes information required for the receiver 200 to process the L1-detail signaling. This information includes, for example, information about a mode of processing the L1-detail signaling at the transmitter 100, that is, information about a mode the transmitter 100 uses to process the L1-detail signaling, information about a length of the L1-detail signaling, information about an additional parity mode, that is, information about a K value used for the transmitter 100 to generate additional parity bits using an L1B_L1_Detail_additional_parity_mode (here, when the L1B_L1_Detail_additional_parity_mode is set as '00', K=0 and the additional parity bits are not used), and information about a length of total cells. Further, the L1-basic signaling may include basic signaling information about a system including the transmitter 100 such as a fast Fourier transform (FFT) size, a guard interval, and a pilot pattern.

Further, the L1-detail signaling includes information required for the receiver 200 to decode the PLPs, for example, start positions of cells mapped to data symbols for each PLP, PLP identifier (ID), a size of the PLP, a modulation scheme, a code rate, etc.

Therefore, the receiver 200 may acquire frame synchronization, acquire the L1-basic signaling and the L1-detail signaling from the preamble, and receive service data required by a user from data symbols using the L1-detail signaling.

The method for processing the L1-basic signaling and the L1-detail signaling will be described below in more detail with reference to the accompanying drawings.

Figure 9:
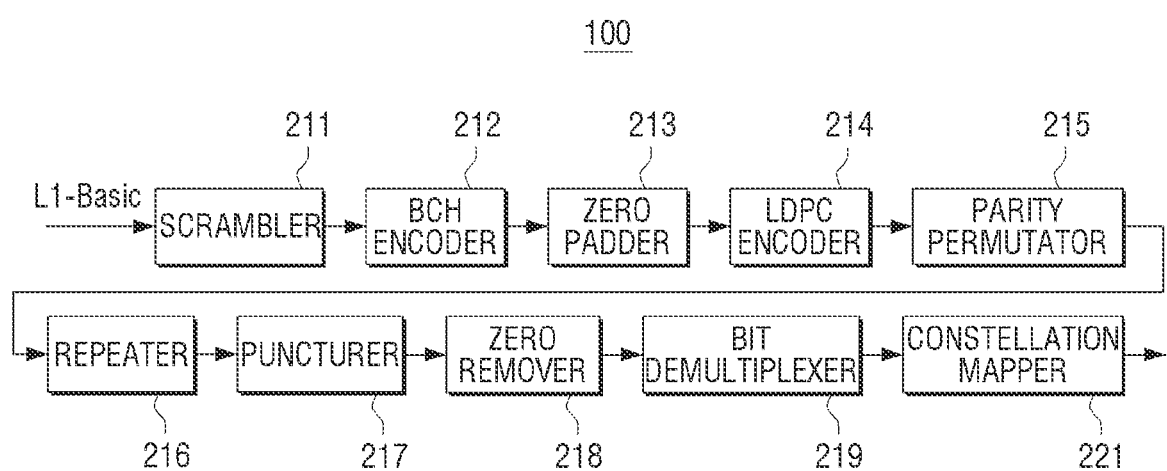

FIGS. 9 and 10 are block diagrams for describing detailed configurations of the transmitter 100, according to exemplary embodiments.

In detail, as illustrated in FIG. 9, to process the L1-basic signaling, the transmitter 100 may include a scrambler 211, a BCH encoder 212, a zero padder 213, an LDPC encoder 214, a parity permutator 215, a repeater 216, a puncturer 217, a zero remover 219, a bit demultiplexer 219, and a constellation mapper 221.

Further, as illustrated in FIG. 10, to process the L1-detail signaling, the transmitter 100 may include a segmenter 311, a scrambler 312, a BCH encoder 313, a zero padder 314, an LDPC encoder 315, a parity permutator 316, a repeater 317, a puncturer 318, an additional parity generator 319, a zero remover 321, bit demultiplexers 322 and 323, and constellation mappers 324 and 325.

Here, the components illustrated in FIGS. 9 and 10 are components for performing encoding and modulation on the L1-basic signaling and the L1-detail signaling, which is only one example. According to another exemplary embodiments, some of the components illustrated in FIGS. 9 and 10 may be omitted or changed, and other components may also be added. Further, positions of some of the components may be changed. For example, the positions of the repeaters 216 and 317 may be disposed after the puncturers 217 and 318, respectively.

The LDPC encoder 315, the repeater 317, the puncturer 318, and the additional parity generator 319 illustrated in FIG. 10 may perform the operations performed by the LDPC encoder 110, the repeater 120, the puncturer 130, and the additional parity generator 140 illustrated in FIG. 1, respectively.

In describing FIGS. 9 and 10, for convenience, components for performing common functions will be described together.

The L1-basic signaling and the L1-detail signaling may be protected by concatenation of a BCH outer code and an LDPC inner code. However, this is only one example. Therefore, as outer encoding performed before inner encoding in the concatenated coding, another encoding such as CRC encoding in addition to the BCH encoding may be used. Further, the L1-basic signaling and the L1-detail signaling may be protected only by the LDPC inner code without the outer code.

First, the L1-basic signaling and the L1-detail signaling may be scrambled. Further, the L1-basic signaling and the L1-detail signaling are BCH encoded, and thus, BCH parity check bits of the L1-basic signaling and the L1-detail signaling generated from the BCH encoding may be added to the L1-basic signaling and the L1-detail signaling, respectively. Further, the concatenated signaling and the BCH parity check bits may be additionally protected by a shortened and punctured 16K LDPC code.

To provide various robustness levels appropriate for a wide signal to noise ratio (SNR) range, a protection level of the L1-basic signaling and the L1-detail signaling may be divided into seven (7) modes. That is, the protection level of the L1-basic signaling and the L1-detail signaling may be divided into the seven modes based on an LDPC code, a modulation order, shortening/puncturing parameters (that is, a ratio of the number of bits to be punctured to the number of bits to be shortened), and the number of bits to be basically punctured (that is, the number of bits to be basically punctured when the number of bits to be shortened is 0). In each mode, at least one different combination of the LDPC code, the modulation order, the constellation, and the shortening/puncturing pattern may be used.

A mode for the transmitter 100 to processes the signaling may be set in advance depending on a system. Therefore, the transmitter 100 may determine parameters (for example, modulation and code rate (ModCod) for each mode, parameter for the BCH encoding, parameter for the zero padding, shortening pattern, code rate/code length of the LDPC code, group-wise interleaving pattern, parameter for repetition, parameter for puncturing, and modulation scheme, etc.) for processing the signaling depending on the set mode, and may process the signaling based on the determined parameters and transmit the processed signaling to the receiver 200. For this purpose, the transmitter 100 may pre-store the parameters for processing the signaling depending on the mode.

Modulation and code rate configurations (ModCod configurations) for the seven modes for processing the L1-basic signaling and the seven modes for processing the L1-detail signaling are shown in following Table 5. The transmitter 100 may encode and modulate the signaling based on the ModCod configurations defined in following Table 5 according to a corresponding mode. That is, the transmitter 100 may determine an encoding and modulation scheme for the signaling in each mode based on following Table 5, and may encode and modulate the signaling according to the determined scheme. In this case, even when modulating the L1 signaling by the same modulation scheme, the transmitter 100 may also use different constellations.

TABLE 5

| Signaling | FEC Type | $K_{sig}$ | Code Length | Code Rate | Constellation |
|---|---|---|---|---|---|
| L1-Basic | Mode 1 | 200 | 16200 | 3/15 | QPSK |
|  | Mode 2 |  |  | (Type A) | QPSK |
|  | Mode 3 |  |  |  | QPSK |
|  | Mode 4 |  |  |  | NUC_16-QAM |
|  | Mode 5 |  |  |  | NUC_64-QAM |
|  | Mode 6 |  |  |  | NUC_256-QAM |
|  | Mode 7 |  |  |  | NUC_256-QAM |
| L1-Detail | Mode 1 | 400~2352 |  |  | QPSK |
|  | Mode 2 | 400~3072 |  |  | QPSK |
|  | Mode 3 | 400~6312 |  | 6/15 | QPSK |
|  | Mode 4 |  |  | (Type B) | NUC_16-QAM |
|  | Mode 5 |  |  |  | NUC_64-QAM |
|  | Mode 6 |  |  |  | NUC_256-QAM |
|  | Mode 7 |  |  |  | NUC_256-QAM |

In above Table 5, $K_{sig}$ represents the number of information bits for a coded block. That is, since the L1 signaling bits having a length of $K_{sig}$ are encoded to generate the coded block, a length of the L1 signaling in one coded block becomes $K_{sig}$. Therefore, the L1 signaling bits having the size of $K_{sig}$ may be considered as corresponding to one LDPC coded block.

Referring to above Table 5, the $K_{sig}$ value for the L1-basic signaling is fixed to 200. However, since the amount of L1-detail signaling bits varies, the $K_{sig}$ value for the L1-detail signaling varies.

In detail, in a case of the L1-detail signaling, the number of L1-detail signaling bits varies, and thus, when the number of L1-detail signaling bits is greater than a preset value, the L1-detail signaling may be segmented to have a length which is equal to or less than the preset value.

In this case, each size of the segmented L1-detail signaling blocks (that is, segment of the L1-detail signaling) may have the $K_{sig}$ value defined in above Table 5. Further, each of the segmented L1-detail signaling blocks having the size of $K_{sig}$ may correspond to one LDPC coded block.

However, when the number of L1-detail signaling bits is equal to or less than the preset value, the L1-detail signaling is not segmented. In this case, the size of the L1-detail signaling may have the $K_{sig}$ value defined in above Table 5. Further, the L1-detail signaling having the size of $K_{sig}$ may correspond to one LDPC coded block.

Hereinafter, a method for segmenting L1-detail signaling will be described in detail.

The segmenter 311 segments the L1-detail signaling. In detail, since the length of the L1-detail signaling varies, when the length of the L1-detail signaling is greater than the preset value, the segmenter 311 may segment the L1-detail signaling to have the number of bits which are equal to or less than the preset value and output each of the segmented L1-detail signalings to the scrambler 312.

However, when the length of the L1-detail signaling is equal to or less than the preset value, the segmenter 311 does not perform a separate segmentation operation.

A method for segmenting, by the segmenter 311, the L1-detail signaling is as follows.

The amount of L1-detail signaling bits varies and mainly depends on the number of PLPs. Therefore, to transmit all bits of the L1-detail signaling, at least one forward error correction (FEC) frame is required. Here, an FEC frame may represent a form in which the L1-detail signaling is encoded, and thus, parity bits according to the encoding are added to the L1-detail signaling.

In detail, when the L1-detail signaling is not segmented, the L1-detail signaling is BCH-encoded and LDPC encoded to generate one FEC frame, and therefore, one FEC frame is required for the L1-detail signaling transmission. However, when the L1-detail signaling is segmented into at least two, these segmented L1-detail signalings each are BCH—encoded and LDPC-encoded to generate at least two FEC frames, and therefore, at least two FEC frames are required for the L1-detail signaling transmission.

Therefore, the segmenter 311 may calculate the number $N_{L1D\_FECFRAME}$ of FEC frames for the L1-detail signaling based on following Equation 17. That is, the number $N_{L1D\_FECFRAME}$ of FEC frames for the L1-detail signaling may be determined based on following Equation 17.

$$N_{L1D\_FECFRAME} = \left\lceil \frac{K_{L1D\_ex\_pad}}{K_{seg}} \right\rceil \quad (17)$$

In above Equation 17, $\lceil x \rceil$ represents a minimum integer which is equal to or greater than x.

Figure 11:
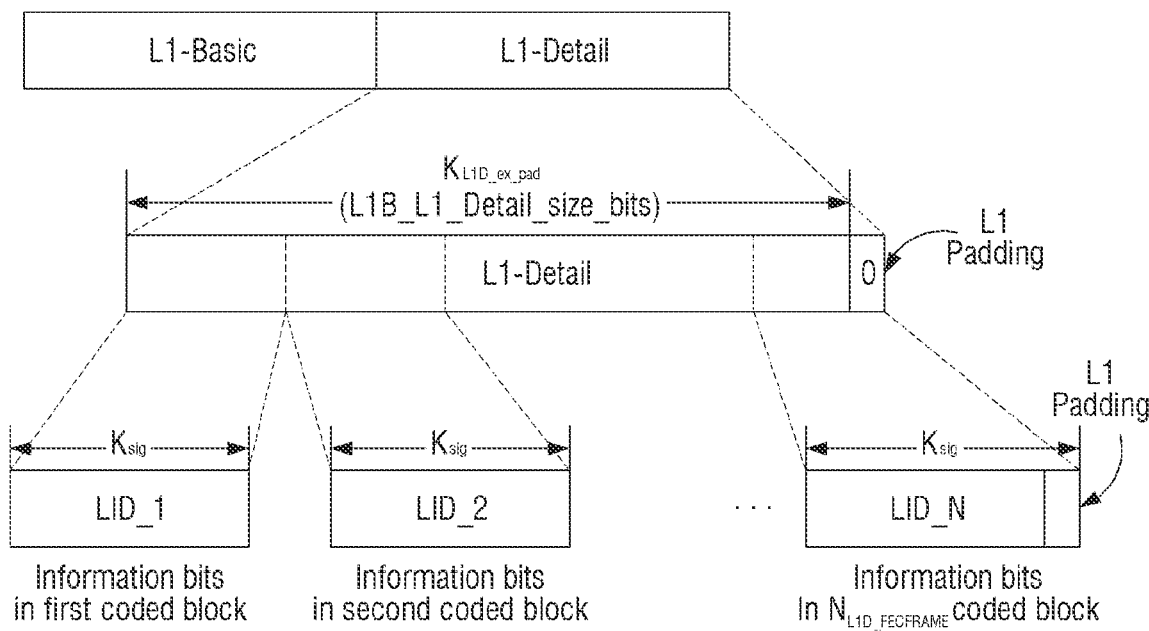
FIGS. 11 to 24 are diagrams for describing methods for processing signaling according to exemplary embodiments.

Further, in above Equation 17, $K_{L1D\_ex\_pad}$ represents the length of the L1-detail signaling except L1 padding bits as illustrated in FIG. 11, and may be determined by a value of an L1B_L1_Detail_size_bits field included in the L1-basic signaling.

Further, $K_{seg}$ represents a threshold number for segmentation defined based on the number $K_{ldpc}$ of information bits input to the LDPC encoder 315, that is, the LDPC information bits. Further, $K_{seg}$ may be defined based on the number of BCH parity check bits of BCH encoding and a multiple value of 360.

$K_{seg}$ is determined such that, after the L1-detail signaling is segmented, the number $K_{sig}$ of information bits in the coded block is set to be equal to or less than $K_{ldpc}-M_{outer}$. In detail, when the L1-detail signaling is segmented based on $K_{seg}$, since the length of segmented L1-detail signaling does not exceed $K_{seg}$, the length of the segmented L1-detail signaling is set to be equal to or less than $K_{ldpc}-M_{outer}$ when $K_{seg}$ is set like in Table 6 as following.

Here, $M_{outer}$ and $K_{ldpc}$ are as following Tables 7 and 8. For sufficient robustness, the $K_{seg}$ value for the L1-detail signaling mode 1 may be set to be $K_{ldpc}-M_{outer}-720$.

$K_{seg}$ for each mode of the L1-detail signaling may be defined as following Table 6. In this case, the segmenter 311 may determine $K_{seg}$ according to a corresponding mode as shown in following Table 6.

TABLE 6

| L1-Detail | $K_{sig}$ |
|---|---|
| Mode 1 | 2352 |
| Mode 2 | 3072 |
| Mode 3 | 6312 |
| Mode 4 | |
| Mode 5 | |
| Mode 6 | |
| Mode 7 | |

As illustrated in FIG. 11, an entire L1-detail signaling may be formed of L1-detail signaling and L1 padding bits.

In this case, the segmenter 311 may calculate a length of an L1 PADDING field for the L1-detail signaling, that is, the number$_{L1D\_PAD}$ of the L1 padding bits based on following Equation 18.

However, calculating $K_{L1D\_PAD}$ based on following Equation 18 is only one example. That is, the segmenter 311 may calculate the length of the L1 PADDING field for the L1-detail signaling, that is, the number $K_{L1D\_PAD}$ of the L1 padding bits based on $K_{L1D\_ex\_pad}$ and $N_{L1D\_FECFRAME}$ values. As one example, the $K_{L1D\_PAD}$ value may be obtained based on following Equation 18. That is, following Equation 18 is only one example of a method for obtaining a $K_{L1D\_PAD}$ value, and thus, another method based on the $K_{L1D\_ex\_pad}$ and $N_{L1D\_FECFRAME}$ values may be applied to obtain an equivalent result.

$$K_{L1D\_PAD} = \left\lceil \frac{K_{L1D\_ex\_pad}}{N_{L1D\_FECFRAME} \times 8} \right\rceil \times 8 \times N_{L1D\_FECFRAME} - K_{L1D\_ex\_pad} \quad (18)$$

Further, the segmenter 311 may fill the L1_PADDING field with $K_{L1D\_PAD}$ zero bits (that is, bits having a 0 value). Therefore, as illustrated in FIG. 11, the $K_{L1D\_PAD}$ zero bits may be filled in the L1_PADDING field.

As such, by calculating the length of the L1 PADDING field and padding zero bits of the calculated length to the L1_PADDING field, the L1-detail signaling may be segmented into the plurality of blocks formed of the same number of bits when the L1-detail signaling is segmented.

Next, the segmenter 311 may calculate a final length $K_{L1D}$ of the entire L1-detail signaling including the zero padding bits based on following Equation 19.

$$K_{L1D} = K_{L1D\_ex\_pad} + K_{L1D\_PAD} \quad (19)$$

Further, the segmenter 311 may calculate the number $K_{sig}$ of information bits in each of the $N_{L1D\_FECFRAME}$ blocks based on following Equation 20.

$$K_{sig} = \frac{K_{L1D}}{N_{L1D\_FECFRAME}} \quad (20)$$

Next, the segmenter 311 may segment the L1-detail signaling by $K_{sig}$ number of bits.

In detail, as illustrated in FIG. 11, when $N_{L1D\_FECFRAME}$ is greater than 1, the segmenter 311 may segment the L1-detail signaling by the number of $K_{sig}$ bits to segment the L1-detail signaling into the $N_{L1D\_FECFRAME}$ blocks.

Therefore, the L1-detail signaling may be segmented into $N_{L1D\_FECFRAME}$ blocks, and the number of L1-detail signaling bits in each of the $N_{L1D\_FECFRAME}$ blocks may be $K_{sig}$. Further, each segmented L1-detail signaling is encoded. As an encoded result, a coded block, that is, an FEC frame is formed, such that the number of L1-detail signaling bits in each of the $N_{L1D\_FECFRAME}$ coded blocks may be $K_{sig}$.

However, when the L1-detail signaling is not segmented, $K_{sig} = K_{L1D\_ex\_pad}$.

The segmented L1-detail signaling blocks may be encoded by a following procedure.

In detail, all bits of each of the L1-detail signaling blocks having the size $K_{sig}$ may be scrambled. Next, each of the scrambled L1-detail signaling blocks may be encoded by concatenation of the BCH outer code and the LDPC inner code.

In detail, each of the L1-detail signaling blocks is BCH-encoded, and thus, $M_{outer}$ (=168) BCH parity check bits may be added to $K_{sig}$ L1-detail signaling bits of each block, and then, the concatenation of the L1-detail signaling bits and the BCH parity check bits of each block may be encoded by a shortened and punctured 16K LDPC code. The details of the BCH code and the LDPC code will be described below. However, the exemplary embodiments describe only a case in which $M_{outer}$=168, but it is apparent that $M_{outer}$ may be changed into an appropriate value depending on the requirements of a system.

The scramblers 211 and 312 scramble the L1-basic signaling and the L1-detail signaling, respectively. In detail, the scramblers 211 and 312 may randomize the L1-basic signaling and the L1-detail signaling, and output the randomized L1-basic signaling and L1-detail signaling to the BCH encoders 212 and 313, respectively.

In this case, the scramblers 211 and 312 may scramble the information bits by a unit of $K_{sig}$.

That is, since the number of L1-basic signaling bits transmitted to the receiver 200 through each frame is 200, the scrambler 211 may scramble the L1-basic signaling bits by $K_{sig}$ (=200).

Since the number of L1-basic signaling bits transmitted to the receiver 200 through each frame varies, in some cases, the L1-detail signaling may be segmented by the segmenter 311. Further, the segmenter 311 may output the L1-detail signaling formed of $K_{sig}$ bits or the segmented L1-detail signaling blocks to the scrambler 312. As a result, the scrambler 312 may scramble the L1-detail signaling bits by every $K_{sig}$ which are output from the segmenter 311.

The BCH encoders 212 and 313 perform the BCH encoding on the L1-basic signaling and the L1-detail signaling to generate the BCH parity check bits.

In detail, the BCH encoders 212 and 313 may perform the BCH encoding on the L1-basic signaling and the L1-detail signaling output from the scramblers 211 and 313, respectively, to generate the BCH parity check bits, and output the BCH-encoded bits in which the BCH parity check bits are added to each of the L1-basic signaling and the L1-detail signaling to the zero padders 213 and 314, respectively.

For example, the BCH encoders 212 and 313 may perform the BCH encoding on input $K_{sig}$ bits to generate $M_{outer}$ (that is, $K_{sig}=K_{payload}$) BCH parity check bits and output the BCH-encoded bits formed of $N_{outer}$ $K_{sig}+M_{outer}$) bits to the zero padders 213 and 314, respectively.

The parameters for the BCH encoding may be defined as following Table 7.

TABLE 7

| Signaling FEC Type | | $K_{sig} =$ $K_{payload}$ | $M_{outer}$ | $N_{outer} =$ $K_{sig} + M_{outer}$ |
|---|---|---|---|---|
| L1-Basic | Mode 1 | 200 | 168 | 368 |
| | Mode 2 | | | |
| | Mode 3 | | | |
| | Mode 4 | | | |
| | Mode 5 | | | |
| | Mode 6 | | | |
| | Mode 7 | | | |
| L1-Detail | Mode 1 | 400~2352 | | 568~2520 |
| | Mode 2 | 400~3072 | | 568~3240 |
| | Mode 3 | 400~6312 | | 568~6480 |
| | Mode 4 | | | |
| | Mode 5 | | | |
| | Mode 6 | | | |
| | Mode 7 | | | |

Meanwhile, referring to FIGS. 9 and 10, it may be appreciated that the LDPC encoders 214 and 315 may be disposed after the BCH encoders 212 and 313, respectively.

Therefore, the L1-basic signaling and the L1-detail signaling may be protected by the concatenation of the BCH outer code and the LDPC inner code.

In detail, the L1-basic signaling and the L1-detail signaling are BCH-encoded, and thus, the BCH parity check bits for the L1-basic signaling are added to the L1-basic signaling and the BCH parity check bits for the L1-detail signaling are added to the L1-detail signaling. Further, the concatenated L1-basic signaling and BCH parity check bits are additionally protected by an LDPC code, and the concatenated L1-detail signaling and BCH parity check bits may be additionally protected by an LDPC code.

Here, it is assumed that an LDPC code for LDPC encoding is a 16K LDPC code, and thus, in the BCH encoders 212 and 213, a systematic BCH code for $N_{inner}$=16200 (that is, the code length of the 16K LDPC code is 16200 and an LDPC codeword generated by the LDPC encoding may be formed of 16200 bits) may be used to perform outer encoding of the L1-basic signaling and the L1-detail signaling.

The zero padders 213 and 314 pad zero bits. In detail, for the LDPC code, a predetermined number of LDPC information bits defined according to a code rate and a code length is required, and thus, the zero padders 213 and 314 may pad zero bits for the LDPC encoding to generate the predetermined number of LDPC information bits formed of the BCH-encoded bits and zero bits, and output the generated bits to the LDPC encoders 214 and 315, respectively, when the number of BCH-encoded bits is less than the number of LDPC information bits. When the number of BCH-encoded bits is equal to the number of LDPC information bits, zero bits are not padded.

Here, zero bits padded by the zero padders 213 and 314 are padded for the LDPC encoding, and therefore, the padded zero bits padded are not transmitted to the receiver 200 by a shortening operation.

For example, when the number of LDPC information bits of the 16K LDPC code is $K_{ldpc}$, in order to form $K_{ldpc}$ LDPC information bits, zero bits are padded to some of the LDPC information bits.

In detail, when the number of BCH-encoded bits is $N_{outer}$, the number of LDPC information bits of the 16K LDPC code is $K_{ldpc}$, and $N_{outer} < K_{ldpc}$, the zero padders 213 and 314 may pad $K_{ldpc} - N_{outer}$ zero bits to some of the LDPC information bits, and use the $N_{outer}$ BCH-encoded bits as the remaining portion of the LDPC information bits to generate the LDPC information bits formed of $K_{ldpc}$ bits. However, when $N_{outer} = K_{ldpc}$, zero bits are not padded.

For this purpose, the zero padders 213 and 314 may divide the LDPC information bits into a plurality of bit groups.

For example, the zero padders 213 and 314 may divide $K_{ldpc}$ LDPC information bits $(i_0, i_1, \ldots, i_{K_{ldpc}-1})$ into $N_{info\_group}(=K_{ldpc}/360)$ bit groups based on following Equation 21 or 22. That is, the zero padders 213 and 314 may divide the LDPC information bits into the plurality of bit groups so that the number of bits included in each bit group is 360.

$$Z_j = \left\{ i_k \mid j = \left\lfloor \frac{k}{360} \right\rfloor, 0 \le k < k_{ldpc} \right\} \text{ for } 0 \le j < N_{info\_group} \quad (21)$$

$$Z_j = \{ i_k \mid 360 \times j \le k < 360 \times (j+1) \} \text{ for } 0 \le j < N_{info\_group} \quad (22)$$

In above Equations 21 and 22, $Z_j$ represents a j-th bit group.

The parameters $N_{outer}$, $K_{ldpc}$ and $N_{info\_group}$ for the zero padding for the L1-basic signaling and the L1-detail signaling may be defined as shown in following Table 8. In this case, the zero padders 213 and 314 may determine parameters for the zero padding according to a corresponding mode as shown in following Table 8.

TABLE 8

| Signaling FEC Type | $N_{outer}$ | $K_{idpc}$ | $N_{info\_group}$ |
|---|---|---|---|
| L1-Basic (all modes) | 368 | 3240 | 9 |
| L1-Detail Mode 1 | 368~2520 | | |
| L1-Detail Mode 2 | 368~3240 | | |
| L1-Detail Mode 3 | 368~6480 | 6480 | 18 |
| L1-Detail Mode 4 | | | |
| L1-Detail Mode 5 | | | |
| L1-Detail Mode 6 | | | |

Figure 12:
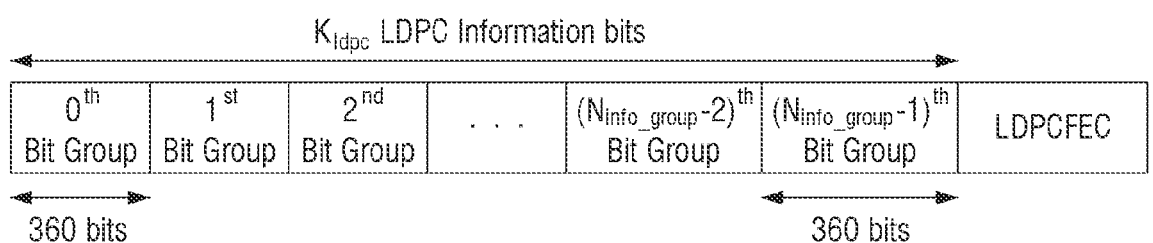

Further, for $0 \le j < N_{info\_group}$, each bit group $Z_j$ as shown in FIG. 12 may be formed of 360 bits.

In detail, FIG. 12 illustrates a data format after the L1-basic signaling and the L1-detail signaling each are LDPC-encoded. In FIG. 12, an LDPC FEC added to $K_{ldpc}$ LDPC information bits represents the LDPC parity bits generated by the LDPC encoding.

Referring to FIG. 12, the $K_{ldpc}$ LDPC information bits are divided into the $N_{info\_group}$ bits groups and each bit group may be formed of 360 bits.

When the number $N_{outer}(=K_{sig}+M_{outer})$ of BCH-encoded bits for the L1-basic signaling and the L1-detail signaling is less than the $K_{ldpc}$, that is, $N_{outer}(=K_{sig}+M_{outer}) < K_{ldpc}$, for the LDPC encoding, $K_{ldpc}$ LDPC information bits may be filled with the $N_{outer}$ BCH-encoded bits and $K_{ldpc} - N_{outer}$ zero-padded bits. In this case, the padded zero bits are not transmitted to the receiver 200.

Hereinafter, a shortening procedure performed by the zero padders 213 and 314 will be described in more detail.

The zero padders 213 and 314 may calculate the number of padded zero bits. That is, to fit the number of bits required for the LDPC encoding, the zero padders 213 and 314 may calculate the number of zero bits to be padded.

In detail, the zero padders 213 and 314 may calculate a difference between the number of LDPC information bits and the number of BCH-encoded bits as the number of padded zero bits. That is, for a given $N_{outer}$, the zero padders 213 and 314 may calculate the number of padded zero bits as $K_{ldpc} - N_{outer}$.

Further, the zero padders 213 and 314 may calculate the number of bit groups in which all the bits are padded. That is, the zero padders 213 and 314 may calculate the number of bit groups in which all bits within the bit group are padded by zero bits.

In detail, the zero padders 213 and 314 may calculate the number $N_{pad}$ of groups to which all bits are to be padded based on following Equation 23 or 24.

$$N_{pad} = \left\lfloor \frac{K_{ldpc} - N_{outer}}{360} \right\rfloor \quad (23)$$

$$N_{pad} = \left\lfloor \frac{(K_{ldpc} - M_{outer}) - K_{sig}}{360} \right\rfloor \quad (24)$$

Next, the zero padders 213 and 314 may determine bit groups in which zero bits are padded among a plurality of bit groups based on a shortening pattern, and may pad zero bits to all bits within some of the determined bit groups and some bits within the remaining bit groups.

In this case, the shortening pattern of the padded bit group may be defined as shown in following Table 9. In this case, the zero padders 213 and 314 may determine the shortening patterns according to a corresponding mode as shown in following Table 9.

TABLE 9

| | | $\pi_s(j)$ $(0 \le j < N_{info\_group})$ | | | | | | | | |
|---|---|---|---|---|---|---|---|---|---|---|
| Signaling FEC Type | $N_{info\_group}$ | $\pi_s(0)$ $\pi_s(9)$ | $\pi_s(1)$ $\pi_s(10)$ | $\pi_s(2)$ $\pi_s(11)$ | $\pi_s(3)$ $\pi_s(12)$ | $\pi_s(4)$ $\pi_s(13)$ | $\pi_s(5)$ $\pi_s(14)$ | $\pi_s(6)$ $\pi_s(15)$ | $\pi_s(7)$ $\pi_s(16)$ | $\pi_s(8)$ $\pi_s(17)$ |
| L1-Basic (for all modes) | 9 | 4 — | 1 — | 5 — | 2 — | 8 — | 6 — | 0 — | 7 — | 3 — |
| L1-Detail | | 7 | 8 | 5 | 4 | 1 | 2 | 6 | 3 | 0 |

TABLE 9-continued

| Signaling FEC Type | $N_{info\_group}$ | $\pi_s(0)$ $\pi_s(9)$ | $\pi_s(1)$ $\pi_s(10)$ | $\pi_s(2)$ $\pi_s(11)$ | $\pi_s(3)$ $\pi_s(12)$ | $\pi_s(4)$ $\pi_s(13)$ | $\pi_s(5)$ $\pi_s(14)$ | $\pi_s(6)$ $\pi_s(15)$ | $\pi_s(7)$ $\pi_s(16)$ | $\pi_s(8)$ $\pi_s(17)$ |
|---|---|---|---|---|---|---|---|---|---|---|
| Mode 1 | | — | — | — | — | — | — | — | — | — |
| L1-Detail | | 6 | 1 | 7 | 8 | 0 | 2 | 4 | 3 | 5 |
| Mode 2 | | — | — | — | — | — | — | — | — | — |
| L1-Detail | 18 | 0 | 12 | 15 | 13 | 2 | 5 | 7 | 9 | 8 |
| Mode 3 | | 6 | 16 | 10 | 14 | 1 | 17 | 11 | 4 | 3 |
| L1-Detail | | 0 | 15 | 5 | 16 | 17 | 1 | 6 | 13 | 11 |
| Mode 4 | | 4 | 7 | 12 | 8 | 14 | 2 | 3 | 9 | 10 |
| L1-Detail | | 2 | 4 | 5 | 17 | 9 | 7 | 1 | 6 | 15 |
| Mode 5 | | 8 | 10 | 14 | 16 | 0 | 11 | 13 | 12 | 3 |
| L1-Detail | | 0 | 15 | 5 | 16 | 17 | 1 | 6 | 13 | 11 |
| Mode 6 | | 4 | 7 | 12 | 8 | 14 | 2 | 3 | 9 | 10 |
| L1-Detail | | 15 | 7 | 8 | 11 | 5 | 10 | 16 | 4 | 12 |
| Mode 7 | | 3 | 0 | 6 | 9 | 1 | 14 | 17 | 2 | 13 |

Here, $\pi_s(j)$ is an index of a j-th padded bit group. That is, the $\pi_s(j)$ represents a shortening pattern order of the j-th bit group. Further, $N_{info\_group}$ is the number of bit groups configuring the LDPC information bits.

In detail, the zero padders 213 and 314 may determine $Z_{\pi_s(0)}, Z_{\pi_s(1)}, \ldots Z_{\pi_s(N_{pad}-1)}$ as bit groups in which all bits within the bit group are padded by zero bits based on the shortening pattern, and pad zero bits to all bits of the bit groups. That is, the zero padders 213 and 314 may pad zero bits to all bits of a $\pi_s(0)$-th bit group, a $\pi_s(1)$-th bit group, . . . , a $\pi_s(N_{pad}-1)$-th bit group among the plurality of bit groups based on the shortening pattern.

As such, when $N_{pad}$ is not 0, the zero padders 213 and 314 may determine a list of the $N_{pad}$ bit groups, that is, $Z_{\pi_s(0)}, Z_{\pi_s(1)}, \ldots, Z_{\pi_s(N_{pad}-1)}$ based on above Table 9, and pad zero bits to all bits within the determined bit group.

However, when the $N_{pad}$ is 0, the foregoing procedure may be omitted.

Since the number of all the padded zero bits is $K_{ldpc}-N_{outer}$ and the number of zero bits padded to the $N_{pad}$ bit groups is $360 \times N_{pad}$, the zero padders 213 and 314 may additionally pad zero bits to $K_{ldpc}-N_{outer}-360 \times N_{pad}$ LDPC information bits.

In this case, the zero padders 213 and 314 may determine a bit group to which zero bits are additionally padded based on the shortening pattern, and may additionally pad zero bits from a beginning portion of the determined bit group.

In detail, the zero padders 213 and 314 may determine $Z_{\pi_s(N_{pad})}$ as a bit group to which zero bits are additionally padded based on the shortening pattern, and may additionally pad zero bits to the $K_{ldpc}-N_{outer}-360 \times N_{pad}$ bits positioned at the beginning portion of $Z_{\pi_s(N_{pad})}$. Therefore, the $K_{ldpc}-N_{outer}-360 \times N_{pad}$ zero bits may be padded from a first bit of the $\pi_s(N_{pad})$-th bit group.

As a result, for $Z_{\pi_s(N_{pad})}$, zero bits may be additionally padded to the $K_{ldpc}-N_{bch}-360 \times N_{pad}$ bits positioned at the beginning portion of $Z_{\pi_s(N_{pad})}$.

The foregoing example describes that $K_{ldpc}-N_{outer}-360 \times N_{pad}$ zero bits are padded from a first bit of the $Z_{\pi_s(N_{pad})}$, which is only one example. Therefore, the position at which zero bits are padded in the $Z_{\pi_s(N_{pad})}$ may be changed. For example, the $K_{ldpc}-N_{outer}-360 \times N_{pad}$ zero bits may be padded to a middle portion or a last portion of the $Z_{\pi_s(N_{pad})}$ or may also be padded at any position of the $Z_{\pi_s(N_{pad})}$.

Next, the zero padders 213 and 314 may map the BCH-encoded bits to the positions at which zero bits are not padded among the LDPC information bits to finally configure the LDPC information bits.

Therefore, $N_{outer}$ BCH-encoded bits are sequentially mapped to the bit positions at which zero bits are not padded in the $K_{ldpc}$ LDPC information bits $(i_0, i_1, \ldots, i_{K_{ldpc}-1})$, and thus, $K_{ldpc}$ LDPC information bits may be formed of $N_{outer}$ BCH-encoded bits and $K_{ldpc}-N_{outer}$ bits.

The padded zero bits are not transmitted to the receiver 200. As such, a procedure of padding the zero bits or a procedure of padding the zero bits and then not transmitting the padded zero bits to the receiver 200 may be called shortening.

The LDPC encoders 214 and 315 perform LDPC encoding on the L1-basic signaling and the L1-detail signaling, respectively.

In detail, the LDPC encoders 214 and 315 may perform LDPC encoding on the LDPC information bits output from the zero padders 213 and 31 to generate LDPC parity bits, and output an LDPC codeword including the LDPC information bits and the LDPC parity bits to the parity permutators 215 and 316, respectively.

That is, $K_{ldpc}$ bits output from the zero padder 213 may include $K_{sig}$ L1-basic signaling bits, $M_{outer}(=N_{outer}-K_{sig})$ BCH parity check bits, and $K_{ldpc}-N_{outer}$ padded zero bits, which may configure $K_{ldpc}$ LDPC information bits $i=(i_0, i_1, \ldots, i_{K_{ldpc}-1})$ for the LDPC encoder 214.

Further, the $K_{ldpc}$ bits output from the zero padder 314 may include the $K_{sig}$ L1-detail signaling bits, the $M_{outer}(=N_{outer}-K_{sig})$ BCH parity check bits, and the $(K_{ldpc}-N_{outer})$ padded zero bits, which may configure the $K_{ldpc}$ LDPC information bits $i=(i_0, i_1, \ldots, i_{K_{ldpc}-1})$ for the LDPC encoder 315.

In this case, the LDPC encoders 214 and 315 may systematically perform the LDPC encoding on the $K_{ldpc}$ LDPC information bits to generate an LDPC codeword $\Lambda=(c_0, c_1, \ldots, c_{N_{inner}-1})=(i_0, i_1, \ldots, i_{K_{ldpc}-1}, p_0, p_1, \ldots, p_{N_{inner}-K_{ldpc}-1})$ formed of $N_{inner}$ bits.

In the L1-basic modes and the L1-detail modes 1 and 2, the LDPC encoders 214 and 315 may encode the L1-basic signaling and the L1-detail signaling at a code rate of 3/15 to generate 16200 LDPC codeword bits. In this case, the LDPC encoders 214 and 315 may perform the LDPC encoding based on above Table 1.

Further, in the L1-detail modes 3, 4, 5 6, and 7, the LDPC encoder 315 may encode the L1-detail signaling at a code rate of 6/15 to generate the 16200 LDPC codeword bits. In this case, the LDPC encoder 315 may perform the LDPC encoding based on above Table 3.

The code rate and the code length for the L1-basic signaling and the L1-detail signaling are as shown in above Table 5, and the number of LDPC information bits are as shown in above Table 8.

The parity permutators 215 and 316 perform parity permutation. That is, the parity permutators 215 and 316 may perform permutation only on the LDPC parity bits among the LDPC information bits and the LDPC parity bits.

In detail, the parity permutators 215 and 316 may perform the permutation only on the LDPC parity bits in the LDPC codewords output from the LDPC encoders 214 and 315, and output the parity permutated LDPC codewords to the repeaters 216 and 317, respectively. The parity permutator 316 may output the parity permutated LDPC codeword to an additional parity generator 319. In this case, the additional parity generator 319 may use the parity permutated LDPC codeword output from the parity permutator 316 to generate additional parity bits.

For this purpose, the parity permutators 215 and 316 may include a parity interleaver (not illustrated) and a group-wise interleaver (not illustrated).

First, the parity interleaver may interleave only the LDPC parity bits among the LDPC information bits and the LDPC parity bits configuring the LDPC codeword. However, the parity interleaver may perform the parity interleaving only in the cases of the L1-detail modes 3, 4, 5, 6 and 7. That is, since the L1-basic modes and the L1-detail modes 1 and 2 include the parity interleaving as a portion of the LDPC encoding process, in the L1-basic modes and the L1-detail modes 1 and 2, the parity interleaver may not perform the parity interleaving.

In the mode of performing the parity interleaving, the parity interleaver may interleave the LDPC parity bits based on following Equation 25.

$u_i = c_i$ for $0 \le i < K_{ldpc}$ (information bits are not interleaved.)

$$u_{K_{ldpc}+360t+s} = c_{K_{ldpc}+27s+t} \text{ for } 0 \le s < 360, 0 \le t < 27 \quad (25)$$

In detail, based on above Equation 25, the LDPC codeword $(c_0, c_1, \ldots, c_{N_{inner}-1})$ is parity-interleaved by the parity interleaver and an output of the parity interleaver may be represented by $U = (u_0, u_1, \ldots, u_{N_{inner}-1})$.

Since the L1-basic modes and the L1-detail modes 1 and 2 do not use the parity interleaver, an output $U = (u_0, u_1, \ldots, u_{N_{inner}-1})$ of the parity interleaver may be represented as following Equation 26.

$$u_i = c_i \text{ for } 0 \le i < N_{inner} \quad (26)$$

The group-wise interleaver may perform the group-wise interleaving on the output of the parity interleaver.

Here, as described above, the output of the parity interleaver may be an LDPC codeword parity-interleaved by the parity interleaver or may be an LDPC codeword which is not parity-interleaved by the parity interleaver.

Therefore, when the parity interleaving is performed, the group-wise interleaver may perform the group-wise interleaving on the parity interleaved LDPC codeword, and when the parity interleaving is not performed, the group-wise interleaver may perform the group-wise interleaving on the LDPC codeword which is not parity-interleaved.

In detail, the group-wise interleaver may interleave the output of the parity interleaver in a bit group unit.

For this purpose, the group-wise interleaver may divide an LDPC codeword output from the parity interleaver into a plurality of bit groups. As a result, the LDPC parity bits output from the parity interleaver may be divided into a plurality of bit groups.

In detail, the group-wise interleaver may divide the LDPC-encoded bits $(u_0, u_1, \ldots, u_{N_{inner}-1})$ output from the parity interleaver into $N_{group} (= N_{inner}/360)$ bit groups based on following Equation 27.

$$X_j = \{u_k | 360 \times j \le k < 360 \times (j+1), 0 \le k < N_{inner}\} \text{ for } 0 \le j < N_{group} \quad (27)$$

In above Equation 27, $X_j$ represents a j-th bit group.

Figure 13:
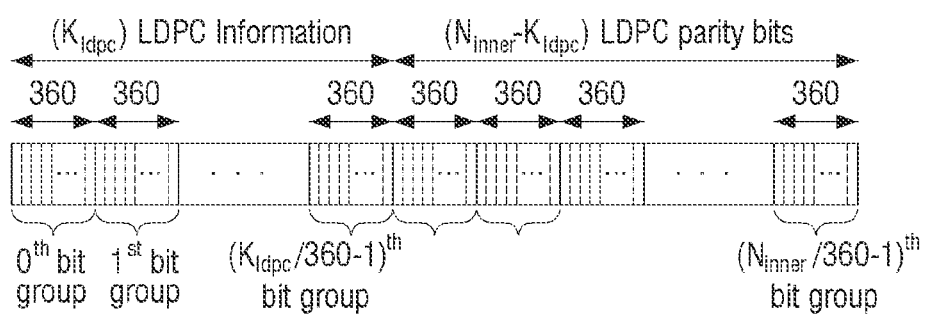

FIG. 13 illustrates an example of dividing the LDPC codeword output from the parity interleaver into a plurality of bit groups.

Referring to FIG. 13, the LDPC codeword is divided into $N_{group} (= N_{inner}/360)$ bit groups, and each bit group $X_j$ for $0 \le j < N_{group}$ is formed of 360 bits.

As a result, the LDPC information bits formed of $K_{ldpc}$ bits may be divided into $K_{ldpc}/360$ bit groups and the LDPC parity bits formed of $N_{inner} - K_{ldpc}$ bits may be divided into $N_{inner} - K_{ldpc}/360$ bit groups.

Further, the group-wise interleaver performs the group-wise interleaving on the LDPC codeword output from the parity interleaver.

In this case, the group-wise interleaver does not perform interleaving on the LDPC information bits, and may perform the interleaving only on the LDPC parity bits to change the order of the plurality of bit groups configuring the LDPC parity bits.

As a result, the LDPC information bits among the LDPC bits may not be interleaved by the group-wise interleaver but the LDPC parity bits among the LDPC bits may be interleaved by the group-wise interleaver. In this case, the LDPC parity bits may be interleaved in a group unit.

In detail, the group-wise interleaver may perform the group-wise interleaving on the LDPC codeword output from the parity interleaver based on following Equation 28.

$Y_i = X_j, 0 \le j < K_{ldpc}/360$ $$Y_i = X_{\pi_p(j)}, K_{ldpc}/360 \le j < N_{group} \quad (28)$$

Here, $X_j$ represents a j-th bit group among the plurality of bit groups configuring the LDPC codeword, that is, the j-th bit group prior to the group-wise interleaving, and $Y_j$ represents a group-wise interleaved j-th bit group. Further, $\pi_p(j)$ represents a permutation order for the group-wise interleaving.

The permutation order may be defined based on following Table 10 and Table 11. Here, Table 10 shows a group-wise interleaving pattern of a parity portion in the L1-basic modes and the L1-detail modes 1 and 2, and Table 11 shows a group-wise interleaving pattern of a parity portion for the L1-detail modes 3, 4, 5, 6 and 7.

In this case, the group-wise interleaver may determine the group-wise interleaving pattern according to a corresponding mode shown in following Tables 10 and 11.

TABLE 10

| Signaling FEC Type | $N_{group}$ | Order of group-wise interleaving $\pi_p(j)$ ($9 \le j < 45$) | | | | | | | | | | |
|---|---|---|---|---|---|---|---|---|---|---|---|---|
| | | $\pi_p(9)$ $\pi_p(21)$ $\pi_p(33)$ | $\pi_p(10)$ $\pi_p(22)$ $\pi_p(34)$ | $\pi_p(11)$ $\pi_p(23)$ $\pi_p(35)$ | $\pi_p(12)$ $\pi_p(24)$ $\pi_p(36)$ | $\pi_p(13)$ $\pi_p(25)$ $\pi_p(37)$ | $\pi_p(14)$ $\pi_p(26)$ $\pi_p(38)$ | $\pi_p(15)$ $\pi_p(27)$ $\pi_p(39)$ | $\pi_p(16)$ $\pi_p(28)$ $\pi_p(40)$ | $\pi_p(17)$ $\pi_p(29)$ $\pi_p(41)$ | $\pi_p(18)$ $\pi_p(30)$ $\pi_p(42)$ | $\pi_p(19)$ $\pi_p(31)$ $\pi_p(43)$ | $\pi_p(20)$ $\pi_p(32)$ $\pi_p(44)$ |
| L1-Basic (all modes) | 45 | 20 14 | 23 15 | 25 26 | 32 40 | 38 33 | 41 19 | 18 28 | 9 34 | 10 16 | 11 39 | 31 37 | 24 30 |

TABLE 10-continued

Order of group-wise interleaving
π_p(j) (9 ≤ j < 45)

| Signaling FEC Type | $N_{group}$ | $\pi_p(9)$ $\pi_p(10)$ $\pi_p(11)$ $\pi_p(12)$ $\pi_p(13)$ $\pi_p(14)$ $\pi_p(15)$ $\pi_p(16)$ $\pi_p(17)$ $\pi_p(18)$ $\pi_p(19)$ $\pi_p(20)$<br>$\pi_p(21)$ $\pi_p(22)$ $\pi_p(23)$ $\pi_p(24)$ $\pi_p(25)$ $\pi_p(26)$ $\pi_p(27)$ $\pi_p(28)$ $\pi_p(29)$ $\pi_p(30)$ $\pi_p(31)$ $\pi_p(32)$<br>$\pi_p(33)$ $\pi_p(34)$ $\pi_p(35)$ $\pi_p(36)$ $\pi_p(37)$ $\pi_p(38)$ $\pi_p(39)$ $\pi_p(40)$ $\pi_p(41)$ $\pi_p(42)$ $\pi_p(43)$ $\pi_p(44)$ |
|---|---|---|
| L1-Detail Mode 1 | | 21  44  43  35  42  36  12  13  29  22  37  17<br>16  22  27  30  37  44  20  23  25  32  38  41<br>9  10  17  18  21  33  35  14  28  12  15  19 |
| L1-Detail Mode 2 | 15 | 11  24  29  34  36  13  40  43  31  26  39  42<br>9  31  23  10  11  25  43  29  36  16  27  34<br>26  18  37  15  13  17  35  21  20  24  44  12<br>22  40  19  32  38  41  30  33  14  28  39  42 |

TABLE 11

Order of group-wise interleaving
π_p(j) (18 ≤ j < 45)

| Signaling FEC Type | $N_{group}$ | $\pi_p(18)$ | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ |
|---|---|---|---|---|---|---|---|---|---|---|---|---|---|---|---|
| | | $\pi_p(32)$ | $\pi_p(33)$ | $\pi_p(34)$ | $\pi_p(35)$ | $\pi_p(36)$ | $\pi_p(37)$ | $\pi_p(38)$ | $\pi_p(39)$ | $\pi_p(40)$ | $\pi_p(41)$ | $\pi_p(42)$ | $\pi_p(43)$ | $\pi_p(44)$ | |
| L1-Detail Mode 3 | 45 | 19 | 37 | 30 | 42 | 23 | 44 | 27 | 40 | 21 | 34 | 25 | 32 | 29 | 24 |
| | | 26 | 35 | 39 | 20 | 18 | 43 | 31 | 36 | 38 | 22 | 33 | 28 | 41 | |
| L1-Detail Mode 4 | | 20 | 35 | 42 | 39 | 26 | 23 | 30 | 18 | 28 | 37 | 32 | 27 | 44 | 43 |
| | | 41 | 40 | 38 | 36 | 34 | 33 | 31 | 29 | 25 | 24 | 22 | 21 | 19 | |
| L1-Detail Mode 5 | | 19 | 37 | 33 | 26 | 40 | 43 | 22 | 29 | 24 | 35 | 44 | 31 | 27 | 20 |
| | | 21 | 39 | 25 | 42 | 34 | 18 | 32 | 38 | 23 | 30 | 28 | 36 | 41 | |
| L1-Detail Mode 6 | | 20 | 35 | 42 | 39 | 26 | 23 | 30 | 18 | 28 | 37 | 32 | 27 | 44 | 43 |
| | | 41 | 40 | 38 | 36 | 34 | 33 | 31 | 29 | 25 | 24 | 22 | 21 | 19 | |
| L1-Detail Mode 7 | | 44 | 23 | 29 | 33 | 24 | 28 | 21 | 27 | 42 | 18 | 22 | 31 | 32 | 37 |
| | | 43 | 30 | 25 | 35 | 20 | 34 | 39 | 36 | 19 | 41 | 40 | 26 | 38 | |

Hereinafter, for the group-wise interleaving pattern in the L1-detail mode 2 as an example, an operation of the group-wise interleaver will be described.

In the L1-detail mode 2, the LDPC encoder 315 performs LDPC encoding on 3240 LDPC information bits at a code rate of 3/15 to generate 12960 LDPC parity bits. In this case, an LDPC codeword may be formed of 16200 bits.

Each bit group is formed of 360 bits, and as a result the LDPC codeword formed of 16200 bits is divided into 45 bit groups.

Here, since the number of the LDPC information bits is 3240 and the number of the LDPC parity bits is 12960, a 0-th bit group to an 8-th bit group correspond to the LDPC information bits and a 9-th bit group to a 44-th bit group correspond to the LDPC parity bits.

In this case, the group-wise interleaver does not perform interleaving on the bit groups configuring the LDPC information bits, that is, a 0-th bit group to a 8-th bit group based on above Equation 28 and Table 10, but may interleave the bit groups configuring the LDPC parity bits, that is, a 9-th bit group to a 44-th bit group in a group unit to change an order of the 9-th bit group to the 44-th bit group.

In detail, in the L1-detail mode 2 in above Table 10, above Equation 28 may be represented like $Y_0=X_0$, $Y_1=X_1$, ..., $Y_7=X_7$, $Y_8=X_8$, $Y_9=X_{\pi p(9)}=X_9$, $Y_{10}=X_{\pi p(10)}=X_{31}$, $Y_{11}=X_{\pi p(11)}=X_{23}$, ..., $Y_{42}=X_{\pi p(42)}=X_{28}$, $Y_{43}=X_{\pi p(43)}=X_{39}$, $Y_{44}=X_{\pi p(44)}=X_{42}$.

Therefore, the group-wise interleaver does not change an order of the 0-th bit group to the 8-th bit group including the LDPC information bits but may change an order of the 9-th bit group to the 44-th bit group including the LDPC parity bits.

In detail, the group-wise interleaver may change the order of the bit groups from the 9-th bit group to the 44-th bit group so that the 9-th bit group is positioned at the 9-th position, the 31-th bit group is positioned at the 10-th position, the 23-th bit group is positioned at the 11-th position, ..., the 28-th bit group is positioned at the 42-th position, the 39-th bit group is positioned at the 43-th position, the 42-th bit group is positioned at the 44-th position.

As described below, since the puncturers 217 and 318 perform puncturing from the last parity bit, the parity bit groups may be arranged in an inverse order of the puncturing pattern by the parity permutation. That is, the first bit group to be punctured is positioned at the last bit group.

The foregoing example describes that only the parity bits are interleaved, which is only one example. That is, the parity permutators 215 and 316 may also interleave the LDPC information bits. In this case, the parity permutators 215 and 316 may interleave the LDPC information bits with identity and output the LDPC information bits having the same order before the interleaving so that the order of the LDPC information bits is not changed.

The repeaters 216 and 317 may repeat at least some bits of the parity permutated LDPC codeword at a position subsequent to the LDPC information bits, and output the repeated LDPC codeword, that is, the LDPC codeword bits including the repetition bits, to the puncturers 217 and 318. The repeater 317 may also output the repeated LDPC codeword to the additional parity generator 319. In this case, the additional parity generator 319 may use the repeated LDPC codeword to generate the additional parity bits.

In detail, the repeaters 216 and 317 may repeat a predetermined number of LDPC parity bits after the LDPC information bits. That is, the repeaters 216 and 317 may add the predetermined number of repeated LDPC parity bits after the LDPC information bits. Therefore, the repeated LDPC parity bits are positioned between the LDPC information bits and the LDPC parity bits within the LDPC codeword.

Therefore, since the predetermined number of bits within the LDPC codeword after the repetition may be repeated and additionally transmitted to the receiver 200, the foregoing operation may be referred to as repetition.

The term "adding" represents disposing the repetition bits between the LDPC information bits and the LDPC parity bits so that the bits are repeated.

The repetition may be performed only on the L1-basic mode 1 and the L1-detail mode 1, and may not be performed on the other modes. In this case, the repeaters 216 and 317 do not perform the repetition and may output the parity permutated LDPC codeword to the puncturers 217 and 318.

Hereinafter, a method for performing repetition will be described in more detail.

The repeaters 216 and 317 may calculate a number $N_{repeat}$ of bits additionally transmitted per an LDPC codeword based on following Equation 29.

$$N_{repeat} 2 \times \lfloor C \times N_{outer} \rfloor + D = 2 \quad (29)$$

In above Equation 29, C has a fixed number and D may be an even integer. Referring to above Equation 29, it may be appreciated that the number of bits to be repeated may be calculated by multiplying C by a given $N_{outer}$ and adding D thereto.

The parameters C and D for the repetition may be selected based on following Table 12. That is, the repeaters 216 and 317 may determine the C and D based on a corresponding mode as shown in following Table 12.

from the repeaters 216 and 317, and output a punctured LDPC codeword (that is, the remaining LDPC codeword bits other than the punctured bits and also referred to as an LDPC codeword after puncturing) to the zero removers 218 and 321. Further, the puncturer 318 may provide information (for example, the number and positions of punctured bits, etc.) about the punctured LDPC parity bits to the additional parity generator 319. In this case, the additional parity generator 319 may generate additional parity bits based thereon.

As a result, after going through the parity permutation, some LDPC parity bits may be punctured.

In this case, the punctured LDPC parity bits are not transmitted in a frame in which L1 signaling bits are transmitted. In detail, the punctured LDPC parity bits are not transmitted in a current frame in which the L1-signaling bits are transmitted, and in some cases, the punctured LDPC parity bits may be transmitted in a frame before the current frame, which will be described with reference to the additional parity generator 319.

For this purpose, the puncturers 217 and 318 may determine the number of LDPC parity bits to be punctured per LDPC codeword and a size of one coded block.

In detail, the puncturers 217 and 318 may calculate a temporary number $N_{punc\_temp}$ of LDPC parity bits to be punctured based on following Equation 30. That is, for a given $N_{outer}$, the puncturers 217 and 318 may calculate the temporary number $N_{punc\_temp}$ of LDPC parity bits to be punctured based on following Equation 30.

$$N_{punc\text{-}temp} = \lfloor A \times (K_{ldpc} - N_{outer}) \rfloor + B \quad (30)$$

Referring to above Equation 30, the temporary size of bits to be punctured may be calculated by adding a constant integer B to an integer obtained from a result of multiplying

TABLE 12

| | $N_{outer}$ | $K_{sig}$ | $K_{ldpc}$ | C | D | $N_{ldpc\_parity}$ (= $N_{inner}$ − $K_{ldpc}$) | $\eta_{MOD}$ |
|---|---|---|---|---|---|---|---|
| L1-Basic Mode 1 | 368 | 200 | 3240 | 0 | 3672 | 12960 | 2 |
| L1-Detail Mode 1 | 568~2520 | 400~2352 | 3240 | 61/16 | −508 | 12960 | 2 |

Further, the repeaters 216 and 317 may repeat $N_{repeat}$ LDPC parity bits.

Figure 14:
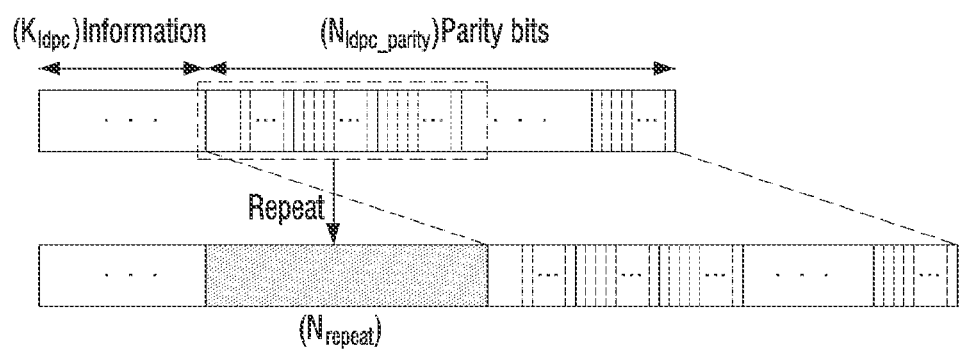

In detail, when $N_{repeat} \leq N_{ldpc\_parity}$, the repeaters 216 and 317 may add first $N_{repeat}$ bits of the parity permutated LDPC parity bits to the LDPC information bits as illustrated in FIG. 14. That is, the repeaters 216 and 317 may add a first LDPC parity bit among the parity permutated LDPC parity bits as an $N_{repeat}$-th LDPC parity bit after the LDPC information bits.

Figure 15:
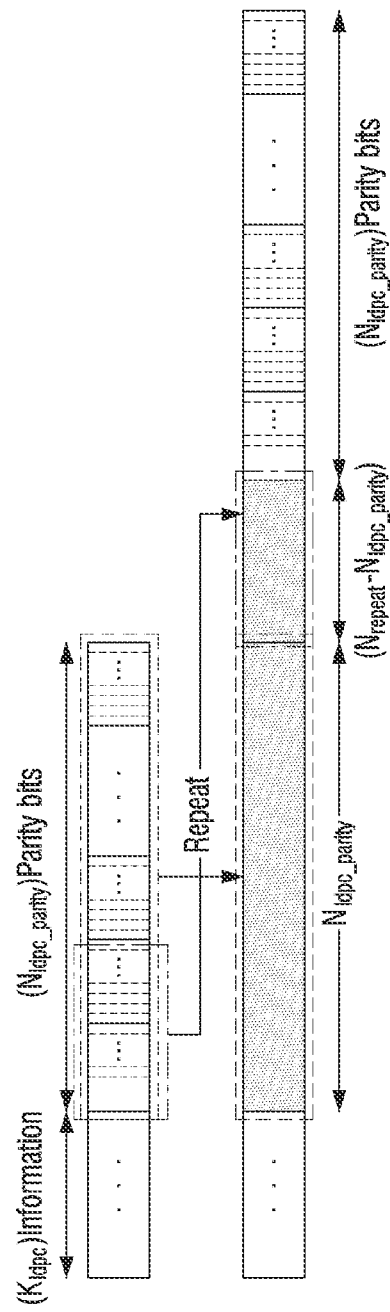

When $N_{repeat} > N_{ldpc\_parity}$, the repeaters 216 and 317 may add the parity permutated $N_{ldpc\_parity}$ LDPC parity bits to the LDPC information bits as illustrated in FIG. 15, and may additionally add an $N_{repeat} - N_{ldpc\_parity}$ number of the parity permutated LDPC parity bits to the $N_{ldpc\_parity}$ LDPC parity bits which are first added. That is, the repeaters 216 and 317 may add all the parity permutated LDPC parity bits after the LDPC information bits and additionally add the first LDPC parity bit to the $N_{repeat} - N_{ldpc\_parity}$-th LDPC parity bit among the parity permutated LDPC parity bits after the LDPC parity bits which are first added.

Therefore, in the L1-basic mode 1 and the L1-detail mode 1, the additional $N_{repeat}$ bits may be selected within the LDPC codeword and transmitted.

The puncturers 217 and 318 may puncture some of the LDPC parity bits included in the LDPC codeword output a shortening length (that is, $K_{ldpc} - N_{outer}$) by a preset constant A value. In the present exemplary embodiment, it is apparent that the constant A value is set at a ratio of the number of bits to be punctured to the number of bits to be shortened but may be variously set according to requirements of a system.

The B value is a value which represents a length of bits to be punctured even when the shortening length is 0, and thus, represents a minimum length that the punctured bits can have. Further, the A and B values serve to adjust an actually transmitted code rate. That is, to prepare for a case in which the length of information bits, that is, the length of the L1 signaling is short or a case in which the length of the L1 signaling is long, the A and B values serve to adjust the actually transmitted code rate to be reduced.

The above $K_{ldpc}$, A and B are listed in following Table 13 which shows parameters for puncturing. Therefore, the puncturers 217 and 318 may determine the parameters for puncturing according to a corresponding mode as shown in following Table 13.

TABLE 13

| Signaling | FEC Type | $N_{outer}$ | $K_{ldpc}$ | A | B | $N_{ldpc\_parity}$ | $\eta_{MOD}$ |
|---|---|---|---|---|---|---|---|
| L1-Basic | Mode 1 | 368 | 3240 | 0 | 9360 | 12960 | 2 |
| | Mode 2 | | | | 11460 | | 2 |
| | Mode 3 | | | | 12360 | | 2 |
| | Mode 4 | | | | 12292 | | 4 |
| | Mode 5 | | | | 12350 | | 6 |
| | Mode 6 | | | | 12432 | | 8 |
| | Mode 7 | | | | 12776 | | 8 |
| L1-Detail | Mode 1 | 568~2520 | | 7/2 | 0 | | 2 |
| | Mode 2 | 568~3240 | | 2 | 6036 | | 2 |
| | Mode 3 | 568~6480 | 6480 | 11/16 | 4653 | 9720 | 2 |
| | Mode 4 | | | 29/32 | 3200 | | 4 |
| | Mode 5 | | | 3/4 | 4284 | | 6 |
| | Mode 6 | | | 11/16 | 4900 | | 8 |
| | Mode 7 | | | 49/256 | 8246 | | 8 |

The puncturers 217 and 318 may calculate a temporary size $N_{FEC\_temp}$ of one coded block as shown in following Equation 31. Here, the number $N_{ldpc\_parity}$ of LDPC parity bits according to a corresponding mode is shown as above Table 13.

$$N_{FEC\_temp} = N_{outer} + N_{ldpc\_parity} - N_{punc\_temp} \quad (31)$$

Further, the puncturers 217 and 318 may calculate a size $N_{FEC}$ of one coded block as shown in following Equation 32.

$$N_{FEC} = \left\lceil \frac{N_{FEC\_temp}}{\eta_{MOD}} \right\rceil \times \eta_{MOD} \quad (32)$$

In above Equation 32, $\eta_{MOD}$ is a modulation order. For example, when the L1-basic signaling and the L1-detail signaling are modulated by QPSK, 16-QAM, 64-QAM or 256-QAM according to a corresponding mode, $\eta_{MOD}$ may be 2, 4, 6 and 8 as shown in above Table 13. According to above Equation 32, $N_{FEC}$ may be an integer multiple of the modulation order.

Further, the puncturers 217 and 318 may calculate the number $N_{punc}$ of LDPC parity bits to be punctured based on following Equation 33.

$$N_{punc} = N_{punc\_temp} - (N_{FEC} - N_{FEC\_temp}) \quad (33)$$

Here, $N_{punc}$ is 0 or a positive integer. Further, $N_{FEC}$ is the number of bits of an information block which are obtained by subtracting $N_{punc}$ bits to be punctured from $N_{outer}+N_{ldpc\_parity}$ bits obtained by performing the BCH encoding and the LDPC encoding on $K_{sig}$ information bits. That is, $N_{FEC}$ is the number of bits other than the repetition bits among the actually transmitted bits, and may be called the number of shortened and punctured LDPC codeword bits.

Referring to the foregoing process, the puncturers 217 and 318 multiplies A by the number of padded zero bits, that is, a shortening length and adding B to a result to calculate the temporary number $N_{punc\_temp}$ of LDPC parity bits to be punctured.

Further, the puncturers 217 and 318 calculate the temporary number $N_{FEC\_temp}$ of LDPC codeword bits to constitute the LDPC codeword after puncturing and shortening based on the $N_{punc\_temp}$.

In detail, the LDPC information bits are LDPC-encoded, and the LDPC parity bits generated by the LDPC encoding are added to the LDPC information bits to configure the LDPC codeword. Here, the LDPC information bits include the BCH-encoded bits in which the L1-basic signaling and the L1-detail signaling are BCH encoded, and in some cases, may further include padded zero bits.

In this case, since the padded zero bits are LDPC-encoded, and then, are not transmitted to the receiver 200, the shortened LDPC codeword, that is, the LDPC codeword (that is, shortened LDPC codeword) except the padded zero bits may be formed of the BCH-encoded bits and LDPC parity bits.

Therefore, the puncturers 217 and 318 subtract the temporary number of LDPC parity bits to be punctured from a sum of the number of BCH-encoded bits and the number of LDPC parity bits to calculate the $N_{FEC\_temp}$.

The punctured and shortened LDPC codeword (that is, LDPC codeword bits remaining after puncturing and shortening) are mapped to constellation symbols by various modulation schemes such as QPSK, 16-QAM, 64-QAM or 256-QAM according to a corresponding mode, and the constellation symbols may be transmitted to the receiver 200 through a frame.

Therefore, the puncturers 217 and 318 determine the number $N_{FEC}$ of LDPC codeword bits to constitute the LDPC codeword after puncturing and shortening based on $N_{FEC\_temp}$, $N_{FEC}$ being an integer multiple of the modulation order, and determine the number $N_{punc}$ of bits which need to be punctured based on LDPC codeword bits after shortening to obtain the $N_{FEC}$.

When zero bits are not padded, an LDPC codeword may be formed of BCH-encoded bits and LDPC parity bits, and the shortening may be omitted.

Further, in the L1-basic mode 1 and the L1-detail mode 1, repetition is performed, and thus, the number of shortened and punctured LDPC codeword bits is equal to $N_{FEC}+N_{repeat}$.

The puncturers 217 and 318 may puncture the LDPC parity bits as many as the calculated number.

In this case, the puncturers 217 and 318 may puncture the last $N_{punc}$ bits of all the LDPC codewords. That is, the puncturers 217 and 318 may puncture the $N_{punc}$ bits from the last LDPC parity bits.

In detail, when the repetition is not performed, the parity permutated LDPC codeword includes only LDPC parity bits generated by the LDPC encoding.

In this case, the puncturers 217 and 318 may puncture the last $N_{punc}$ bits of all the parity permutated LDPC codewords. Therefore, the $N_{punc}$ bits from the last LDPC parity bits among the LDPC parity bits generated by the LDPC encoding may be punctured.

When the repetition is performed, the parity permutated and repeated LDPC codeword includes the repeated LDPC parity bits and the LDPC parity bits generated by the LDPC encoding.

Figure 16:
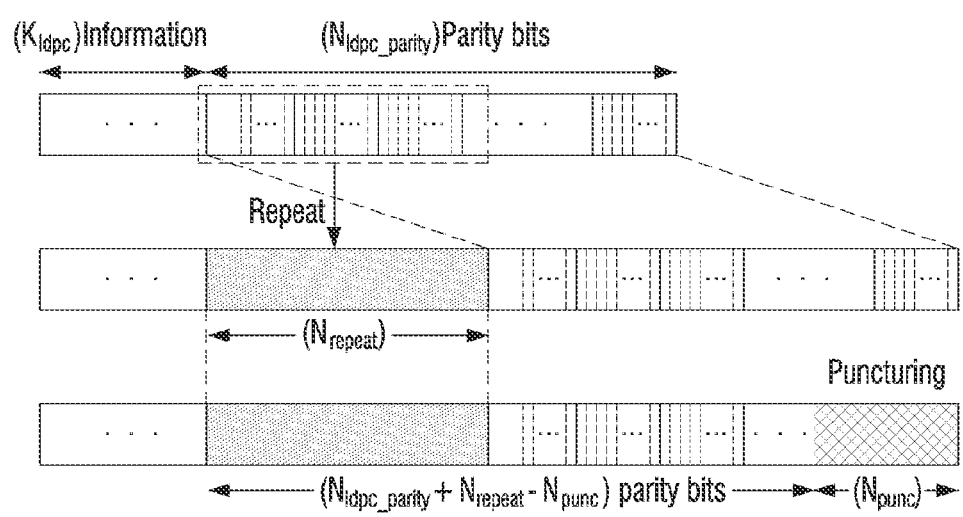
Figure 17:
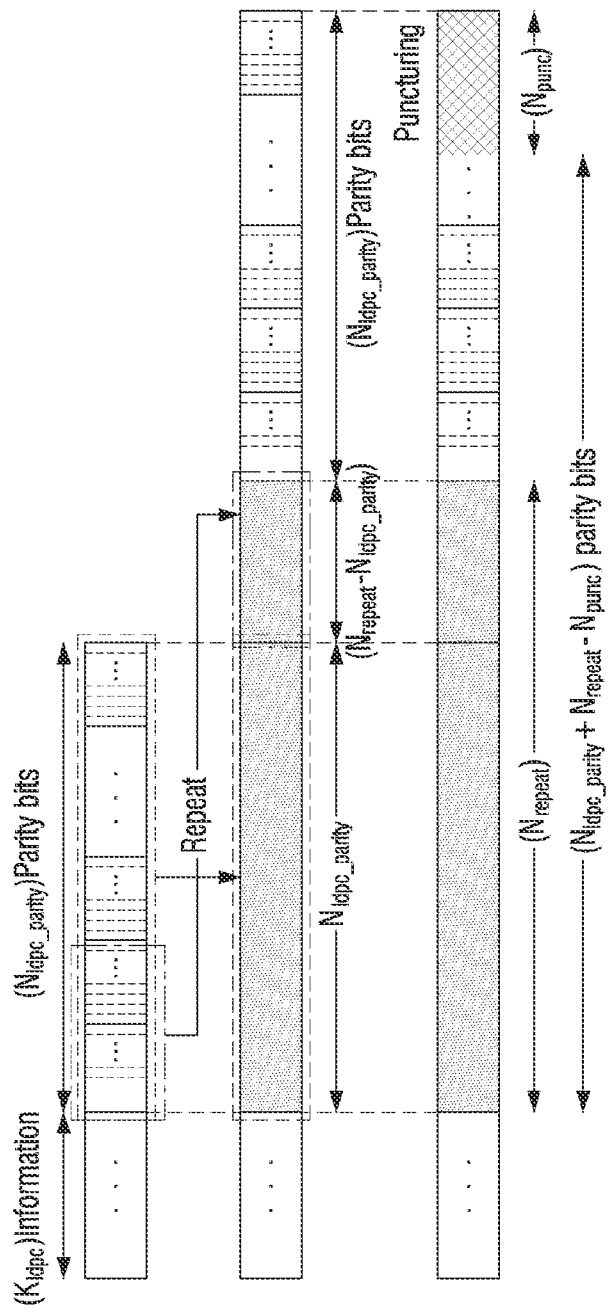

In this case, the puncturers 217 and 318 may puncture the last $N_{punc}$ bits of all the parity permutated and repeated LDPC codewords, respectively, as illustrated in FIGS. 16 and 17.

In detail, the repeated LDPC parity bits are positioned between the LDPC information bits and the LDPC parity bits generated by the LDPC encoding, and thus, the puncturers 217 and 318 may puncture the $N_{punc}$ bits from the last LDPC parity bits among the LDPC parity bits generated by the LDPC encoding, respectively.

As such, the puncturers 217 and 318 may puncture the $N_{punc}$ bits from the last LDPC parity bits, respectively.

$N_{punc}$ is 0 or a positive integer and the repetition may be applied only to the L1-basic mode 1 and the L1-detail mode 1.

The foregoing example describes that the repetition is performed, and then, the puncturing is performed, which is only one example. In some cases, after the puncturing is performed, the repetition may be performed.

The additional parity generator 319 may select bits from the LDPC parity bits to generate additional parity (AP) bits.

In this case, the additional parity bits may be selected from the LDPC parity bits generated based on the L1-detail signaling transmitted in a current frame, and transmitted to the receiver 200 through a frame before the current frame, that is, a previous frame.

In detail, the L1-detail signaling is LDPC-encoded, and the LDPC parity bits generated by the LDPC encoding are added to the L1-detail signaling to configure an LDPC codeword.

Further, puncturing and shortening are performed on the LDPC codeword, and the punctured and shortened LDPC codeword may be mapped to a frame to be transmitted to the receiver 200. Here, when the repetition is performed according to a corresponding mode, the punctured and shortened LDPC codeword may include the repeated LDPC parity bits.

In this case, the L1-detail signaling corresponding to each frame may be transmitted to the receiver 200 through each frame, along with the LDPC parity bits. For example, the punctured and shortened LDPC codeword including the L1-detail signaling corresponding to an (i−1)-th frame may be mapped to the (i−1)-th frame to be transmitted to the receiver 200, and the punctured and shortened LDPC codeword including the L1-detail signaling corresponding to the i-th frame may be mapped to the i-th frame to be transmitted to the receiver 200.

The additional parity generator 319 may select at least some of the LDPC parity bits generated based on the L1-detail signaling transmitted in the i-th frame to generate the additional parity bits.

In detail, some of the LDPC parity bits generated by performing the LDPC encoding on the L1-detail signaling are punctured, and then, are not transmitted to the receiver 200. In this case, the additional parity generator 319 may select at least some of the punctured LDPC parity bits among the LDPC parity bits generated by performing the LDPC encoding on the L1-detail signaling transmitted in the i-th frame, thereby generating the additional parity bits.

Further, the additional parity generator 319 may select at least some of the LDPC parity bits to be transmitted to the receiver 200 through the i-th frame to generate the additional parity bits.

In detail, the LDPC parity bits included in the punctured and shortened LDPC codeword to be mapped to the i-th frame may be configured of only the LDPC parity bits generated by the LDPC encoding according to a corresponding mode or the LDPC parity bits generated by the LDPC encoding and the repeated LDPC parity bits.

In this case, the additional parity generator 319 may select at least some of the LDPC parity bits included in the punctured and shortened LDPC codeword to be mapped to the i-th frame to generate the additional parity bits.

The additional parity bits may be transmitted to the receiver 200 through the frame before the i-th frame, that is, the (i−1)-th frame.

That is, the transmitter 100 may not only transmit the punctured and shortened LDPC codeword including the L1-detail signaling corresponding to the (i−1)-th frame but also transmit the additional parity bits generated based on the L1-detail signaling transmitted in the i-th frame to the receiver 200 through the (i−1)-th frame.

In this case, the frame in which the additional parity bits are transmitted may be temporally the most previous frame among the frames before the current frame.

For example, the additional parity bits have the same bootstrap major/minor version as the current frame among the frames before the current frame, and may be transmitted in temporally the most previous frame.

In some cases, the additional parity generator 319 may not generate the additional parity bits.

In this case, the transmitter 100 may transmit information about whether additional parity bits for an L1-detail signaling of a next frame are transmitted through the current frame to the receiver 200 using an L1-basic signaling transmitted through the current frame.

For example, the use of the additional parity bits for the L1-detail signaling of the next frame having the same bootstrap major/minor version as the current frame may be signaled through a field L1B_L1_Detail_additional_parity_mode of the L1-basic parameter of the current frame. In detail, when the L1B_L1_Detail additional_parity_mode in the L1-basic parameter of the current frame is set to be '00', additional parity bits for the L1-detail signaling of the next frame are not transmitted in the current frame.

As such, to additionally increase robustness of the L1-detail signaling, the additional parity bits may be transmitted in the frame before the current frame in which the L1-detail signaling of the current frame is transmitted.

Figure 18:
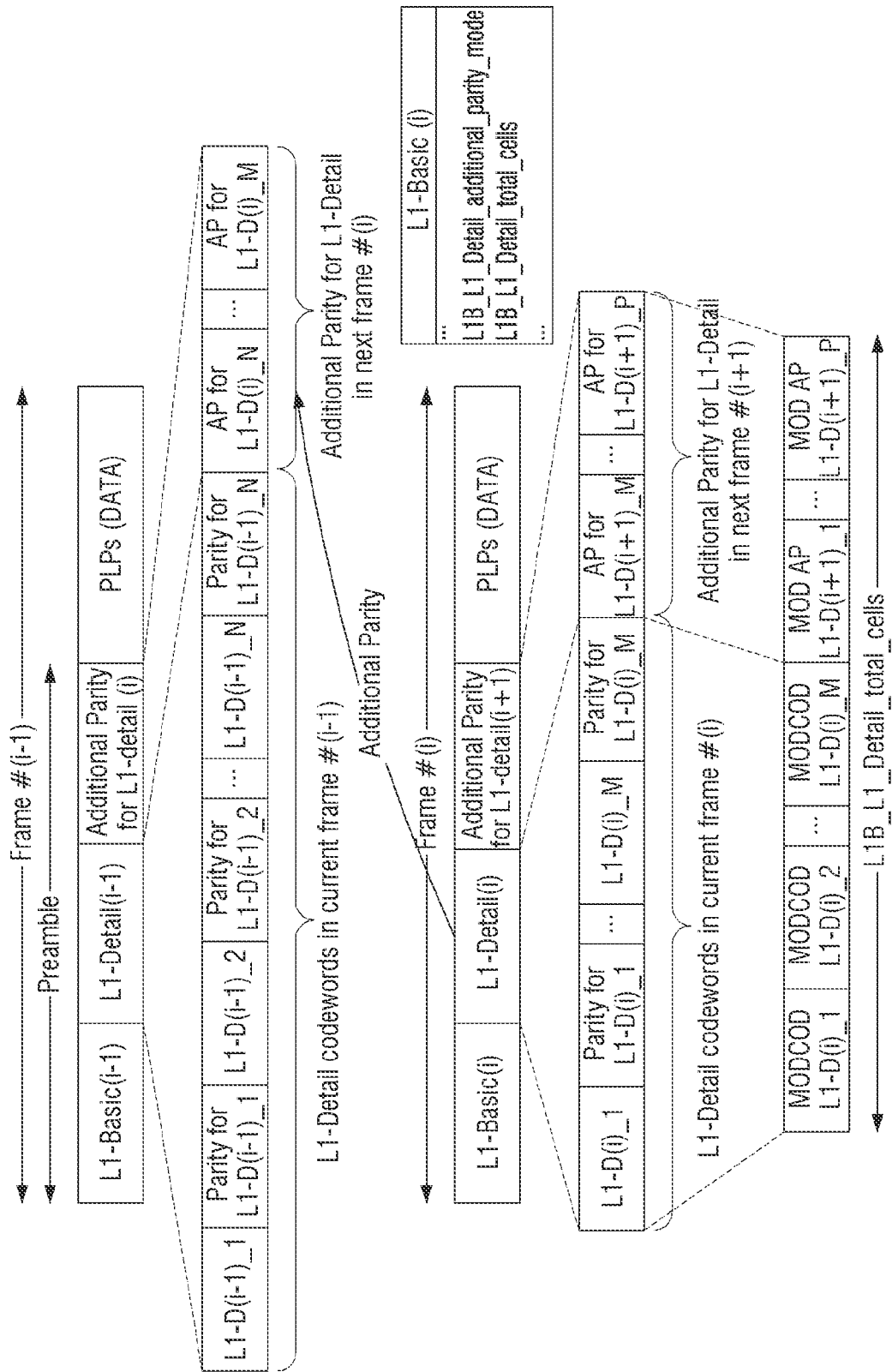

FIG. 18 illustrates an example in which the additional parity bits for the L1-detail signaling of the i-th frame are transmitted in a preamble of the (i−1)-th frame.

FIG. 18 illustrates that the L1-detail signaling transmitted through the i-th frame is segmented into M blocks by segmentation and each of the segmented blocks is FEC encoded.

Therefore, M number of LDPC codewords, that is, an LDPC codeword including LDPC information bits L1-D(i)_1 and parity bits parity for L1-D(i)_1 therefor, . . . , and an LDPC codeword including LDPC information bits L1-D(i)_M and parity bits parity for L1-D(i)_M therefor are mapped to the i-th frame to be transmitted to the receiver 200.

In this case, the additional parity bits generated based on the L1-detail signaling transmitted in the i-th frame may be transmitted to the receiver 200 through the (i−1)-th frame.

In detail, the additional parity bits, that is, AP for L1-D(i)_1, . . . AP for L1-D(i)_M generated based on the L1-detail signaling transmitted in the i-th frame may be mapped to the preamble of the (i−1)-th frame to be transmitted to the receiver 200. As a result of using the additional parity bits, a diversity gain for the L1 signaling may be obtained.

Hereinafter, a method for generating additional parity bits will be described in detail.

The additional parity generator 319 calculates a temporary number $N_{AP\_temp}$ of additional parity bits based on following Equation 34.

$$N_{AP\_temp} = \min\left\{ \begin{array}{l} 0.5 \times K \times (N_{outer} + N_{ldpc\_parity} - N_{punc} + N_{repeat}), \\ (N_{ldpc\_parity} + N_{punc} + N_{repeat}) \end{array} \right\} \quad (34)$$

$$K = 0, 1, 2$$

In above Equation 34, $$\min(a, b) = \begin{cases} a, & \text{if } a \leq b \\ b, & \text{if } b < a \end{cases}.$$

Further, K represents a ratio of the additional parity bits to a half of a total number of bits of a transmitted coded L1-detail signaling block (that is, bits configuring the L1-detail signaling block repeated, punctured, and have the zero bits removed (that is, shortened)).

In this case, K corresponds to an L1B_L1_Detail_additional_parity_mode field of the L1-basic signaling. Here, a value of the L1B_L1_Detail_additional_parity_mode associated with the L1-detail signaling of the i-th frame (that is, frame (#i)) may be transmitted in the (i−1)-th frame (that is, frame (#i−1)).

As described above, when L1 detail modes are 2, 3, 4, 5, 6 and 7, since repetition is not performed, in above Equation 34, $N_{repeat}$ is 0.

Further, the additional parity generator 319 calculates the number $N_{AP}$ of additional parity bits based on following Equation 35. Therefore, the number $N_{AP}$ of additional parity bits may be an integer multiple of a modulation order.

$$N_{AP} = \left\lfloor \frac{N_{AP\_temp}}{\eta_{MOD}} \right\rfloor \times \eta_{MOD} \quad (35)$$

Here, $\lfloor x \rfloor$ is a maximum integer which is not greater than x. Here, $\eta_{MOD}$ is the modulation order. For example, when the L1-detail signaling is modulated by QPSK, 16-QAM, 64-QAM or 256-QAM according to a corresponding mode, the $\eta_{MOD}$ may be 2, 4, 6 or 8, respectively.

As such, the number of additional parity bits to be generated may be determined based on the total number of bits transmitted in the current frame.

Next, the additional parity generator 319 may select bits as many as the number of bits calculated in the LDPC parity bits to generate the additional parity bits.

In detail, when the number of punctured LDPC parity bits is equal to or greater than the number of additional parity bits to be generated, the additional parity generator 319 may select bits as many as the calculated number from the first LDPC parity bit among the punctured LDPC parity bits to generate the additional parity bits.

When the number of punctured LDPC parity bits is less than the number of additional parity bits to be generated, the additional parity generator 319 may first select all the punctured LDPC parity bits and additionally select bits as many as the number obtained by subtracting the number of punctured LDPC parity bits from the number of additional parity bits to be generated, from the first LDPC parity bit among the LDPC parity bits included in the LDPC codeword to generate the additional parity bits.

In detail, when the repetition is not performed, LDPC parity bits included in a repeated LDPC codeword are the LDPC parity bits generated by the LDPC encoding.

In this case, the additional parity generator 319 may first select all the punctured LDPC parity bits and additionally select bits as many as the number obtained by subtracting the number of punctured LDPC parity bits from the number of additional parity bits to be generated, from the first LDPC parity bit among the LDPC parity bits generated by the LDPC encoding, to generate the additional parity bits.

Here, the LDPC parity bits generated by the LDPC encoding are divided into the non-punctured LDPC parity bits and the punctured LDPC parity bits. As a result, when bits are selected from the first bit among the LDPC parity bits generated by the LDPC encoding, they may be selected in an order of the non-punctured LDPC parity bits and the punctured LDPC parity bits.

When the repetition is performed, the LDPC parity bits included in the repeated LDPC codeword are the repeated LDPC parity bits and the LDPC parity bits generated by the LDPC encoding. Here, the repeated LDPC parity bits are positioned between the LDPC information bits and the LDPC parity bits generated by the LDPC encoding.

In this case, the additional parity generator 319 may first select all the punctured LDPC parity bits and additionally select the bits as many as the number obtained by subtracting the number of punctured LDPC parity bits from the number of additional bits, from the first LDPC parity bit among the repeated LDPC parity bits to generate the additional parity bits.

Here, when the bits are selected from the first bit among the repeated LDPC parity bits, they may be selected in an order of the repetition bits and the LDPC parity bits generated by the LDPC encoding. Further, the bits may be selected in an order of the non-punctured LDPC parity bits and the punctured LDPC parity bits, within the LDPC parity bits generated by the LDPC encoding.

Hereinafter, methods for generating additional parity bits according to exemplary embodiments will be described in more detail with reference to FIGS. 19 to 21.

Figure 19:
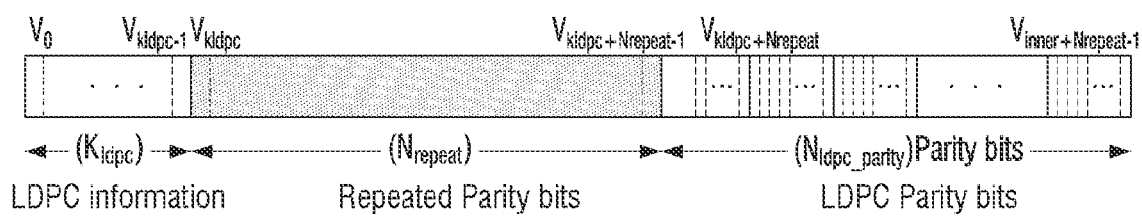
Figure 20:
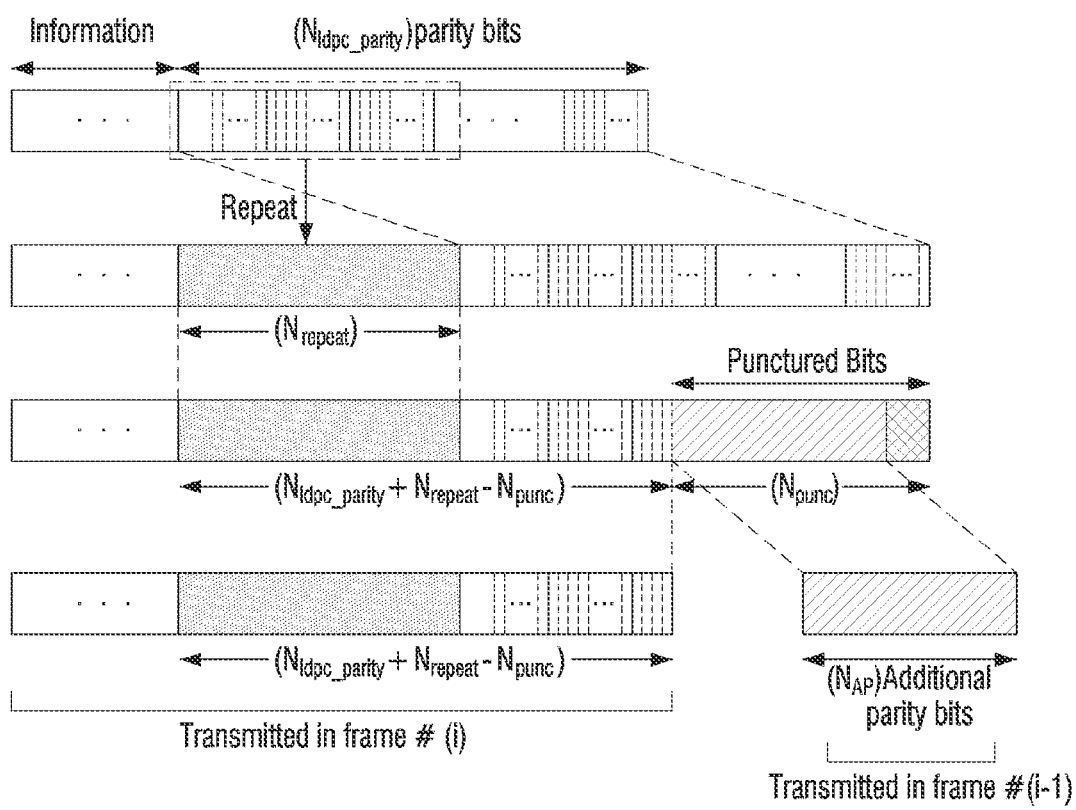
Figure 21:
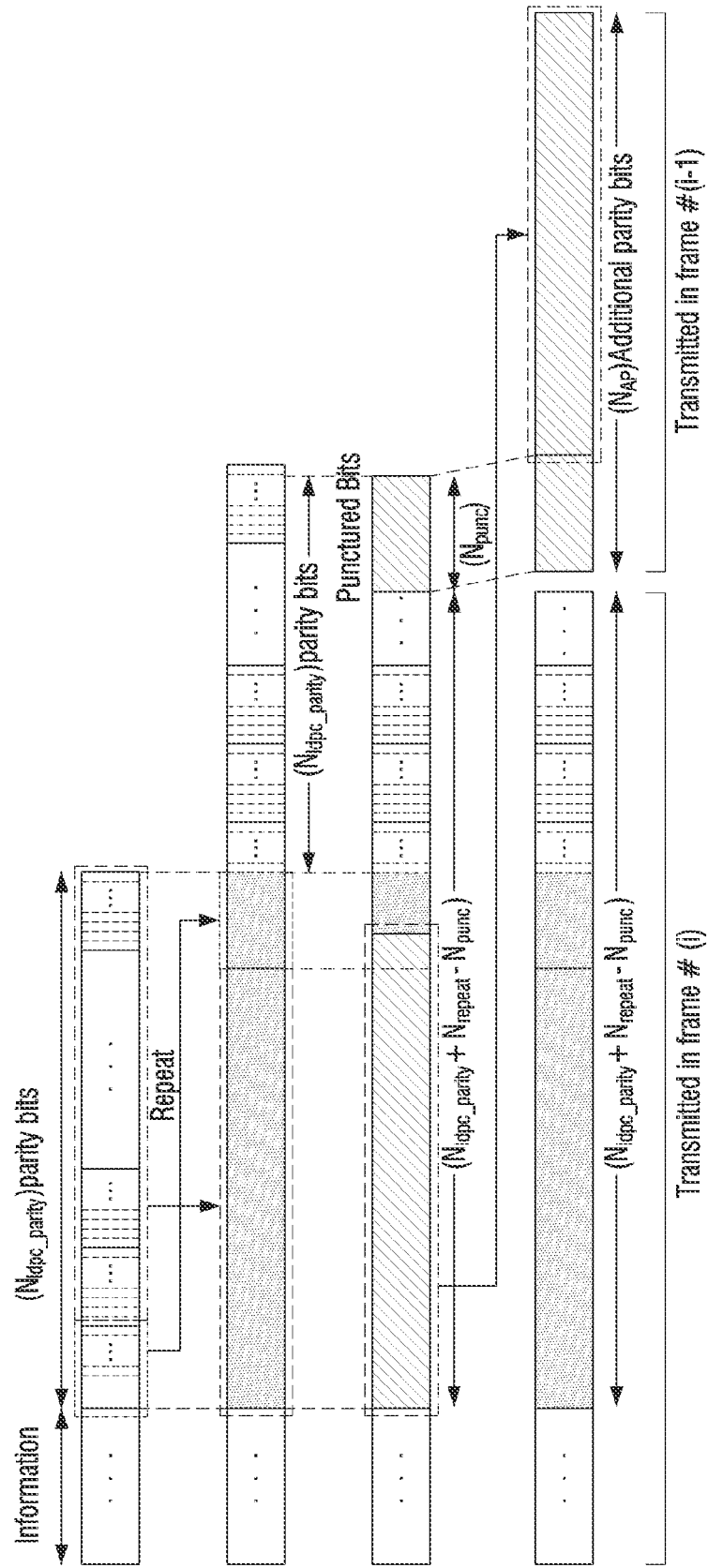

FIGS. 19 to 21 are diagrams for describing the method for generating additional parity bits when repetition is performed, according to the exemplary embodiment. In this case, the repeated LDPC codeword $V=(v_0, v_1, \ldots, v_{N_{inner}+N_{repeat}-1})$ may be represented as illustrated in FIG. 19.

First, in the case of $N_{AP} \leq N_{punc}$, as illustrated in FIG. 20, the additional parity generator 319 may select $N_{AP}$ bits from the first LDPC parity bit among punctured LDPC parity bits to generate the additional parity bits.

Therefore, for the additional parity bits, the punctured LDPC parity bits $(v_{N_{repeat}+N_{inner}-N_{punc}}, v_{N_{repeat}+N_{inner}-N_{punc}+1}, \ldots, v_{N_{repeat}+N_{inner}-N_{punc}-N_{AP}-1})$ may be selected. That is, the additional parity generator 319 may select $N_{AP}$ bits from the first LDPC parity bit among the punctured LDPC parity bits to generate the additional parity bits.

Meanwhile, in the case of $N_{AP} > N_{punc}$, as illustrated in FIG. 21, the additional parity generator 319 selects all the punctured LDPC parity bits.

Therefore, for the additional parity bits, all the punctured LDPC parity bits $(v_{N_{repeat}+N_{inner}-N_{punc}}, v_{N_{repeat}+N_{inner}-N_{punc}+1}, \ldots, v_{N_{repeat}+N_{inner}-1})$ may be selected.

Further, the additional parity generator 319 may additionally select first $N_{AP}-N_{punc}$ bits from the LDPC parity bits including the repeated LDPC parity bits and the LDPC parity bits generated by the LDPC encoding.

That is, since the repeated LDPC parity bits and the LDPC parity bits generated by the LDPC encoding are sequentially arranged, the additional parity generator 319 may additionally select the $N_{AP}-N_{punc}$ parity bits from the first LDPC parity bit among the LDPC parity bits added by the repetition.

Therefore, for the additional parity bits, the LDPC parity bits $(v_{K_{ldpc}}, v_{K_{ldpc}+1}, \ldots, v_{K_{ldpc}+N_{AP}-N_{punc}-1})$ may be additionally selected.

In this case, the additional parity generator 319 may add the additionally selected bits to the previously selected bits to generate the additional parity bits. That is, as illustrated in FIG. 21, the additional parity generator 319 may add the additionally selected LDPC parity bits to the punctured LDPC parity bits to generate the additional parity bits.

As a result, for the additional parity bits, ($v_{N_{repeat}+N_{inner}-N_{punc}}$, $v_{N_{repeat}+N_{inner}-N_{punc}+1}$, ..., $v_{N_{repeat}+N_{inner}-1}$, $v_{K_{ldpc}}$, $v_{K_{ldpc}+1}$, ..., $v_{K_{ldpc}+N_{AP}-N_{punc}-1}$) may be selected.

As such, when the number of punctured bits is equal to or greater than the number of additional parity bits, the additional parity bits may be generated by selecting bits among the punctured bits based on the puncturing order. However, in other cases, the additional parity bits may be generated by selecting all the punctured bits and the $N_{AP}-N_{punc}$ parity bits.

Since $N_{repeat}=0$ when repetition is not performed, the method for generating additional parity bits when the repetition is not performed is the same as the case in which $N_{repeat}=0$ in FIGS. 19 to 21.

The additional parity bits may be bit-interleaved, and may be mapped to constellation. In this case, the constellation for the additional parity bits may be generated by the same method as constellation for the L1-detail signaling bits transmitted in the current frame, in which the L1-detail signaling bits are repeated, punctured, and have the zero bits removed. Further, as illustrated in FIG. 18, after being mapped to the constellation, the additional parity bits may be added after the L1-detail signaling block in a frame before the current frame in which the L1-detail signaling of the current frame is transmitted.

The additional parity generator 319 may output the additional parity bits to a bit demultiplexer 323.

As described above in reference to Tables 10 and 11, the group-wise interleaving pattern defining the permutation order may have two patterns: a first pattern and a second pattern.

In detail, since the B value of above Equation 30 represents the minimum length of the LDPC parity bits to be punctured, the predetermined number of bits may be always punctured depending on the B value regardless of the length of the input signaling. For example, in the L1-detail mode 2, since B=6036 and the bit group is formed of 360 bits, even when the shortening length is 0, at least $$\left\lfloor \frac{6036}{360} \right\rfloor = 16$$

bit groups are always punctured.

In this case, since the puncturing is performed from the last LDPC parity bit, the predetermined number of bit groups from a last bit group among the plurality of bit groups configuring the group-wise interleaved LDPC parity bits may be always punctured regardless of the shortening length.

For example, in the L1-detail mode 2, the last 16 bit groups among 36 bit groups configuring the group-wise interleaved LDPC parity bits may be always punctured.

As a result, some of the group-wise interleaving patterns defining the permutation order represent bit groups always to punctured, and therefore, the group-wise interleaving pattern may be divided into two patterns. In detail, a pattern defining the remaining bit groups other than the bit groups to be always punctured in the group-wise interleaving pattern is referred to as the first pattern, and the pattern defining the bit groups to be always punctured is referred to as the second pattern.

For example, in the L1-detail mode 2, since the group-wise interleaving pattern is defined as above Table 10, a pattern representing indexes of bit groups which are not group-wise interleaved and positioned in a 9-th bit group to a 28-th bit group after group-wise interleaving, that is, $Y_9=X_{\pi p(9)}=X_9$, $Y_{10}=X_{\pi p(10)}=X_{31}$, $Y_{11}=X_{\pi p(11)}=X_{23}$, ..., $Y_{26}=X_{\pi p(26)}=X_{17}$, $Y_{27}=X_{np(27)}=X_{35}$, $Y_{28}=X_{\pi p(28)}=X_{21}$ may be the first pattern, and a pattern representing indexes of bit groups which are not group-wise interleaved and positioned in a 29-th bit group to a 44-th bit group after group-wise interleaving, that is, $Y_{29}=X_{\pi p(29)}=X_{20}$, $Y_{30}=X_{\pi p(30)}=X_{24}$, $Y_{31}=X_{\pi p(31)}=X_{44}$, ..., $Y_{42}=X_{\pi p(42)}=X_{28}$, $Y_{43}=X_{\pi p(43)}=X_{39}$, $Y_{44}=X_{\pi p(44)}=X_{42}$ may be the second pattern.

As described above, the second pattern defines bit groups to be always punctured in a current frame regardless of the shortening length, and the first pattern defines bit groups additionally to be punctured as the shortening length is long, such that the first pattern may be used to determine the LDPC parity bits to be transmitted in the current frame after the puncturing.

In detail, according to the number of LDPC parity bits to be punctured, in addition to the LDPC parity bits to be always punctured, more LDPC parity bits may additionally be punctured.

For example, in the L1-detail mode 2, when the number of LDPC parity bits to be punctured is 7200, 20 bit groups need to be punctured, and thus, four (4) bit groups need to be additionally punctured, in addition to the 16 bit groups to be always punctured.

In this case, the additionally punctured four (4) bit groups correspond to the bit groups positioned at 25-th to 28-th positions after group-wise interleaving, and since these bit groups are determined according to the first pattern, that is, belong to the first pattern, the first pattern may be used to determine the punctured bit groups.

That is, when LDPC parity bits are punctured more than a minimum value of LDPC parity bits to be punctured, which bit groups are to be additionally punctured is determined according to which bit groups are positioned after the bit groups to be always punctured. As a result, according to a puncturing direction, the first pattern which defines the bit groups positioned after the bit groups to be always punctured may be considered as determining the punctured bit groups.

That is, as in the foregoing example, when the number of LDPC parity bits to be punctured is 7200, in addition to the 16 bit groups to be always punctured, four (4) bit groups, that is, the bit groups positioned at 28-th, 27-th, 26-th, and 25-th positions, after group-wise interleaving is performed, are additionally punctured. Here, the bit groups positioned at 25-th to 28-th positions after the group-wise interleaving are determined according to the first pattern.

As a result, the first pattern may be considered as being used to determine the bit groups to be punctured. Further, the remaining LDPC parity bits other than the punctured LDPC parity bits are transmitted through the current frame, and therefore, the first pattern may be considered as being used to determine the bit groups transmitted in the current frame.

The second pattern may be used to determine the additional parity bits to be transmitted in the previous frame.

In detail, since the bit groups determined to be always punctured are always punctured, and then, are not transmitted in the current frame, these bit groups need to be positioned only where bits are always punctured after group-wise interleaving. Therefore, it is not important at which position of these bit groups are positioned after the group-wise interleaving.

For example, in the L1-detail mode 2, bit groups positioned at 20-th, 24-th, 44-th, ..., 28-th, 39-th and 42-th positions before the group-wise interleaving need to be positioned only at a 29-th bit group to a 44-th bit group after the group-wise interleaving. Therefore, it is not important at which positions of these bit groups are positioned.

As such, the second pattern defining bit groups to be always punctured is used to identify bit groups to be punctured. Therefore, defining an order between the bit groups in the second pattern is meaningless in the puncturing, and thus, the second pattern defining bit groups to be always punctured may be considered as not being used for the puncturing.

However, for determining additional parity bits, positions of the bit groups to be always punctured within these bit groups need to be considered.

In detail, since the additional parity bits are generated by selecting bits as many as a predetermined number from the first bit among the punctured LDPC parity bits, bits included in at least some of the bit groups to be always punctured may be selected as at least some of the additional parity bits depending on the number of punctured LDPC parity bits and the number of additional parity bits to be generated.

That is, when additional parity bits are selected over the number of bit groups defined according to the first pattern, since the additional parity bits are sequentially selected from a start portion of the second pattern, the order of the bit groups belonging to the second pattern is meaningful in terms of selection of the additional parity bits. As a result, the second pattern defining bit groups to be always punctured may be considered as being used to determine the additional parity bits.

For example, in the L1-detail mode 2, the total number of LDPC parity bits is 12960 and the number of bit groups to be always punctured is 16.

In this case, the second pattern may be used to generate the additional parity bits depending on whether a value obtained by subtracting the number of LDPC parity bits to be punctured from the number of all LDPC parity bits and adding the subtraction result to the number of additional parity bits to be generated exceeds 7200. Here, 7200 is the number of LDPC parity bits except the bit groups to be always punctured, among the bit groups configuring the LDPC parity bits. That is, 7200=(36−16)×360.

In detail, when the value obtained by the above subtraction and addition is equal to or less than 7200, that is, $12960-N_{punc}+N_{AP} \leq 7200$, the additional parity bits may be generated according to the first pattern.

However, when the value obtained by the above subtraction and addition exceeds 7200, that is, $12960-N_{punc}+N_{AP}>7200$, the additional parity bits may be generated according to the first pattern and the second pattern.

In detail, when $12960-N_{punc}+N_{AP}>7200$, for the additional parity bits, bits included in the bit group positioned at a 28-th position from the first LDPC parity bit among the punctured LDPC parity bits may be selected, and bits included in the bit group positioned at a predetermined position from a 29-th position may be selected.

Here, the bit group to which the first LDPC parity bit among the punctured LDPC parity bits belongs and the bit group (that is, when being sequentially selected from the first LDPC parity bit among the punctured LDPC parity bits, a bit group to which the finally selected LDPC parity bits belong) at the predetermined position may be determined depending on the number of punctured LDPC parity bits and the number of additional parity bits to be generated.

In this case, the bit group positioned at the 28-th position from the firth LDPC parity bit among the punctured LDPC parity bits is determined according to the first pattern, and the bit group positioned at the predetermined position from the 29-th position is determined according to the second pattern.

As a result, the additional parity bits are determined according to the first pattern and the second pattern.

As such, the first pattern may be used to determine additional parity bits to be generated as well as LDPC parity bits to be punctured, and the second pattern may be used to determine the additional parity bits to be generated and LDPC parity bits to be always punctured regardless of the number of parity bits to be punctured by the puncturers 217 and 318.

The foregoing example describes that the group-wise interleaving pattern includes the first pattern and the second pattern, which is only for convenience of explanation in terms of the puncturing and the additional parity. That is, the group-wise interleaving pattern may be considered as one pattern without being divided into the first pattern and the second pattern. In this case, the group-wise interleaving may be considered as being performed with one pattern both for the puncturing and the additional parity.

The values used in the foregoing example such as the number of punctured LDPC parity bits are only example values.

The zero removers 218 and 321 may remove zero bits padded by the zero padders 213 and 314 from the LDPC codewords output from the puncturers 217 and 318, and output the remaining bits to the bit demultiplexers 219 and 322.

Here, the removal does not only remove the padded zero bits but also may include outputting the remaining bits other than the padded zero bits in the LDPC codewords.

In detail, the zero removers 218 and 321 may remove $K_{ldpc}-N_{outer}$ zero bits padded by the zero padders 213 and 314. Therefore, the $K_{ldpc}-N_{outer}$ padded zero bits are removed, and thus, may not be transmitted to the receiver 200.

Figure 22:
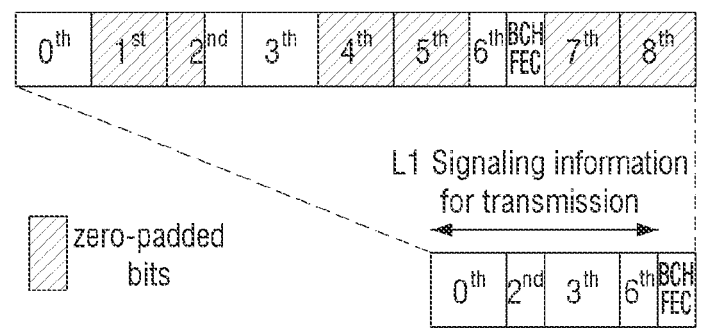

For example, as illustrated in FIG. 22, it is assumed that all bits of a first bit group, a fourth bit group, a fifth bit group, a seventh bit group, and an eighth bit group among a plurality of bit groups configuring an LDPC codeword are padded by zero bits, and some bits of the second bit group are padded by zero bits.

In this case, the zero removers 218 and 321 may remove the zero bits padded to the first bit group, the second bit group, the fourth bit group, the fifth bit group, the seventh bit group, and the eighth bit group.

As such, when zero bits are removed, as illustrated in FIG. 22, an LDPC codeword formed of $K_{sig}$ information bits (that is, $K_{sig}$ L1-basic signaling bits and $K_{sig}$ L1-detail signaling bits), 168 BCH parity check bits (that is, BCH FEC), and $N_{inner}-K_{ldpc}-N_{punc}$ or $N_{inner}-K_{ldpc}-N_{punc}+N_{repeat}$ parity bits may remain.

That is, when repetition is performed, the lengths of all the LDPC codewords become $N_{FEC}+N_{repeat}$. Here, $N_{FEC}=N_{outer}+N_{ldpc\_parity}-N_{punc}$. However, in a mode in which the repetition is not performed, the lengths of all the LDPC codewords become $N_{FEC}$.

The bit demultiplexers 219 and 322 may interleave the bits output from the zero removers 218 and 321, demultiplex the interleaved bits, and then output them to the constellation mappers 221 and 324.

For this purpose, the bit demultiplexers 219 and 322 may include a block interleaver (not illustrated) and a demultiplexer (not illustrated).

Figure 23:
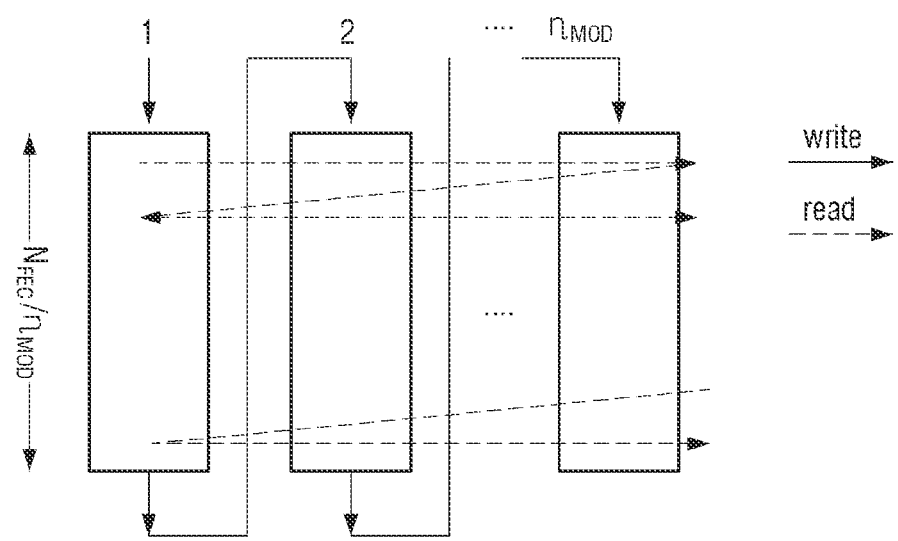

First, a block interleaving scheme performed in the block interleaver is illustrated in FIG. 23.

In detail, the bits of the $N_{FEC}$ or $N_{FEC}+N_{repeat}$ length after the zero bits are removed may be column-wisely serially written in the block interleaver. Here, the number of columns of the block interleaver is equivalent to the modulation order and the number of rows is $N_{FEC}/\eta_{MOD}$ or $(N_{FEC}+N_{repeat})/\eta_{MOD}$.

Further, in a read operation, bits for one constellation symbol may be sequentially read in a row direction to be input to the demultiplexer. The operation may be continued to the last row of the column.

That is, the $N_{FEC}$ or $(N_{FEC}+N_{repeat})$ bits may be written in a plurality of columns in a column direction from the first row of the first column, and the bits written in the plurality of columns are sequentially read from the first row to the last row of the plurality of columns in a row direction. In this case, the bits read in the same row may configure one modulation symbol.

The demultiplexer may demultiplex the bits output from the block interleaver.

In detail, the demultiplexer may demultiplex each of the block-interleaved bit groups, that is, the bits output while being read in the same row of the block interleaver within the bit group bit-by-bit, before the bits are mapped to constellation.

In this case, two mapping rules may be present according to the modulation order.

In detail, when QPSK is used for modulation, since reliability of bits within a constellation symbol is the same, the demultiplexer does not perform the demultiplexing operation on a bit group. Therefore, the bit group read and output from the block interleaver may be mapped to a QPSK symbol without the demultiplexing operation.

However, when high order modulation is used, the demultiplexer may perform demultiplexing on a bit group read and output from the block interleaver based on following Equation 36. That is, a bit group may be mapped to a QAM symbol depending on following Equation 36.

$$S_{demux\_in(i)}=\{b_i(0),b_i(1),b_i(2),\ldots,b_i(\eta_{mod}-1)\},$$

$$S_{demux\_out(i)}=\{c_i(0),c_i(1),c_i(2),\ldots,c_i(\eta_{mod}-1)\},$$

$$c_i(0)=b_i(i\%\ \eta_{mod}), c_i(1)=b_i((i+1)\%\ \eta_{mod}),\ldots,c_i(\eta_{mod}-1)=b_i((i+\eta_{mod}-1)\%\ \eta_{mod}) \quad (36)$$

In above Equation 36, % represents a modulo operation, and $\eta_{MOD}$ is a modulation order.

Further, i is a bit group index corresponding to a row index of the block interleaver. That is, an output bit group $S_{demux\_out(i)}$ mapped to each of the QAM symbols may be cyclic-shifted in an $S_{demux\_in(i)}$ according to the bit group index i.

Figure 24:
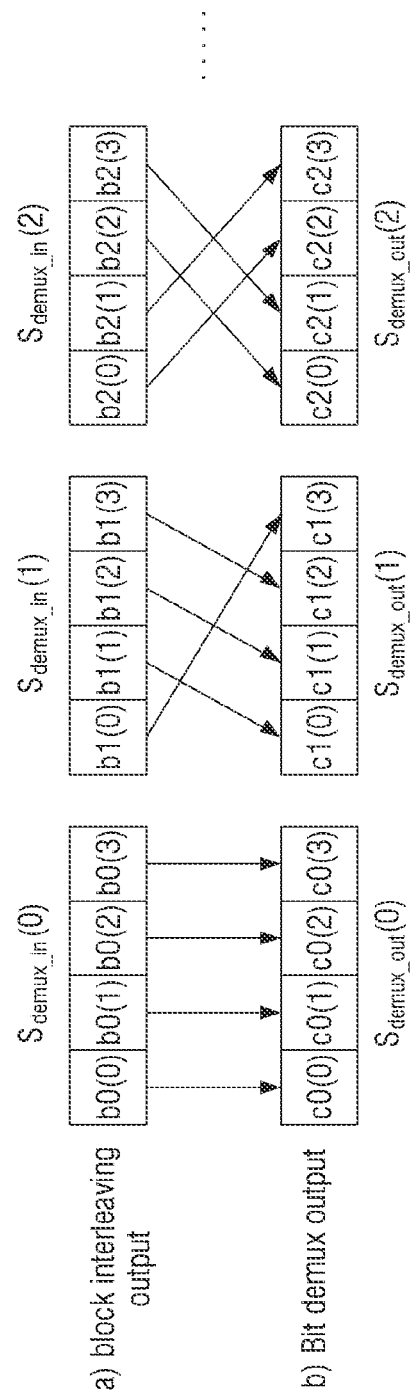

FIG. 24 illustrates an example of performing bit demultiplexing on 16-non uniform constellation (16-NUC), that is, NUC 16-QAM. The operation may be continued until all bit groups are read in the block interleaver.

The bit demultiplexer 323 may perform the same operation, as the operations performed by the bit demultiplexers 219 and 322, on the additional parity bits output from the additional parity generator 319, and output the block-interleaved and demultiplexed bits to the constellation mapper 325.

The constellation mappers 221, 324 and 325 may map the bits output from the bit demultiplexers 219, 322 and 323 to constellation symbols, respectively.

That is, each of the constellation mappers 221, 324 and 325 may map the $S_{demux\_out(i)}$ to a cell word using constellation according to a corresponding mode. Here, the $S_{demux\_out(i)}$ may be configured of bits having the same number as the modulation order.

In detail, the constellation mappers 221, 324 and 325 may map bits output from the bit demultiplexers 219, 322 and 323 to constellation symbols using QPSK, 16-QAM, 64-QAM, the 256-QAM, etc., according to a corresponding mode.

In this case, the constellation mappers 221, 324 and 325 may use the NUC. That is, the constellation mappers 221, 324 and 325 may use NUC 16-QAM, NUC 64-QAM or NUC 256-QAM. The modulation scheme applied to the L1-basic signaling and the L1-detail signaling according to a corresponding mode is shown in above Table 5.

The transmitter 100 may map the constellation symbols to a frame and transmit the mapped symbols to the receiver 200.

In detail, the transmitter 100 may map the constellation symbols corresponding to each of the L1-basic signaling and the L1-detail signaling output from the constellation mappers 221 and 324, and map the constellation symbols corresponding to the additional parity bits output from the constellation mapper 325 to a preamble symbol of a frame.

In this case, the transmitter 100 may map the additional parity bits generated based on the L1-detail signaling transmitted in the current frame to a frame before the current frame.

That is, the transmitter 100 may map the LDPC codeword bits including the L1-basic signaling corresponding to the (i−1)-th frame to the (i−1)-th frame, maps the LDPC codeword bits including the L1-detail signaling corresponding to the (i−1)-th frame to the (i−1)-th frame, and additionally map the additional parity bits generated selected from the LDPC parity bits generated based on the L1-detail signaling corresponding to the i-th frame to the (i−1)-th frame and may transmit the mapped bits to the receiver 200.

In addition, the transmitter 100 may map data to the data symbols of the frame in addition to the L1 signaling and transmit the frame including the L1 signaling and the data to the receiver 200.

In this case, since the L1 signalings include signaling information about the data, the signaling about the data mapped to each data may be mapped to a preamble of a corresponding frame. For example, the transmitter 100 may map the L1 signaling including the signaling information about the data mapped to the i-th frame to the i-th frame.

As a result, the receiver 200 may use the signaling obtained from the frame to receive the data from the corresponding frame for processing.

FIGS. 25 and 26 are block diagrams for describing a configuration of a receiver according to an exemplary embodiment.

In detail, as illustrated in FIG. 25, the receiver 200 may include a constellation demapper 2510, a multiplexer 2520, a Log Likelihood Ratio (LLR) inserter 2530, an LLR combiner 2540, a parity depermutator 2550, an LDPC decoder 2560, a zero remover 2570, a BCH decoder 2580, and a descrambler 2590 to process the L1-basic signaling.

Further, as illustrated in FIG. 26, the receiver 200 may include constellation demappers 2611 and 2612, multiplexers 2621 and 2622, an LLR inserter 2630, an LLR combiner 2640, a parity depermutator 2650, an LDPC decoder 2660, a zero remover 2670, a BCH decoder 2680, a descrambler 2690, and a desegmenter 2695 to process the L1-detail signaling.

Here, the components illustrated in FIGS. 25 and 26 perform functions corresponding to the functions of the components illustrated in FIGS. 42 and 43, respectively, which is only an example, and in some cases, some of the components may be omitted and changed and other components may be added.

The receiver 200 may acquire frame synchronization using a bootstrap of a frame and receive L1-basic signaling from a preamble of the frame using information for processing the L1-basic signaling included in the bootstrap.

Further, the receiver 200 may receive L1-detail signaling from the preamble using information for processing the L1-detail signaling included in the L1-basic signaling, and receive broadcasting data required by a user from data symbols of the frame using the L1-detail signaling.

Therefore, the receiver 200 may determine a mode of used at the transmitter 100 to process the L1-basic signaling and the L1-detail signaling, and process a signal received from the transmitter 100 according to the determined mode to receive the L1-basic signaling and the L1-detail signaling. For this purpose, the receiver 200 may pre-store information about parameters used at the transmitter 100 to process the signaling according to corresponding modes.

As such, the L1-basic signaling and the L1-detail signaling may be sequentially acquired from the preamble. In describing FIGS. 25 and 26, components performing common functions will be described together for convenience of explanation.

The constellation demappers 2510, 2611 and 2612 demodulate a signal received from the transmitter 100.

In detail, the constellation demappers 2510, 2611 and 2612 are components corresponding to the constellation mappers 221, 324 and 325 of the transmitter 100, respectively, and may demodulate the signal received from the transmitter 100 and generate values corresponding to bits transmitted from the transmitter 100.

That is, as described above, the transmitter 100 maps an LDPC codeword including the L1-basic signaling and the LDPC codeword including the L1-detail signaling to the preamble of a frame, and transmits the mapped LDPC codeword to the receiver 200. Further, in some cases, the transmitter 100 may map additional parity bits to the preamble of a frame and transmit the mapped bits to the receiver 200.

As a result, the constellation demappers 2510 and 2611 may generate values corresponding to the LDPC codeword bits including the L1-basic signaling and the LDPC codeword bits including the L1-detail signaling. Further, the constellation demapper 2612 may generate values corresponding to the additional parity bits.

For this purpose, the receiver 200 may pre-store information about a modulation scheme used by the transmitter 100 to modulate the L1-basic signaling, the L1-detail signaling, and the additional parity bits according to corresponding modes. Therefore, the constellation demappers 2510, 2611 and 2612 may demodulate the signal received from the transmitter 100 according to the corresponding modes to generate values corresponding to the LDPC codeword bits and the additional parity bits.

The value corresponding to a bit transmitted from the transmitter 100 is a value calculated based on probability that a received bit is 0 and 1, and instead, the probability itself may also be used as a value corresponding to each bit. The value may also be a Likelihood Ratio (LR) or an LLR value as another example.

In detail, an LR value may represent a ratio of probability that a bit transmitted from the transmitter 100 is 0 and probability that the bit is 1, and an LLR value may represent a value obtained by taking a log on probability that the bit transmitted from the transmitter 100 is 0 and probability that the bit is 1.

The foregoing example uses the LR value or the LLR value, which is only one example. According to another exemplary embodiment, the received signal itself rather than the LR or LLR value may also be used.

The multiplexers 2520, 2621 and 2622 perform multiplexing on LLR values output from the constellation demappers 2510, 2611 and 2612.

In detail, the multiplexers 2520, 2621 and 2622 are components corresponding to the bit demultiplexers 219, 322 and 323 of the transmitter 100, and may perform operations corresponding to the operations of the bit demultiplexers 219, 322 and 323, respectively.

For this purpose, the receiver 200 may pre-store information about parameters used for the transmitter 100 to perform demultiplexing and block interleaving. Therefore, the multiplexers 2520, 2621 and 2622 may reversely perform the demultiplexing and block interleaving operations of the bit demultiplexers 219, 322 and 323 on the LLR value corresponding to a cell word to multiplex the LLR value corresponding to the cell word in a bit unit.

The LLR inserters 2530 and 2630 may insert LLR values for the puncturing and shortening bits into the LLR values output from the multiplexers 2520 and 2621, respectively. In this case, the LLR inserters 2530 and 2630 may insert predetermined LLR values between the LLR values output from the multiplexers 2520 and 2621 or a head portion or an end portion thereof.

In detail, the LLR inserters 2530 and 2630 are components corresponding to the zero removers 218 and 321 and the puncturers 217 and 318 of the transmitter 100, respectively, and may perform operations corresponding to the operations of the zero removers 218 and 321 and the puncturers 217 and 318, respectively.

First, the LLR inserters 2530 and 2630 may insert LLR values corresponding to zero bits into a position where the zero bits in an LDPC codeword are padded. In this case, the LLR values corresponding to the padded zero bits, that is, the shortened zero bits may be $\infty$ or $-\infty$. However, $\infty$ or $-\infty$ are a theoretical value but may actually be a maximum value or a minimum value of the LLR value used in the receiver 200.

For this purpose, the receiver 200 may pre-store information about parameters and/or patterns used for the transmitter 100 to pad the zero bits according to corresponding modes. Therefore, the LLR inserters 2530 and 2630 may determine positions where the zero bits in the LDPC codewords are padded according to the corresponding modes, and insert the LLR values corresponding to the shortened zero bits into corresponding positions.

Further, the LLR inserters 2530 and 2630 may insert the LLR values corresponding to the punctured bits into the positions of the punctured bits in the LDPC codeword. In this case, the LLR values corresponding to the punctured bits may be 0.

For this purpose, the receiver 200 may pre-store information about parameters and/or patterns used for the transmitter 100 to perform puncturing according to corresponding modes. Therefore, the LLR inserters 2530 and 2630 may determine the lengths of the punctured LDPC parity bits according to the corresponding modes, and insert corresponding LLR values into the positions where the LDPC parity bits are punctured.

When the additional parity bits selected from the punctured bits among the additional parity bits, the LLR inserter 2630 may insert LLR values corresponding to the received additional parity bits, not an LLR value '0' for the punctured bit, into the positions of the punctured bits.

The LLR combiners 2540 and 2640 may combine, that is, a sum the LLR values output from the LLR inserters 2530 and 2630 and the LLR value output from the multiplexer 2622. However, the LLR combiners 2540 and 2640 serve to update LLR values for specific bits into more correct values. However, the LLR values for the specific bits may also be decoded from the received LLR values without the LLR combiners 2540 and 2640, and therefore, in some cases, the LLR combiners 2540 and 2640 may be omitted.

In detail, the LLR combiner 2540 is a component corresponding to the repeater 216 of the transmitter 100, and may perform an operation corresponding to the operation of the repeater 216. Alternatively, the LLR combiner 2640 is a component corresponding to the repeater 317 and the additional parity generator 319 of the transmitter 100, and may perform operations corresponding to the operations of the repeater 317 and the additional parity generator 319.

First, the LLR combiners 2540 and 2640 may combine LLR values corresponding to the repetition bits with other LLR values. Here, the other LLR values may be bits which are a basis of generating the repetition bits by the transmitter 100, that is, LLR values for the LDPC parity bits selected as the repeated object.

That is, as described above, the transmitter 100 selects bits from the LDPC parity bits and repeats the selected bits between the LDPC information bits and the LDPC parity bits generated by LDPC encoding, and transmits the repetition bits to the receiver 200.

As a result, the LLR values for the LDPC parity bits may be formed of the LLR values for the repeated LDPC parity bits and the LLR values for the non-repeated LDPC parity bits, that is, the LDPC parity bits generated by the LDPC encoding. Therefore, the LLR combiners 2540 and 2640 may combine the LLR values for the same LDPC parity bits.

For this purpose, the receiver 200 may pre-store information about parameters used for the transmitter 100 to perform the repetition according to corresponding modes. As a result, the LLR combiners 2540 and 2640 may determine the lengths of the repeated LDPC parity bits, determine the positions of the bits which are a basis of the repetition, and combine the LLR values for the repeated LDPC parity bits with the LLR values for the LDPC parity bits which are a basis of the repetition and generated by the LDPC encoding.

Figure 27:
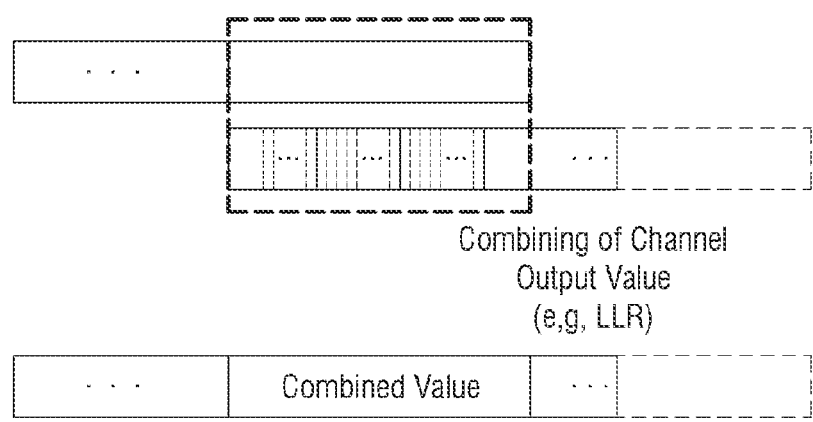
FIGS. 27 and 28 are diagrams for describing examples of combining Log Likelihood Ratio (LLR) values at a receiver, according to exemplary embodiments.
Figure 28:
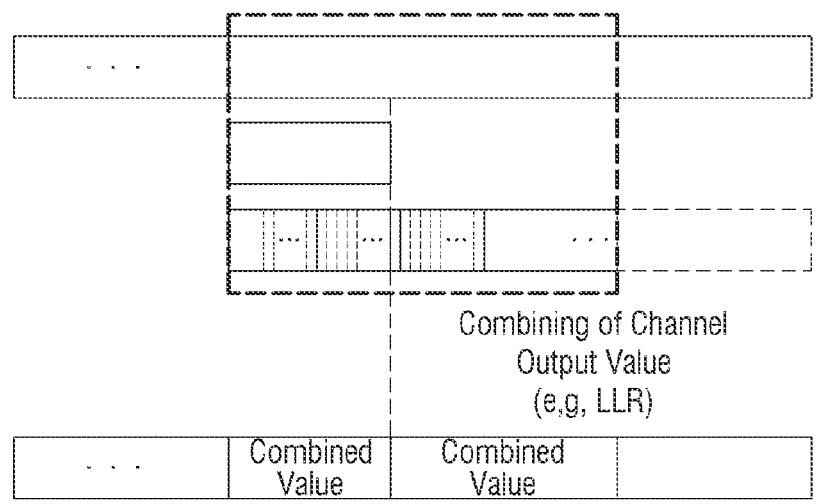

For example, as illustrated in FIGS. 27 and 28, the LLR combiners 2540 and 2640 may combine LLR values for repeated LDPC parity bits with LLR values for LDPC parity bits which are a basis of the repetition and generated by the LDPC encoding.

When LPDC parity bits are repeated n times, the LLR combiners 2540 and 2640 may combine LLR values for bits at the same position at n times or less.

For example, FIG. 27 illustrates a case in which some of LDPC parity bits other than punctured bits are repeated once. In this case, the LLR combiners 2540 and 2640 may combine LLR values for the repeated LDPC parity bits with LLR values for the LDPC parity bits generated by the LDPC encoding, and then, output the combined LLR values or output the LLR values for the received repeated LDPC parity bits or the LLR values for the received LDPC parity bits generated by the LDPC encoding without combining them.

As another example, FIG. 28 illustrates a case in which some of the transmitted LDPC parity bits, which are not punctured, are repeated twice, the remaining portion is repeated once, and the punctured LDPC parity bits are repeated once.

In this case, the LLR combiners 2540 and 2640 may process the remaining portion and the punctured bits which are repeated once by the same scheme as described above. However, the LLR combiners 2540 and 2640 may process the portion repeated twice as follows. In this case, for convenience of description, one of the two portions generated by repeating some of the LDPC parity bits twice is referred to as a first portion and the other is referred to as the second portion.

In detail, the LLR combiners 2540 and 2640 may combine LLR values for each of the first and second portions with LLR values for the LDPC parity bits. Alternatively, the LLR combiners 2540 and 2640 may combine the LLR values for the first portion with the LLR values for the LDPC parity bits, combine the LLR values for the second portion with the LLR values for the LDPC parity bits, or combine the LLR values for the first portion with the LLR values for the second portion. Alternatively, the LLR combiners 2540 and 2640 may output the LLR values for the first portion, the LLR values for the second portion, the LLR values for the remaining portion, and punctured bits, without separate combination.

Further, the LLR combiner 2640 may combine LLR values corresponding to additional parity bits with other LLR values. Here, the other LLR values may be the LDPC parity bits which are a basis of the generation of the additional parity bits by the transmitter 100, that is, the LLR values for the LDPC parity bits selected for generation of the additional parity bits.

That is, as described above, the transmitter 100 may map additional parity bits for L1-detail signaling transmitted in a current frame to a previous frame and transmit the mapped bits to the receiver 200.

In this case, the additional parity bits may include LDPC parity bits which are punctured and are not transmitted in the current frame, and in some cases, may further include LDPC parity bits transmitted in the current frame.

As a result, the LLR combiner 2640 may combine LLR values for the additional parity bits received through the current frame with LLR values inserted into the positions of the punctured LDPC parity bits in the LDPC codeword received through the next frame and LLR values for the LDPC parity bits received through the next frame.

For this purpose, the receiver 200 may pre-store information about parameters and/or patterns used for the transmitter 100 to generate the additional parity bits according to corresponding modes. As a result, the LLR combiner 2640 may determine the lengths of the additional parity bits, determine the positions of the LDPC parity bits which are a basis of generation of the additional parity bits, and combine the LLR values for the additional parity bits with the LLR values for the LDPC parity bits which are a basis of generation of the additional parity bits.

The parity depermutators 2550 and 2650 may depermutate the LLR values output from the LLR combiners 2540 and 2640, respectively.

In detail, the parity depermutators 2550 and 2650 are components corresponding to the parity permutators 215 and 316 of the transmitter 100, and may perform operations corresponding to the operations of the parity permutators 215 and 316, respectively.

For this purpose, the receiver 200 may pre-store information about parameters and/or patterns used for the transmitter 100 to perform group-wise interleaving and parity interleaving according to corresponding modes. Therefore, the parity depermutators 2550 and 2650 may reversely perform the group-wise interleaving and parity interleaving operations of the parity permutators 215 and 316 on the LLR values corresponding to the LDPC codeword bits, that is, perform group-wise deinterleaving and parity deinterleaving operations to perform the parity depermutation on the LLR values corresponding to the LDPC codeword bits, respectively.

The LDPC decoders 2560 and 2660 may perform LDPC decoding based on the LLR values output from the parity depermutators 2550 and 2650, respectively.

In detail, the LDPC decoders 2560 and 2660 are components corresponding to the LDPC encoders 214 and 315 of the transmitter 100 and may perform operations corresponding to the operations of the LDPC encoders 214 and 315, respectively.

For this purpose, the receiver 200 may pre-store information about parameters used for the transmitter 100 to perform the LDPC encoding according to corresponding modes. Therefore, the LDPC decoders 2560 and may perform the LDPC decoding based on the LLR values output from the parity depermutators 2550 and 2650 according to the corresponding modes.

For example, the LDPC decoders 2560 and 2660 may perform the LDPC decoding based on the LLR values output from the parity depermutators 2550 and 2650 by iterative decoding based on a sum-product algorithm and output error-corrected bits depending on the LDPC decoding.

The zero removers 2570 and 2670 may remove zero bits from the bits output from the LDPC decoders 2560 and 2660, respectively.

In detail, the zero removers 2570 and 2670 are components corresponding to the zero padders 213 and 314 of the transmitter 100, and may perform operations corresponding to the operations of the zero padders 213 and 314, respectively.

For this purpose, the receiver 200 may pre-store information about parameters and/or patterns used for the transmitter 100 to pad the zero bits according to corresponding modes. As a result, the zero removers 2570 and 2670 may remove the zero bits padded by the zero padders 213 and 314 from the bits output from the LDPC decoders 2560 and 2660, respectively.

The BCH decoders 2580 and 2680 may perform BCH decoding on the bits output from the zero removers 2570 and 2670, respectively.

In detail, the BCH decoders 2580 and 2680 are components corresponding to the BCH encoders 212 and 313 of the transmitter 100, and may perform operations corresponding to the operations of the BCH encoders 212 and 313, respectively.

For this purpose, the receiver 200 may pre-store the information about parameters used for the transmitter 100 to perform BCH encoding. As a result, the BCH decoders 2580 and 2680 may correct errors by performing the BCH decoding on the bits output from the zero removers 2570 and 2670 and output the error-corrected bits.

The descramblers 2590 and 2690 may descramble the bits output from the BCH decoders 2580 and 2680, respectively.

In detail, the descramblers 2590 and 2690 are components corresponding to the scramblers 211 and 312 of the transmitter 100, and may perform operations corresponding to the operations of the scramblers 211 and 312.

For this purpose, the receiver 200 may pre-store information about parameters used for the transmitter 100 to perform scrambling. As a result, the descramblers 2590 and 2690 may descramble the bits output from the BCH decoders 2580 and 2680 and output them, respectively.

As a result, L1-basic signaling transmitted from the transmitter 100 may be recovered. Further, when the transmitter 100 does not perform segmentation on L1-detail signaling, the L1-detail signaling transmitted from the transmitter 100 may also be recovered.

However, when the transmitter 100 performs the segmentation on the L1-detail signaling, the desegmenter 2695 may desegment the bits output from the descrambler 2690.

In detail, the desegmenter 2695 is a component corresponding to the segmenter 311 of the transmitter 100, and may perform an operation corresponding to the operation of the segmenter 311.

For this purpose, the receiver 200 may pre-store information about parameters used for the transmitter 100 to perform the segmentation. As a result, the desegmenter 2695 may combine the bits output from the descrambler 2690, that is, the segments for the L1-detail signaling to recover the L1-detail signaling before the segmentation.

Figure 29:
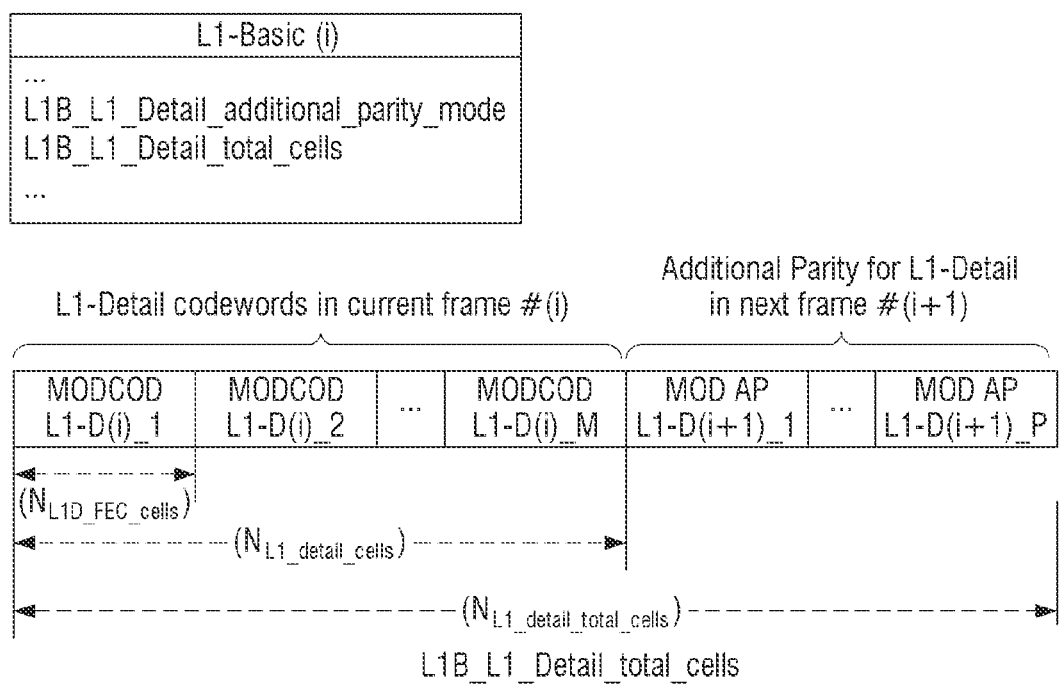
FIG. 29 is a diagram illustrating an example of providing information on a length of L1 signaling according to an exemplary embodiment.

The information about the length of the L1 signaling is provided as illustrated in FIG. 29. Therefore, the receiver 200 may calculate the length of the L1-detail signaling and the length of the additional parity bits.

Referring to FIG. 29, since the L1-basic signaling provides information about L1-detail total cells, the receiver 200 needs to calculate the length of the L1-detail signaling and the lengths of the additional parity bits.

In detail, when L1B_L1_Detail_additional_parity_mode of the L1-basic signaling is not 0, since the information on the given L1B_L1_Detail_total_cells represents a total cell length ($=N_{L1\_detail\_total\_cells}$), the receiver 200 may calculate the length $N_{L1\_detail\_cells}$ of the L1-detail signaling and the length NAP total cells of the additional parity bits based on following Equations 37 to 40.

$$N_{L1\_FEC\_cells} = \frac{N_{outer} + N_{repeat} + N_{ldpc\_parity} - N_{punc}}{\eta_{MOD}} = \frac{N_{FEC}}{\eta_{MOD}} \quad (37)$$

$$N_{L1\_detail\_cells} = N_{L1D\_FECFRAME} \times N_{L1\_FEC\_cells} \quad (38)$$

$$N_{AP\_total\_cells} = N_{L1\_detail\_total\_cells} - N_{L1\_detail\_cells} \quad (39)$$

In this case, based on above Equations 37 to 39, an $N_{AP\_total\-cells}$ value may be obtained based on an $N_{L1\_detail\_total\_cells}$ value which may be obtained from the information about the L1B_L1_Detail_total_cells of the L1-basic signaling, $N_{FEC}$, the $N_{L1D\_FECFRAME}$, and the modulation order $\eta_{MOD}$. As an example, $N_{AP\_total\_cells}$ may be calculated based on following Equation 40.

$$N_{AP\_total\_cells} = N_{L1\_detail\_total\_cells} - N_{L1D\_FECFRAME} \times \frac{N_{FEC}}{\eta_{MOD}} \quad (40)$$

A syntax, and field semantics of the L1-basic signaling field are as following Table 14.

TABLE 14

| Syntax | # of bits | Format |
|---|---|---|
| L1_Basic_signaling( ) { | | |
| L1B_L1_Detail_size_bits | 16 | uimsbf |
| L1B_L1_Detail_fec_type | 3 | uimsbf |
| L1B_L1_Detail_additional_parity_mode | 2 | uimsbf |

TABLE 14-continued

| Syntax | # of bits | Format |
|---|---|---|
| L1B_L1_Detail_total_cells | 19 | uimsbf |
| L1B_Reserved | ? | uimsbf |
| L1B_crc | 32 | uimsbf |
| } | | |

As a result, the receiver 200 may perform an operation of a receiver for the additional parity bits in a next frame based on the additional parity bits transmitted to the $N_{AP\_total\_cells}$ cell among the received L1 detail cells.

Figure 30:
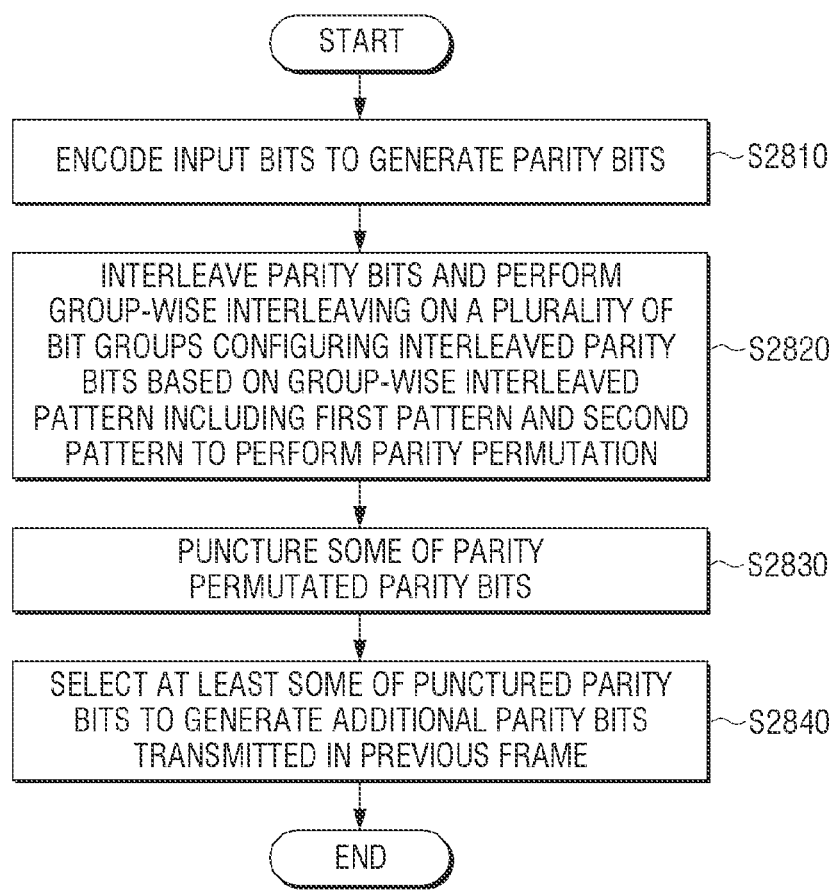
FIG. 30 is a flow chart for describing a method for generating an additional parity, according to an exemplary embodiment.

FIG. 30 is a flow chart for describing a method for generating, by a transmitter, an additional parity according to an exemplary embodiment.

First, parity bits are generated by encoding input bits (S2810).

Next, the parity bits are interleaved and a plurality of bit groups configuring the interleaved parity bits are group-wise interleaved based on a group-wise interleaving pattern including a first pattern and a second pattern to perform parity permutation (S2820).

Further, some of the parity-permutated parity bits are punctured (S2830), and at least some of the punctured parity bits are selected to generate additional parity bits to be transmitted in a previous frame (S2840).

Here, the additional parity bits are determined depending on the first pattern and the second pattern, the first pattern is a pattern used to determine parity bits to be transmitted in a current frame remaining after the puncturing, and the second pattern is a pattern used to determine the additional parity bits to be transmitted in the previous frame.

In detail, the second pattern represents bit groups to be always punctured among the plurality of bit groups, the additional parity bits may be generated by selecting at least some of the bits included in the bit groups always to be punctured depending on the order of the bit groups to be always punctured determined depending on the second pattern.

In operation S2820, the plurality of bit groups configuring the parity bits interleaved based on above Equation 11 may be group-wise interleaved. In this case, the permutation order for the second pattern may be determined based on above Table 4.

In operations S2810, 6480 input bits may be encoded at a code rate of 6/15 to generate 9720 parity bits. In this case, an LDPC codeword in which some parity bits are punctured may be mapped to constellation symbols by 64-QAM to be transmitted to the receiver.

The detailed methods for generating additional parity bits are described above, and thus, duplicate descriptions are omitted.

A non-transitory computer readable medium in which a program performing the various methods described above are stored may be provided according to an exemplary embodiment. The non-transitory computer readable medium is not a medium that stores data therein for a while, such as a register, a cache, a memory, or the like, but means a medium that at least semi-permanently stores data therein and is readable by a device such as a microprocessor. In detail, various applications or programs described above may be stored and provided in the non-transitory computer readable medium such as a compact disk (CD), a digital versatile disk (DVD), a hard disk, a Blu-ray disk, a universal serial bus (USB), a memory card, a read only memory (ROM), or the like.

At least one of the components, elements, modules or units represented by a block as illustrated in FIGS. 1, 9, 10, 25 and 26 may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

Although the exemplary embodiments of inventive concept have been illustrated and described hereinabove, the inventive concept is not limited to the above-mentioned exemplary embodiments, but may be variously modified by those skilled in the art to which the inventive concept pertains without departing from the scope and spirit of the inventive concept as disclosed in the accompanying claims. For example, the exemplary embodiments are described in relation with BCH encoding and decoding and LDPC encoding and decoding. However, these embodiments do not limit the inventive concept to only a particular encoding and decoding, and instead, the inventive concept may be applied to different types of encoding and decoding with necessary modifications. These modifications should also be understood to fall within the scope of the inventive concept.

What is claimed is:
1. A receiving method comprising:
receiving a signal from a transmitting apparatus;
demodulating the signal to generate values based on 64-quadrature amplitude modulation (QAM);
inserting predetermined values;
splitting the values and the inserted predetermined values into a plurality of groups;
deinterleaving some groups among the plurality of groups based on a permutation order to provide deinterleaved plurality of groups in which the some groups are deinterleaved; and
decoding values of the deinterleaved plurality of groups based on a low density parity check (LDPC) code, a code rate of the LDPC code being 6/15 and a code length of the LDPC code being 16200 bits, wherein positions of the inserted predetermined values correspond to positions of parity bits punctured in the transmitting apparatus, and wherein groups having indices of 25, 42, 34, 18, 32, 38, 23, 30, 28, 36 and 41 among the deinterleaved plurality of groups comprise at least a part of the predetermined values.

2. The receiving method of claim 1, wherein a number of the plurality of groups is 27.

3. The receiving method of claim 1, further comprising: deinterleaving one or more values among the values of the deinterleaved plurality of groups, and wherein the decoding is performed by decoding the values of the deinterleaved plurality of groups comprising the deinterleaved values.

4. The receiving method of claim 1, wherein the deinterleaved plurality of groups comprise 45 groups having indices of 0 to 44.

5. The receiving method of claim 1, wherein the predetermined values corresponding to the parity bits punctured in the transmitting apparatus are determined based on the permutation order and a number of the parity bits to be punctured.

6. A transmitting method comprising:

filling information bits with input bits and one or more zero padding bits, if a number of the input bits is less than a number of the information bits;

encoding the information bits to generate parity bits based on a low density parity check (LDPC) code, a code rate of the LDPC code being 6/15 and a code length of the LDPC code being 16200 bits;

interleaving the parity bits;

splitting a codeword into a plurality of bit groups, the codeword comprising the information bits and the interleaved parity bits;

interleaving bit groups comprising the interleaved parity bits among the plurality of bit groups based on a permutation order to provide an interleaved codeword;

calculating a number of parity bits to be punctured;

puncturing one or more parity bits of the interleaved codeword based on the calculated number;

mapping the input bits and remaining parity bits of the interleaved codeword after the puncturing to constellation points, wherein the constellation points are based on 64-quadrature amplitude modulation (QAM); and transmitting a signal which is generated based on the constellation points, wherein the interleaved bit groups are bit groups from a 18-th bit group to a 44-bit group among the plurality of bit groups, and wherein the punctured parity bits comprise at least 11 bit groups including a 25-th bit group, a 42-th bit group, a 34-th bit group, a 18-th bit group, a 32-th bit group, a 38-th bit group, a 23-th bit group, a 30-th bit group, a 28-th bit group, a 36-th bit group and a 41-th bit group among the plurality of bit groups.

7. The transmitting method of claim 6, wherein a number of the information bits is 6480 and a number of the parity bits is 9720.

* * * * *